(12) United States Patent
Seo et al.

(10) Patent No.: US 12,232,342 B2
(45) Date of Patent: Feb. 18, 2025

(54) ORGANIC SEMICONDUCTOR DEVICE, ORGANIC EL DEVICE, PHOTODIODE SENSOR, DISPLAY DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Hiromi Seo, Kanagawa (JP); Takeyoshi Watabe, Kanagawa (JP); Airi Ueda, Kanagawa (JP); Yuta Kawano, Kanagawa (JP); Nobuharu Ohsawa, Kanagawa (JP); Hiromitsu Kido, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 517 days.

(21) Appl. No.: 17/552,638

(22) Filed: Dec. 16, 2021

(65) Prior Publication Data
US 2022/0216445 A1     Jul. 7, 2022

(30) Foreign Application Priority Data
Dec. 29, 2020   (JP) ................. 2020-219842

(51) Int. Cl.
*H10K 50/11*     (2023.01)
*H10K 30/20*     (2023.01)
(Continued)

(52) U.S. Cl.
CPC ............. *H10K 50/11* (2023.02); *H10K 30/20* (2023.02); *H10K 85/633* (2023.02);
(Continued)

(58) Field of Classification Search
None
See application file for complete search history.

(56) References Cited

U.S. PATENT DOCUMENTS 8,642,190 B2    2/2014  Ogita et al.
9,051,239 B2    6/2015  Osaka et al.
(Continued)

FOREIGN PATENT DOCUMENTS

DE    60306570 T2 *  7/2007  ........... C07C 211/58
WO    WO-9744829 A1 *  11/1997  ............. B82Y 10/00

OTHER PUBLICATIONS

Lee.J et al., "Synergetic electrode architecture for efficient graphene-based flexible organic light-emitting diodes", Nature Communications, Jun. 2, 2016, vol. 7, pp. 11791-1-11791-9.

(Continued)

*Primary Examiner* — Scott B Geyer
(74) *Attorney, Agent, or Firm* — Fish & Richardson P.C.

(57) ABSTRACT

An organic semiconductor device with low driving voltage is provided. The organic semiconductor device includes a layer containing an organic compound between a pair of electrodes. The layer containing an organic compound includes a hole-transport region. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 20 (mV/nm).

21 Claims, 44 Drawing Sheets

(51) Int. Cl.
*H10K 50/15* (2023.01)
*H10K 59/12* (2023.01)
*H10K 85/60* (2023.01)
*H10K 101/30* (2023.01)
*H10K 101/40* (2023.01)

(52) U.S. Cl.
CPC .......... *H10K 50/156* (2023.02); *H10K 59/12* (2023.02); *H10K 2101/30* (2023.02); *H10K 2101/40* (2023.02)

(56) References Cited

U.S. PATENT DOCUMENTS

| | | |
|---|---|---|
| 9,496,503 B2 | 11/2016 | Takeda et al. |
| 9,634,263 B2 | 4/2017 | Ogita et al. |
| 9,818,984 B2 | 11/2017 | Mizuno |
| 10,556,864 B2 | 2/2020 | Nomura et al. |
| 10,941,108 B2 | 3/2021 | Jeong et al. |
| 2009/0160323 A1 | 6/2009 | Nomura et al. |
| 2010/0104969 A1 | 4/2010 | Mochizuki et al. |
| 2012/0292652 A1* | 11/2012 | Yamae ................. H10K 59/879 257/98 |
| 2018/0009751 A1 | 1/2018 | Nomura et al. |
| 2019/0016666 A1 | 1/2019 | Jeong et al. |
| 2019/0305226 A1* | 10/2019 | Yokoyama ............. H05B 33/10 |
| 2021/0005814 A1 | 1/2021 | Watabe et al. |
| 2021/0317069 A1 | 10/2021 | Seo et al. |

OTHER PUBLICATIONS

Noguch.Y et al., "Spontaneous orientation polarization in organic light-emitting diodes", Jpn. J. Appl. Phys. (Japanese Journal of Applied Physics), May 24, 2019, vol. 58, pp. SF0801-1-SF0801-10.

Sato.S et al., "Interfacial charges and electroluminescence in bilayer organic light-emitting diodes with different hole transport materials", Jpn. J. Appl. Phys. (Japanese Journal of Applied Physics), May 13, 2019, vol. 58, pp. SFFA02-1-SFFA02-5.

Noguchi.Y et al., "Spontaneous Orientation Polarization of Polar Molecules and Interface Properties of Organic Electronic Devices", Journal of the Vacuum Society of Japan, Mar. 27, 2015, vol. 58, No. 3, pp. 109-116.

* cited by examiner

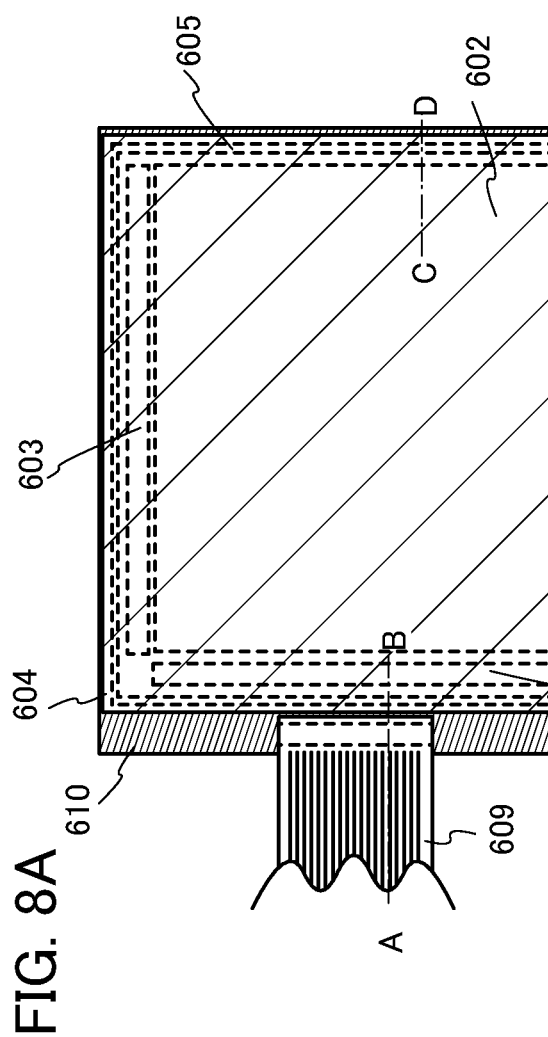
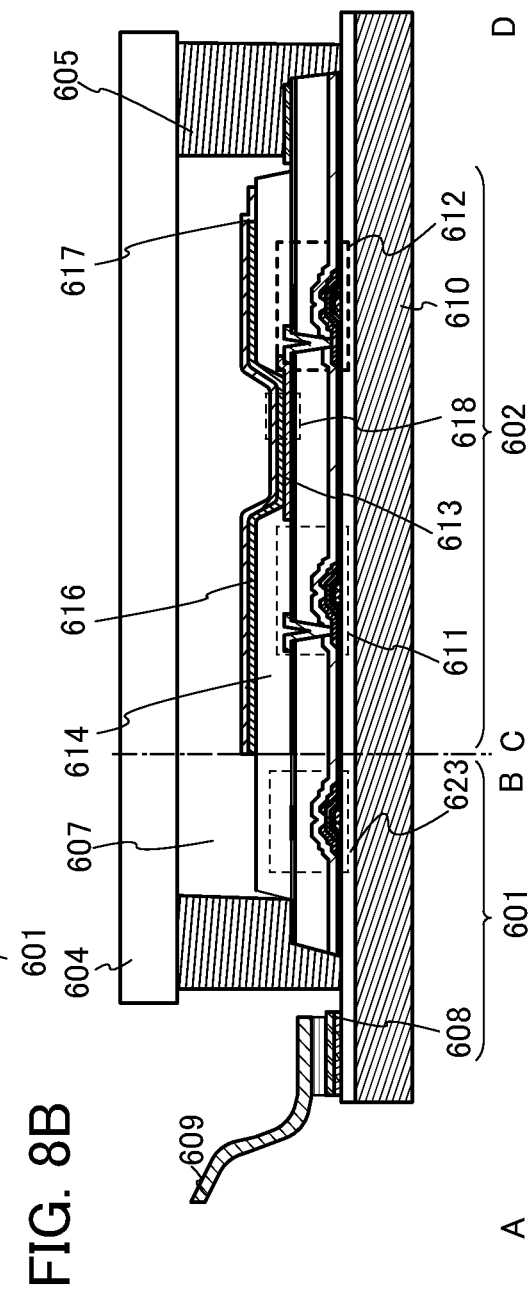

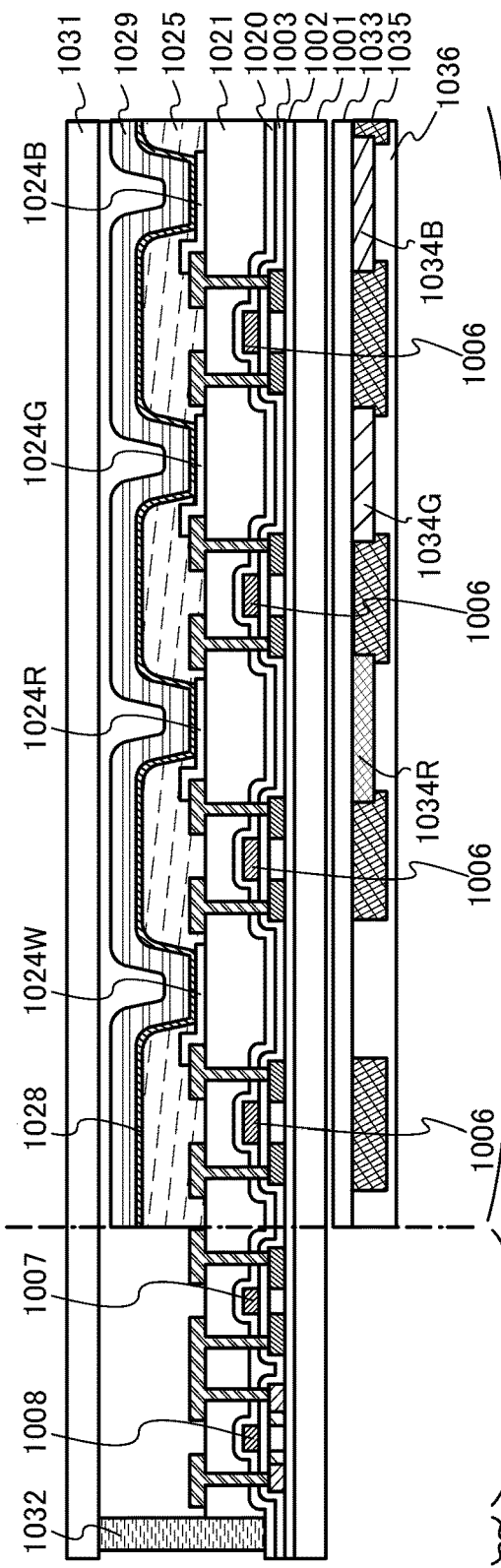

FIG. 13A
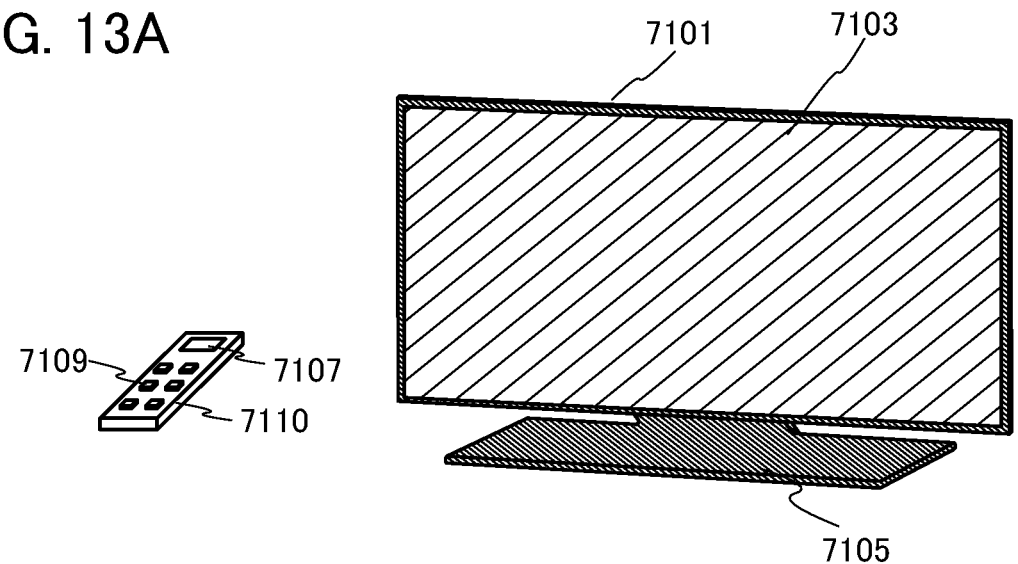
FIG. 13B1
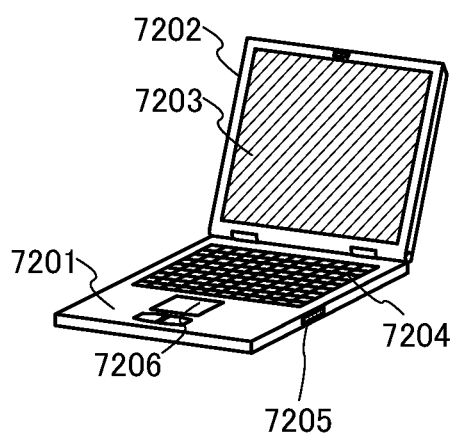
FIG. 13B2
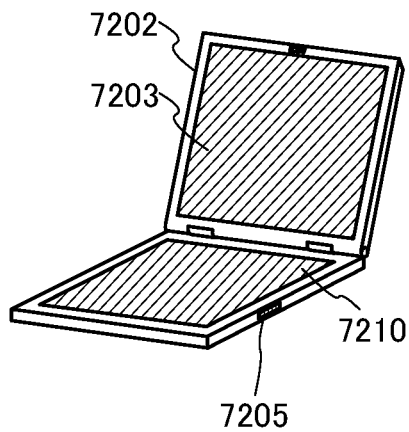
FIG. 13C
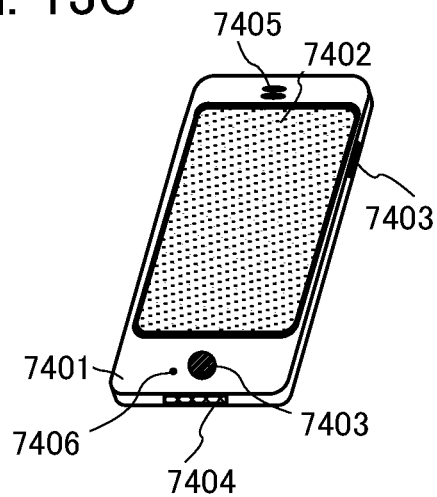

ORGANIC SEMICONDUCTOR DEVICE, ORGANIC EL DEVICE, PHOTODIODE SENSOR, DISPLAY DEVICE, LIGHT-EMITTING APPARATUS, ELECTRONIC DEVICE, AND LIGHTING DEVICE

BACKGROUND OF THE INVENTION

1. Field of the Invention

One embodiment of the present invention relates to an organic compound, an organic semiconductor device, a light-emitting element, a light-emitting device, an organic EL device, a photodiode sensor, a display module, a lighting module, a display device, a light-emitting apparatus, an electronic apparatus, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

2. Description of the Related Art

Light-emitting devices (organic EL devices) including organic compounds and utilizing electroluminescence (EL) have been put to more practical use. In the basic structure of such organic EL devices, an organic compound layer containing a light-emitting material (an EL layer) is sandwiched between a pair of electrodes. Carriers are injected by application of voltage to the device, and recombination energy of the carriers is used, whereby light emission can be obtained from the light-emitting material.

Such organic EL devices are of self-luminous type and thus have advantages over liquid crystal displays, such as high visibility and no need for backlight when used as pixels of a display, and are particularly suitable for flat panel displays. Displays including such organic EL devices are also highly advantageous in that they can be thin and lightweight. Moreover, such organic EL devices also have a feature that response speed is extremely fast.

Since light-emitting layers of such organic EL devices can be successively formed in a planar shape, planar light emission can be achieved. This feature is difficult to realize with point light sources typified by incandescent lamps and LEDs or linear light sources typified by fluorescent lamps; thus, the organic EL devices also have great potential as planar light sources, which can be used for lighting devices and the like.

Displays or lighting devices including organic EL devices are suitable for a variety of electronic devices as described above, and research and development of organic EL devices have progressed for more favorable characteristics (see Non-Patent Document 1, for example).

REFERENCE

Non-Patent Document

[Non-Patent Document 1] Y. Noguchi et al., "Spontaneous Orientation Polarization of Polar Molecules and Interface Properties of Organic Electronic Devices", Journal of the Vacuum Society of Japan, 2015, Vol. 58, No. 3.

SUMMARY OF THE INVENTION

An object of one embodiment of the present invention is to provide an organic semiconductor device with low driving voltage. Another object of one embodiment of the present invention is to provide an organic EL device with low driving voltage. Another object of one embodiment of the present invention is to provide a photodiode sensor with low driving voltage. Another object of one embodiment of the present invention is to provide any of a light-emitting apparatus, an electronic apparatus, a display device, and an electronic device each having low power consumption.

It is only necessary that at least one of the above-described objects be achieved in the present invention.

One embodiment of the present invention is an organic semiconductor device including an anode, a cathode, and a layer containing an organic compound between the anode and the cathode. The layer containing an organic compound includes a hole-transport region. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 20 (mV/nm).

Another embodiment of the present invention is an organic semiconductor device including an anode, a cathode, and a layer containing an organic compound between the anode and the cathode. The layer containing an organic compound includes a hole-transport region. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 5 (mV/nm).

Another embodiment of the present invention is an organic semiconductor device including an anode, a cathode, and a layer containing an organic compound between the anode and the cathode. The layer containing an organic compound includes a hole-transport region. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 0 (mV/nm).

Another embodiment of the present invention is an organic EL device including an anode, a cathode, and a layer containing an organic compound between the anode and the cathode. The layer containing an organic compound includes a hole-transport region and a light-emitting layer. The hole-transport region is positioned between the anode and the light-emitting layer. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 20 (mV/nm).

Another embodiment of the present invention is an organic EL device including an anode, a cathode, and a layer containing an organic compound between the anode and the cathode. The layer containing an organic compound includes a hole-transport region and a light-emitting layer. The hole-transport region is positioned between the anode and the light-emitting layer. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 5 (mV/nm).

Another embodiment of the present invention is an organic EL device including an anode, a cathode, and a layer containing an organic compound between the anode and the cathode. The layer containing an organic compound includes a hole-transport region and a light-emitting layer. The hole-transport region is positioned between the anode and the light-emitting layer. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 0 (mV/nm).

Another embodiment of the present invention is the organic EL device with any of the above structures, in which the light-emitting layer is in contact with the second layer.

Another embodiment of the present invention is a photodiode sensor including an anode, a cathode, and a layer containing an organic compound between the anode and the cathode. The layer containing an organic compound includes an active layer and a hole-transport region. The hole-transport region is positioned between the active layer and the cathode. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 20 (mV/nm).

Another embodiment of the present invention is a photodiode sensor including an anode, a cathode, and a layer containing an organic compound between the anode and the cathode. The layer containing an organic compound includes an active layer and a hole-transport region. The hole-transport region is positioned between the active layer and the cathode. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 5 (mV/nm).

Another embodiment of the present invention is a photodiode sensor including an anode, a cathode, and a layer containing an organic compound between the anode and the cathode. The layer containing an organic compound includes an active layer and a hole-transport region. The hole-transport region is positioned between the active layer and the cathode. The hole-transport region includes a first layer and a second layer. The first layer is positioned between the anode and the second layer. When a potential gradient of a surface potential of an evaporated film is set as GSP (mV/nm), a value obtained by subtracting GSP of an organic compound in the second layer from GSP of an organic compound in the first layer is less than or equal to 0 (mV/nm).

Another embodiment of the present invention is the photodiode sensor with any of the above structures, in which the active layer is in contact with the first layer.

Another embodiment of the present invention is the organic semiconductor device, the organic EL device, or the photodiode sensor with any of the above structures, in which the first layer is in contact with the second layer.

Another embodiment of the present invention is a lighting device including the organic semiconductor device, the organic EL device, or the photodiode sensor described in any of the above embodiments.

Another embodiment of the present invention is a display device including the organic semiconductor device, the organic EL device, or the photodiode sensor described in any of the above embodiments.

Another embodiment of the present invention is an electronic device including the organic semiconductor device, the organic EL device, or the photodiode sensor described in any of the above embodiments.

Another embodiment of the present invention is the organic EL device described in any of the above embodiments, in which end faces of the hole-transport region and the light-emitting layer are positioned on substantially the same plane.

Another embodiment of the present invention is an electronic device including any of the above organic EL devices, and at least one of a sensor, an operation button, a speaker, and a microphone.

Another embodiment of the present invention is a light-emitting apparatus including any of the above organic EL devices, and at least one of a transistor and a substrate.

Another embodiment of the present invention is a lighting device including any of the above organic EL devices and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

According to one embodiment of the present invention, an organic semiconductor device with low driving voltage can be provided. According to another embodiment of the present invention, an organic EL device with low driving voltage can be provided. According to another embodiment of the present invention, a photodiode sensor with low driving voltage can be provided. According to another embodiment of the present invention, any of a light-emitting apparatus, an electronic apparatus, a display device, and an electronic device each having low power consumption can be provided.

Note that the description of these effects does not preclude the existence of other effects. One embodiment of the present invention does not necessarily have all these effects.

Other effects will be apparent from and can be derived from the description of the specification, the drawings, the claims, and the like.

BRIEF DESCRIPTION OF THE DRAWINGS

In the accompanying drawings:

FIGS. 8A and 8B illustrate an active matrix light-emitting apparatus;

FIGS. 9A and 9B illustrate an active matrix light-emitting apparatus;

FIGS. 13A, 13B1, 13B2, and 13C illustrate electronic devices;

DETAILED DESCRIPTION OF THE INVENTION

Figure 1:
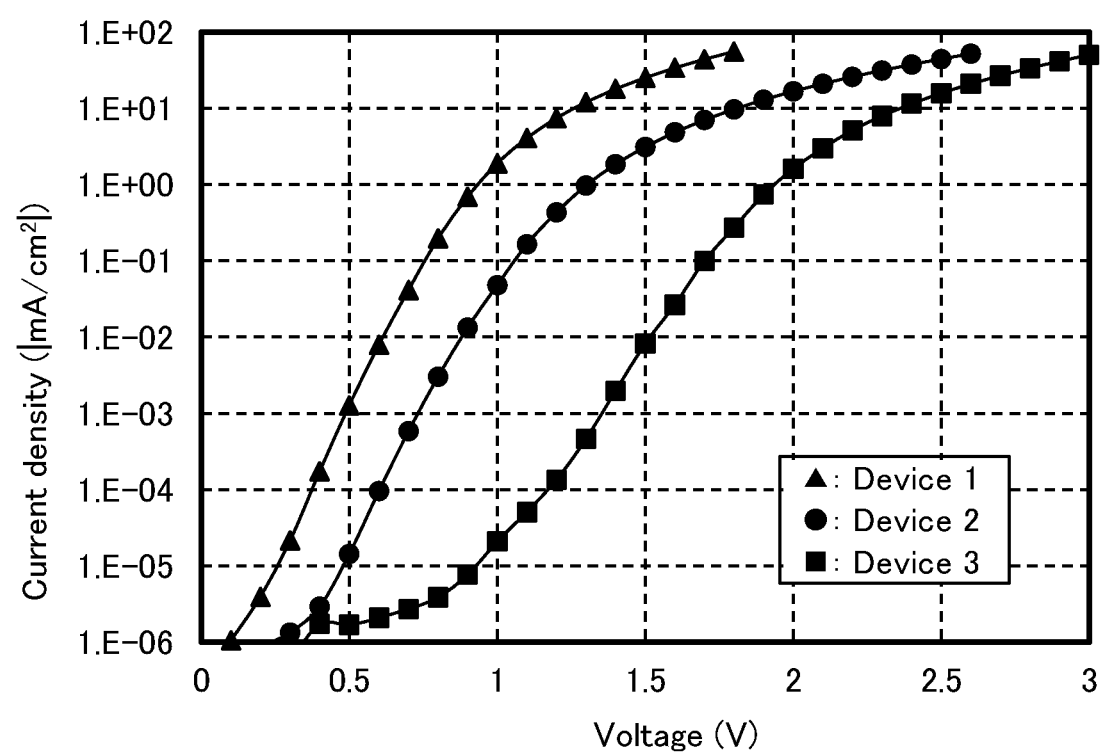
FIG. 1 shows a relationship between ΔGSP and current density-voltage characteristics.

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

An organic EL device is a kind of organic semiconductor device including an organic thin film. Typical examples of the organic semiconductor device include a photodiode sensor and an organic TFT.

Most of the organic thin films used for such organic semiconductor devices are formed by an evaporation method. The organic thin films, except for some films of materials that are easily crystallized, formed by an evaporation method in which sublimation is caused by application of energy such as heat to an organic compound to be deposited have been thought for a long time to be amorphous and have random orientation.

However, in recent years, many spectroscopic studies have revealed that modest molecular orientation sometimes exists also in an amorphous organic thin film and influences the device performance. It is known that, in an organic EL device, easy light extraction from a substance in which dipole moments of a light-emitting substance are likely to be aligned parallel to a light-emitting surface makes it easier to provide a light-emitting element with high emission efficiency, and a substance in which overlap of π orbitals due to orientation easily occurs tends to have high conductivity, for example.

A polar molecule and a non-polar molecule exist in an organic compound, and the polar molecule has a permanent dipole moment. When the polar molecule is evaporated and the evaporated film has random orientation, unbalanced polarity is canceled out and polarization derived from the polarity of the molecule does not occur in the film. However, when the evaporated film has molecular orientation as described above, the giant surface potential derived from unbalanced polarization is sometimes observed.

The giant surface potential refers to a phenomenon in which a surface potential of an evaporated film increases in proportion to a film thickness. In order to treat the surface potential as a value independent of a film thickness, a value obtained by dividing the surface potential of an evaporated film by the film thickness, that is, the potential gradient (slope) of a surface potential of an evaporated film, is used. In this specification, the potential gradient of a surface potential of an evaporated film is denoted by GSP (mV/nm).

Owing to the giant surface potential, the surface potential of an evaporated film increases linearly with increasing thickness without saturation. For example, the surface potential of an evaporated film of tris(8-quinolinolato)aluminum (abbreviation: $Alq_3$) reaches approximately 28 V at a thickness of 560 nm.

The giant surface potential can be described as spontaneous orientation polarization due to slight deviation of a permanent dipole moment of an organic compound to the thickness direction. Note that $Alq_3$ is an amorphous film in which permanent dipole moments are slightly oriented in the thickness direction with an orientation order parameter (cos θ, θ refers to an inclination angle of permanent dipole moments from a normal direction of the film) of 0.05, and this slight orientation generates large polarization that probably causes GSP. Electric field strength generated by the orientation polarization reaches $5\times10^5$ V/cm, which is approximately the same level as electric field strength during driving of a general organic thin film device.

The present inventors have found that, in the case where a plurality of layers in which holes serve as carriers (hole-transport layers) are provided in contact with each other in an organic semiconductor device (e.g., an organic EL device and a photodiode sensor) having a stacked-layer structure of thin films of organic compounds, a difference in GSP (ΔGSP (mV/nm)) between the two layers stacked in contact with each other influences hole-injection capability and thus significantly affects driving voltage of a device.

FIG. 1 shows examination results of a relationship between ΔGSP and current density-voltage characteristics of organic semiconductor devices (devices 1 to 3) in which only holes serve as carriers. The following tables list device structures, materials, GSP, and ΔGSP of the devices 1 to 3.

Note that "two layers stacked in contact with each other" in each of the devices 1 to 3 correspond to a layer 2 and a layer 3 in the following tables.

TABLE 1

|  | Film thickness | Device 1 | Device 2 | Device 3 |
| --- | --- | --- | --- | --- |
| Cathode | 200 nm |  | Al |  |
| Layer 4 | 5 nm |  | Molybdenum oxide |  |
| Layer 3 | 40 nm |  | HTM-1 |  |
| Layer 2 | 80 nm | mmtBuBioFBi | mmtBumTPoFBi-02 | mmtBumBioFBi |
| Layer 1 | 10 nm | mmtBuBioFBi:<br>OCHD-003<br>(1:0.2) | mmtBumTPoFBi-02:<br>OCHD-003<br>(1:0.1) | mmtBumBioFBi:<br>OCHD-003<br>(1:0.1) |
| Anode | 70 nm |  | ITSO |  |

TABLE 2

|  | Device 1 | Device 2 | Device 3 |
| --- | --- | --- | --- |
| Layer 3 (HTM2)<br>GSP2<br>(mV/nm) |  | HTM-1<br>13.3 |  |

TABLE 2-continued

|  | Device 1 | Device 2 | Device 3 |
|---|---|---|---|
| Layer 2 (HTM1) | mmtBuBioFBi | mmtBumTPoFBi-02 | mmtBumBioFBi |
| GSP1 (mV/nm) | 25.5 | 32.8 | 40.6 |
| ΔGSP (mV/nm) | 12.2 | 19.5 | 27.3 |

In the tables, ITSO is indium tin oxide containing silicon oxide, OCHD-003 is an electron acceptor material having a molecular weight of 672 and containing fluorine, HTM-1 is a hole-transport organic compound, and Al is aluminum. The molecular structures of mmtBuBioFBi, mmtBumTPoFBi-02, and mmtBumBioFBi are shown below. Note that layers 1 to 4 and a cathode are formed by a vacuum evaporation method from the anode side.

[Chemical Formulae 1]

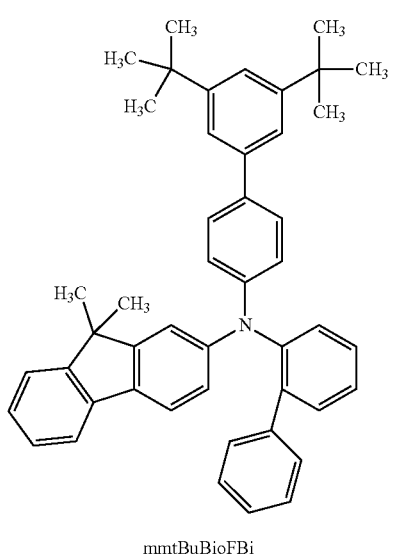

mmtBuBioFBi

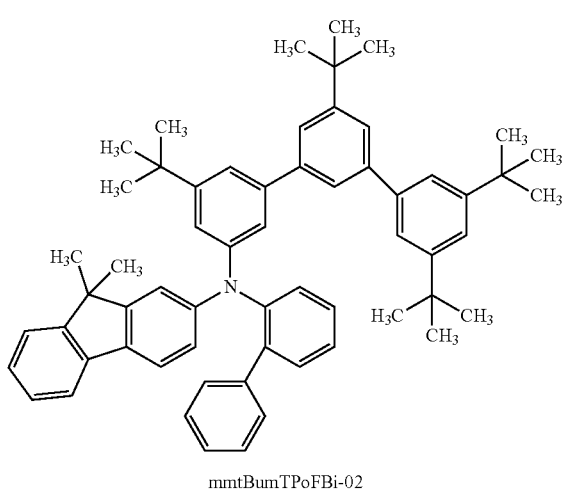

mmtBumTPoFBi-02

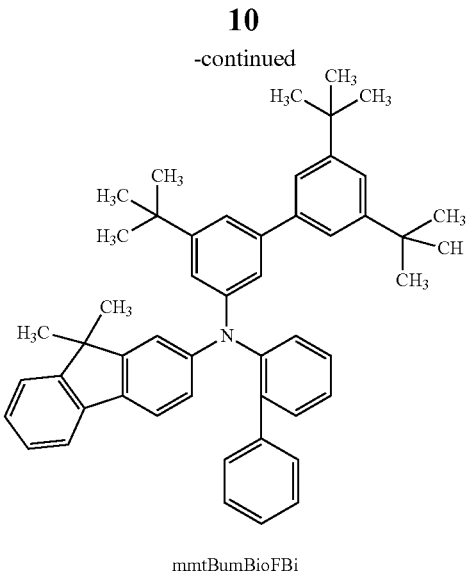

mmtBumBioFBi

As shown in FIG. 1, the current density-voltage characteristics of a device with smaller ΔGSP rise at a voltage closer to 0 V, which means that such a device has an excellent hole-injection property. The present inventors also have found that an organic semiconductor device with ΔGSP less than or equal to 20 (mV/nm) can have a sufficiently good hole-injection property.

That is, one embodiment of the present invention is an organic semiconductor device including at least two layers (a first hole-transport layer and a second hole-transport layer) stacked in contact with each other. When holes flow from the first hole-transport layer side to the second hole-transport layer side in the organic semiconductor device, the difference between GSP of an organic compound in the first hole-transport layer (GSP1) and GSP of an organic compound in the second hole-transport layer (GSP2), i.e., ΔGSP (GSP1-GSP2), is less than or equal to 20 (mV/nm).

An organic semiconductor device having such a structure can easily inject holes and thus can have low driving voltage.

Note that in the case where the thickness of the first hole-transport layer or the second hole-transport layer is large, ΔGSP is preferably smaller. Specifically, ΔGSP is preferably less than or equal to 15 (mV/nm) when the thickness of the first hole-transport layer is greater than or equal to 80 nm and less than or equal to 160 nm; ΔGSP is preferably less than or equal to 10 (mV/nm) when the thickness of the second hole-transport layer is greater than or equal to 20 nm and less than or equal to 140 nm.

Moreover, regardless of the film thickness, ΔGSP is preferably less than or equal to 5 (mV/nm), further preferably less than or equal to 0 (mV/nm), and it is most preferable that ΔGSP be negative.

Figure 3:
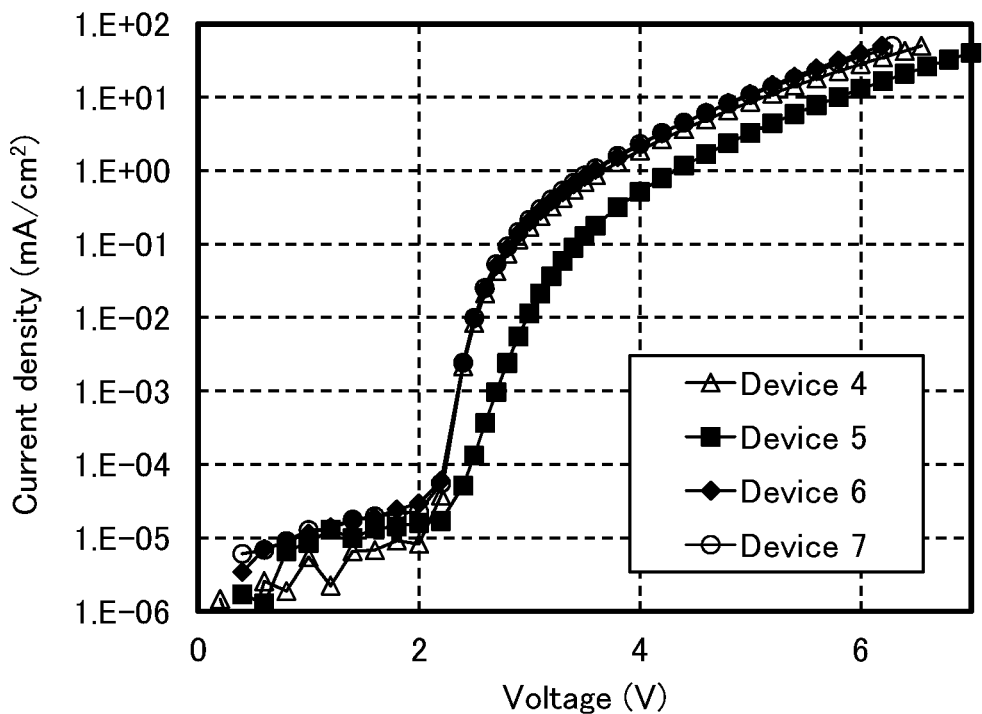
FIG. 3 shows the current density-voltage characteristics of the devices 4 to 7.
Figure 4A:
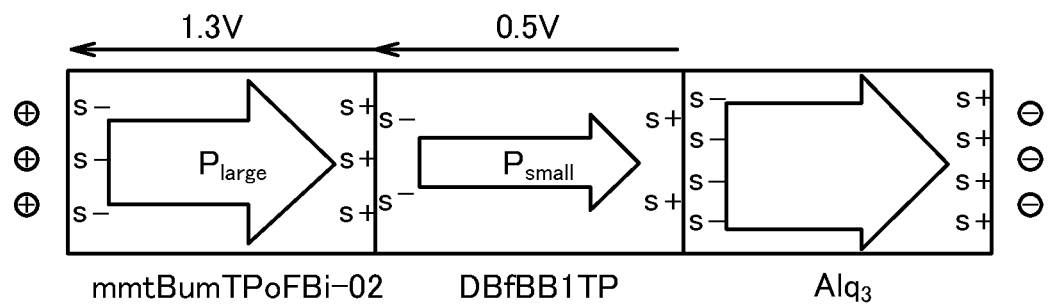
FIGS. 4A and 4B illustrate polarization of organic thin films.
Figure 4B:
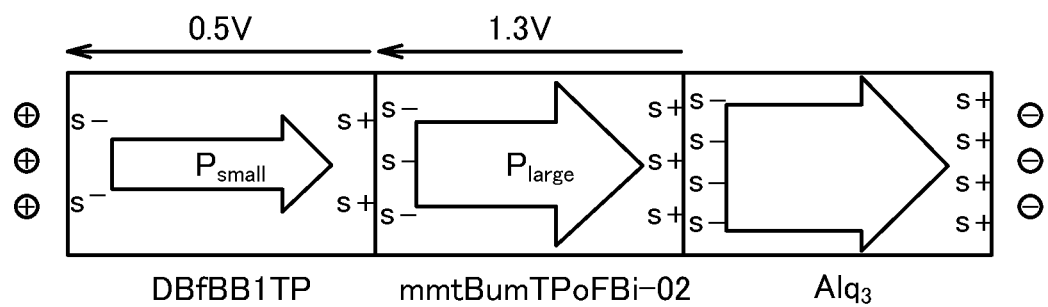

Next, the influences of polarization and GSP of an evaporated film on a hole-injection property will be described with reference to measurement results of the capacity-voltage characteristics of devices 4 to 7 in FIG. 2, measurement results of the current density-voltage characteristics of the devices 4 to 7 in FIG. 3, and FIGS. 4A and 4B.

The following tables list device structures of the devices 4 to 7 and GSP and ΔGSP of organic compounds used in the devices 5 and 6. Note that "two layers stacked in contact with each other" in each of the devices 4 to 7 correspond to the layer 2 and the layer 3 in the following tables. The layers 2 and 3 in the device 4 are formed using the same material and the layers 2 and 3 in the device 7 are formed using the same material; thus, ΔGSP is 0.

TABLE 3

|  | Film thickness | Device 4 | Device 5 | Device 6 | Device 7 |
|---|---|---|---|---|---|
| Cathode | 200 nm | Al | | | |
| Layer 5 | 1 nm | LiF | | | |
| Layer 4 | 80 nm | Alq$_3$ | | | |
| Layer 3 | 40 nm | *1 | *2 | *1 | *2 |
| Layer 2 | 40 nm | *1 | | *2 | |
| Layer 1 | 10 nm | *1: OCHD-003 (1:0.2) | | *2: OCHD-003 (1:0.2) | |
| Anode | 70 nm | ITSO | | | |

*1: mmtBumTPoFBi-02,
*2: HTM-1

TABLE 4

|  | Device 5 | Device 6 |
|---|---|---|
| Layer 3 (HTM2) | HTM-1 | mmtBumTPoFBi-02 |
| GSP2 (mV/nm) | 13.3 | 32.8 |
| Layer 2 (HTM1) | mmtBumTPoFBi-02 | HTM-1 |
| GSP1 (mV/nm) | 32.8 | 13.3 |
| ΔGSP (mV/nm) | 19.5 | -19.5 |

Figure 2:
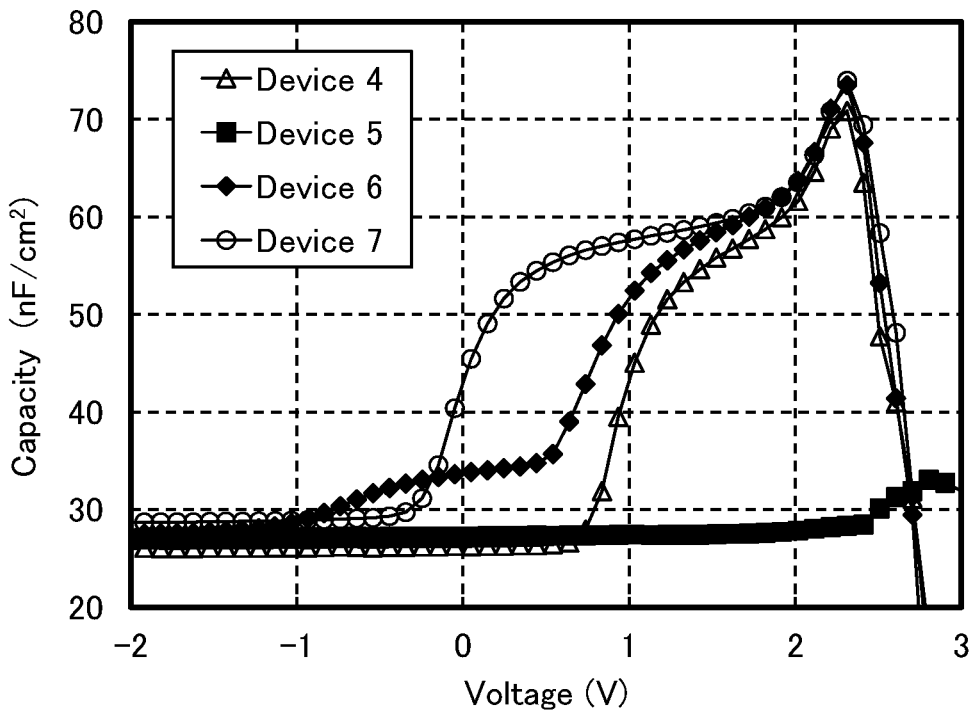
FIG. 2 shows the capacity-voltage characteristics of devices 4 to 7.

The capacity-voltage characteristics in FIG. 2 reveal that holes are first injected into the layers 2 and 3 formed using the same material in each of the devices 4 and 7, and electric charges are accumulated in the layer 4 so as to reach a threshold voltage of approximately 2 V. The hole-injection voltages of the devices 4 and 7 depend on the level of spontaneous polarization (GSP) of the layers 2 (layers 3).

The capacity-voltage characteristics in FIG. 2 show that the capacity hardly changes in the device 5 even after exceeding the threshold voltage, indicating that holes are not easily injected. In addition, the current density-voltage characteristics in FIG. 3 show that the device 5 is less likely to allow current to flow than the devices 4, 6, and 7.

Meanwhile, holes are injected into the device 6 in two stages, first into the layer 2 and then into the layer 3, and electric charges are accumulated in the layer 4 at around the threshold voltage, as shown in the capacity-voltage characteristics in FIG. 2.

A magnitude relationship between GSP of the layers 2 and 3 in the device 5 is inverted from that in the device 6. The device 6 whose difference in GSP (ΔGSP) between the organic compound in the layer 2 and the organic compound in the layer 3 (the layer 2-the layer 3) is negative is advantageous in hole injection. That is, smaller ΔGSP results in better hole injection (see FIGS. 4A and 4B).

As described above, a relationship between GSP of organic compounds in hole-transport layers stacked in contact with each other in an organic semiconductor device significantly affects a hole-injection property; thus, an organic semiconductor device having better properties can be easily obtained by selecting an appropriate combination of organic compounds.

Holes need to be sequentially injected into layers formed of organic compounds with different HOMO levels between a hole-transport region of an organic semiconductor device and an active layer or a light-emitting layer, in consideration of donation and acceptance of holes with electrodes. Since an excessively large difference in HOMO level between layers naturally increases driving voltage, a difference in HOMO level is reduced by provision of a layer, between an electrode and an active layer (a light-emitting layer), that is formed of an organic compound having a HOMO level positioned between those of the electrode and the active layer (the light-emitting layer). However, layers whose difference between HOMO levels is not so large may lead to a significant increase in driving voltage depending on a combination of organic compounds to be used. There is no guideline for avoiding the above problem so far, and it has been considered that the cause of the problem is the compatibility of materials. The use of the structure of the present invention can eliminate such mismatch and enables an organic semiconductor device with excellent properties to be easily obtained.

Figure 5A:
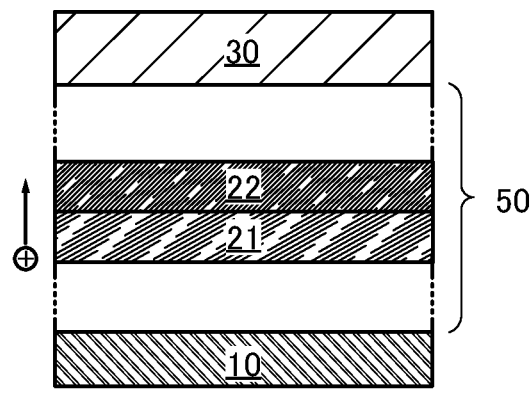
FIG. 5A illustrates an organic semiconductor device of one embodiment of the present invention.

Next, a structure of an organic semiconductor device of one embodiment of the present invention will be described. FIG. 5A is a schematic view of the organic semiconductor device of one embodiment of the present invention. In the organic semiconductor device of one embodiment of the present invention, a layer 50 containing an organic compound is provided between an anode 10 and a cathode 30, and the layer 50 containing an organic compound includes at least a first hole-transport layer 21 and a second hole-transport layer 22. Holes flow from the first hole-transport layer side to the second hole-transport layer side in the organic semiconductor device of one embodiment of the present invention, and a difference between GSP of an organic compound in the first hole-transport layer 21 (GSP1) and GSP of an organic compound in the second hole-transport layer 22 (GSP2), i.e., ΔGSP (GSP1-GSP2), is less than or equal to 20 (mV/nm). When ΔGSP is less than or equal to 20 (mV/nm), the organic semiconductor device of one embodiment of the present invention can have an excellent hole-injection property; thus, the organic semiconductor device with low driving voltage can be easily obtained. Note that ΔGSP is preferably less than or equal to 5 (mV/nm), further preferably less than or equal to 0 (mV/nm).

Examples of the organic semiconductor device include a variety of devices such as an organic TFT, an organic EL device, and a photodiode sensor, and one embodiment of the present invention can be used for any of organic semiconductor devices having a stacked structure of hole-transport layers.

Figure 5B:
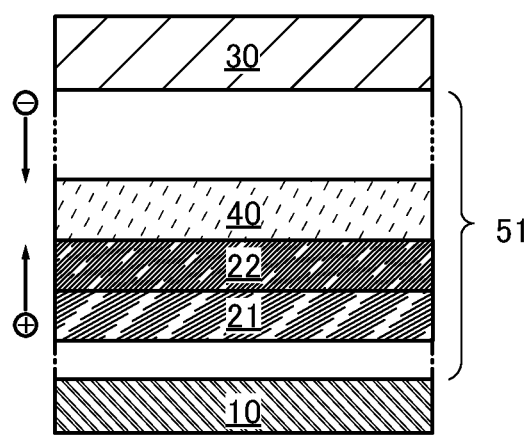
FIG. 5B illustrates an organic EL device of one embodiment of the present invention.
Figure 5C:
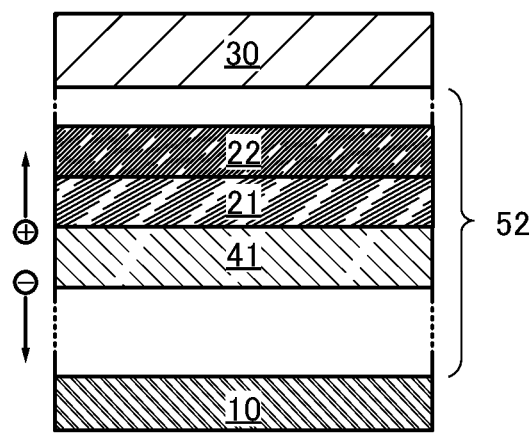
FIG. 5C illustrates a photodiode sensor of one embodiment of the present invention.

As examples of the organic semiconductor device, FIG. 5B illustrates an organic EL device employing the present invention, and FIG. 5C illustrates a photodiode sensor employing the present invention.

In the organic EL device of one embodiment of the present invention illustrated in FIG. 5B, an EL layer 51 (which corresponds to the layer 50 containing an organic compound) is provided between the anode 10 and the cathode 30, and the EL layer 51 includes at least a hole-transport layer (the first hole-transport layer 21 and the second hole-transport layer 22) and a light-emitting layer 40. The first hole-transport layer 21 is provided closer to the anode 10 than the second hole-transport layer 22 is, and the first hole-transport layer 21 is in contact with and overlaps with the second hole-transport layer 22. The light-emitting layer 40 is positioned between the second hole-transport layer 22 and the cathode 30, and is preferably in contact with the second hole-transport layer 22.

In the organic EL device illustrated in FIG. 5B, a region between the anode 10 and the light-emitting layer 40 is a hole-transport region where holes serve as carriers. Since the first hole-transport layer 21 is positioned on the anode 10 side and the second hole-transport layer 22 is positioned on the light-emitting layer 40 side, holes serving as carriers flow from the first hole-transport layer 21 to the second hole-transport layer 22. Note that a hole-injection layer (not illustrated) for facilitating hole injection from the anode 10 may be provided between the first hole-transport layer 21 and the anode 10.

A region between the light-emitting layer 40 and the cathode 30 is an electron-transport region where electrons serve as carriers. There is no particular limitation on the structure of the electron-transport region, and a layer that allows electrons to flow as carriers is formed. In the light-emitting layer 40, light emission can be obtained by excitation of a light-emitting substance due to recombination energy generated by recombination of electrons and holes.

In the organic EL device of one embodiment of the present invention, $\Delta$GSP (GSP of an organic compound in the first hole-transport layer 21 (GSP1)-GSP of an organic compound in the second hole-transport layer 22 (GSP2)) is less than or equal to 20 (mV/nm); thus, an excellent hole-injection property can be obtained, which allows a light-emitting device to have excellent properties with low driving voltage.

Note that in the case where the thickness of the first hole-transport layer 21 or the second hole-transport layer 22 is large, $\Delta$GSP is preferably smaller. That is, $\Delta$GSP is preferably less than or equal to 15 (mV/nm) when the thickness of the first hole-transport layer is greater than or equal to 80 nm and less than or equal to 160 nm; $\Delta$GSP is preferably less than or equal to 10 (mV/nm) when the thickness of the second hole-transport layer is greater than or equal to 20 nm and less than or equal to 140 nm.

Note that regardless of the thickness of the hole-transport layer 20, $\Delta$GSP is preferably less than or equal to 5 (mV/nm), further preferably less than or equal to 0 (mV/nm).

In the organic EL device of one embodiment of the present invention illustrated in FIG. 5B, the organic compound in the first hole-transport layer 21 is preferably an aromatic amine having an alkyl group, in which case the refractive index of the first hole-transport layer 21 can be lowered and light extraction efficiency can be improved. This enables the organic EL device to have high emission efficiency.

Alternatively, the organic compound in the first hole-transport layer 21 preferably has a fluorene skeleton or a spirofluorene skeleton. Since fluorenylamine has an effect of increasing the HOMO level, when the organic compound in the first hole-transport layer 21 is an aromatic amine having a fluorene skeleton, bonding of three fluorenes to nitrogen of the amine possibly increases the HOMO level significantly. In that case, a difference in HOMO level between the organic compound and peripheral materials becomes large, which might affect driving voltage, reliability, or the like. Thus, in the case where the organic compound in the first hole-transport layer 21 is an aromatic amine having a fluorene skeleton, the number of fluorene skeletons bonded to nitrogen of the amine is further preferably one or two.

Alternatively, the organic compound in the first hole-transport layer 21 preferably has a carbazole skeleton.

The organic compound in the first hole-transport layer 21 preferably has a HOMO level in the range of $-5.45$ eV to $-5.20$ eV, in which case a property of hole injection from the hole-injection layer and the anode 10 can be favorable. This enables the organic EL device to be driven at low voltage.

The organic compound in the second hole-transport layer 22 is preferably an aromatic amine having an alkyl group, in which case the refractive index of the second hole-transport layer 22 can be lowered and light extraction efficiency can be improved. This enables the organic EL device to have high emission efficiency.

The organic compound in the second hole-transport layer 22 preferably has a dibenzofuran skeleton or a dibenzothiophene skeleton.

In the organic semiconductor device, a difference between a HOMO level of the first hole-transport layer 21 (HOMO1) and a HOMO level of the second hole-transport layer 22 (HOMO2), i.e., $\Delta$HOMO (HOMO1-HOMO2), is preferably greater than or equal to $-0.3$ eV and less than or equal to 0.3 eV, further preferably greater than or equal to $-0.2$ eV and less than or equal to 0.2 eV, in which case a property of hole injection from the first hole-transport layer 21 to the second hole-transport layer 22 can be favorable. This enables the organic EL device to be driven at low voltage.

Furthermore, $\Delta$GSP and $\Delta$HOMO in the organic semiconductor device are parameters for making properties of hole injection into the first hole-transport layer 21 and the second hole-transport layer 22 favorable; thus, the driving voltage is low in a wider range of $\Delta$HOMO when $\Delta$GSP is small, and the driving voltage is also low at larger $\Delta$GSP when the range of $\Delta$HOMO is narrow. Hence, when $\Delta$GSP is less than or equal to 0, $\Delta$HOMO is preferably greater than or equal to $-0.6$ eV and less than or equal to 0.6 eV. When $\Delta$HOMO is within the range from $-0.2$ eV to 0.2 eV, $\Delta$GSP is preferably less than or equal to 20.

In the photodiode sensor of one embodiment of the present invention illustrated in FIG. 5C, a photoelectric conversion layer 52 (which corresponds to the layer 50 containing an organic compound) is provided between the anode 10 and the cathode 30, and the layer containing an organic compound includes at least the first hole-transport layer 21, the second hole-transport layer 22, and an active layer 41. The first hole-transport layer 21 is provided closer to the anode 10 than the second hole-transport layer 22 is, and the first hole-transport layer 21 is in contact with and overlaps with the second hole-transport layer 22. The active layer 41 is positioned between the first hole-transport layer 21 and the anode 10.

In the photodiode sensor illustrated in FIG. 5C, a region between the cathode 30 and the active layer 41 is a hole-transport region where holes serve as carriers and includes at least the first hole-transport layer 21 and the second hole-transport layer 22 as described above. The first hole-transport layer 21 and the second hole-transport layer 22 are stacked in contact with each other. The first hole-transport layer 21 is positioned on the active layer 41 side, and the second hole-transport layer 22 is positioned on the cathode 30 side. Thus, holes generated in the active layer 41 flow from the first hole-transport layer 21 to the second hole-transport layer 22.

A region between the active layer 41 and the anode 10 is an electron-transport region where electrons serve as carriers. There is no particular limitation on the structure of the electron-transport region, and a layer that allows electrons to flow as carriers is formed.

Electrons and holes are generated in the active layer 41 by light irradiation, and the generated electrons flow to the anode 10 side and the generated holes flow to the cathode 30 side in accordance with the direction of voltage.

In the photodiode sensor of one embodiment of the present invention, $\Delta$GSP (GSP of the organic compound in the first hole-transport layer 21 (GSP1)-GSP of the organic compound in the second hole-transport layer 22 (GSP2)) is less than or equal to 20 (mV/nm); thus, an excellent hole-injection property can be obtained, which allows a photodiode sensor to have excellent properties with slight loss.

Note that in the case where the thickness of the first hole-transport layer 21 or the second hole-transport layer 22 is large, ΔGSP is preferably smaller. That is, ΔGSP is preferably less than or equal to 15 (mV/nm) when the thickness of the first hole-transport layer is greater than or equal to 80 nm and less than or equal to 160 nm; ΔGSP is preferably less than or equal to 10 (mV/nm) when the thickness of the second hole-transport layer is greater than or equal to 20 nm and less than or equal to 140 nm.

Note that regardless of the thickness of the hole-transport layer 20, ΔGSP is preferably less than or equal to 5 (mV/nm), further preferably less than or equal to 0 (mV/nm).

Here, a method for obtaining GSP of an organic compound will be described.

A phenomenon in which a surface potential of an evaporated film increases in proportion to a film thickness is called the giant surface potential as described above. In general, a slope of a plot of a surface potential of an evaporated film in the thickness direction by Kelvin probe measurement is assumed as the level of the giant surface potential, that is, GSP (mV/nm); in the case where two different layers are stacked, a change in the density of polarization charges (mC/m²) accumulated at the interface, which is in association with GSP, can be utilized to estimate GSP.

Non-Patent Document 1 discloses that the following formulae hold when current is made to flow through a stack of organic thin films (a thin film 1 positioned on the anode side and a thin film 2 positioned on the cathode side) with different kinds of spontaneous polarization.

[Formula 1]
$$\sigma_{if} = \frac{Q_{if}}{S} = (V_i - V_{bi})\frac{\varepsilon_2}{d_2} \quad (1)$$

[Formula 2]
$$\sigma_{if} = P_1 - P_2 = \frac{\varepsilon_1 V_1}{d_1} - \frac{\varepsilon_2 V_2}{d_2} \quad (2)$$

In Formula (1), $\sigma_{if}$ is a polarization charge density, $V_i$ is a hole-injection voltage, $V_{bi}$ is a threshold voltage, $d_2$ is a thickness of the thin film 2, and $\varepsilon_2$ is a dielectric constant of the thin film 2. Note that $V_i$ and $V_{bi}$ can be estimated from the capacity-voltage characteristics of a device. The square of an ordinary refractive index $n_o$ (633 nm) can be used as the dielectric constant. As described above, according to Formula (1), the polarization charge density $\sigma_{if}$ can be calculated using $V_i$ and $V_{bi}$ estimated from the capacity-voltage characteristics, the dielectric constant $\varepsilon_2$ of the thin film 2 calculated from the refractive index, and the thickness $d_2$ of the thin film 2.

Next, in Formula (2), $\sigma_{if}$ is a polarization charge density, $P_n$ is GSP of a thin film n, and $\varepsilon_n$ is a dielectric constant of the thin film n. Since the polarization charge density $\sigma_{if}$ can be obtained from Formula (1), the use of a substance with known GSP for the thin film 2 enables GSP of the thin film 1 to be estimated.

Thus, Alq₃ whose GSP is known to be 48 (mV/nm) is used for the thin film 2, devices 8 and 9 are fabricated as measurement devices, and GSP of mmtBumTPoFBi-02 in the device 8 and GSP of NPB in the device 9 are calculated below, for example.

The following table lists device structures of the devices 8 and 9. Note that layers 1_1 to 4_1 and a cathode in each of the devices 8 and 9 are formed from the anode side by a vacuum evaporation method under the conditions where the substrate temperature is set to room temperature and the deposition rate is within the range from 0.2 nm/sec to 0.4 nm/sec. One layer is formed without interruption of evaporation. In each of the devices 8 and 9, the layer 2_1 corresponds to the thin film 1 and the layer 3_1 corresponds to the thin film 2.

Figure 6:
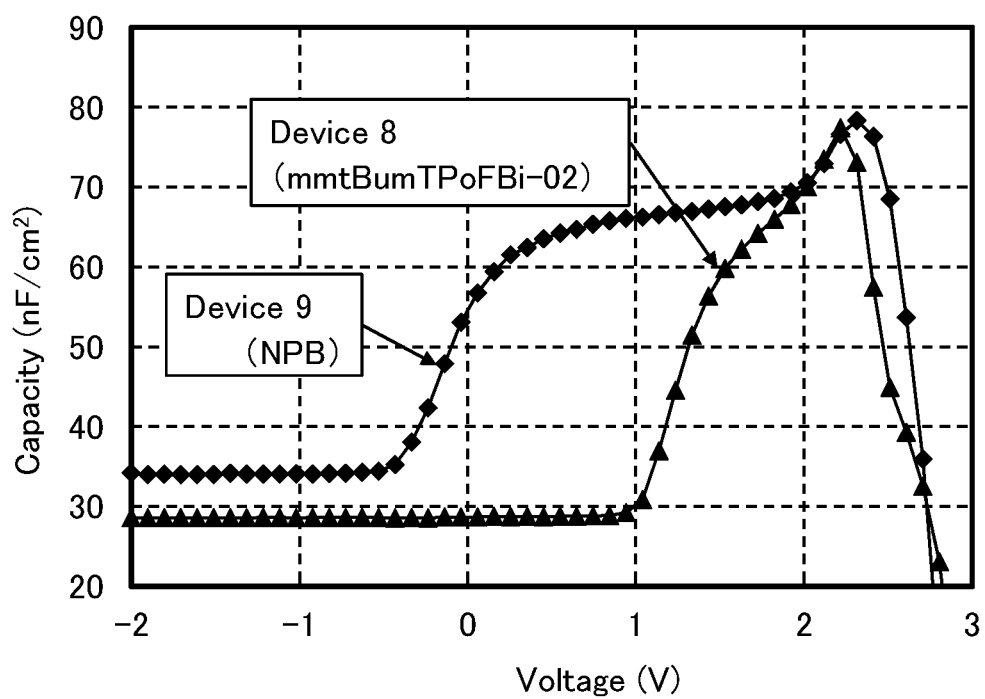
FIG. 6 shows the capacity-voltage characteristics of devices 8 and 9.

FIG. 6 shows the capacity-voltage characteristics of the devices 8 and 9.

TABLE 5

| | Film thickness | Device 8 | Device 9 |
|---|---|---|---|
| Cathode | 200 nm | Al | |
| Layer 4_1 | 1 nm | LiF | |
| Layer 3_1 | 60 nm | Alq₃ | |
| Layer 2_1 | 80 nm | mmtBumTPoFBi-02 | NPB |
| Layer 1_1 | 10 nm | mmtBumTPoFBi-02: OCHD-003 (1:0.1) | NPB:OCHD-003 (1:0.1) |
| Anode | 70 nm | ITSO | |

Table 6 shows the hole-injection voltage $V_i$, the threshold voltage $V_{bi}$, the polarization charge density $\sigma_{if}$, and GSP of the device 8 (mmtBumTPoFBi-02) and the device 9 (NPB) that are obtained from FIG. 6 and Formulae (1) and (2) and the refractive indices $n_o$ of the materials used in the calculation. The refractive indices are measured with a spectroscopic ellipsometer (M-2000U, produced by J.A. Woollam Japan Corp.).

TABLE 6

| | Device 8 (mmtBumTPoFBi-02) | Device 9 (NPB) |
|---|---|---|
| Hole-injection voltage $V_i$ (V) | 0.94 | −0.53 |
| Threshold voltage $V_{bi}$ (V) | 2.02 | 2.02 |
| Polarization charge density $\sigma_{if}$ (mC/m²) | −0.47 | −1.1 |
| Ordinary refractive index $n_o$ (@ 633 nm) | 1.64 | 1.77 |
| GSP (mV/nm) | 32.6 | 5.2 |

Note that devices 10 and 11 having substantially the same structures as the devices 8 and 9 except that the thickness of Alq₃ is 80 nm are fabricated. It is confirmed that the hole-injection voltages of the devices 10 and 11 shift to a lower voltage side than those of the devices 8 and 9. That is, it is presumed that holes are injected first and polarization charges are accumulated at the interface with Alq₃ in such devices. Furthermore, GSP of the devices 10 and 11 is estimated in a manner similar to that of the devices 8 and 9, and the same results as those of the devices 8 and 9 are obtained.

In this manner, a device in which Alq₃ with known GSP and an organic compound with GSP to be obtained are stacked is fabricated and the capacity-voltage characteristics are measured, so that GSP of the organic compound can be estimated.

Note that in the case where the thin film 1 or the thin film 2 contains a plurality of organic compounds, GSP of the major organic compound (e.g., the organic compound contained in the largest proportion) can be regarded as "GSP of an organic compound in a layer". Alternatively, in the case where the thin film 1 or the thin film 2 contains a plurality of organic compounds, GSP and contents of the organic compounds are calculated, and a weighted average (GSP_ave) may be defined as "GSP of an organic compound in a layer".

Embodiment 2

Figure 7A:
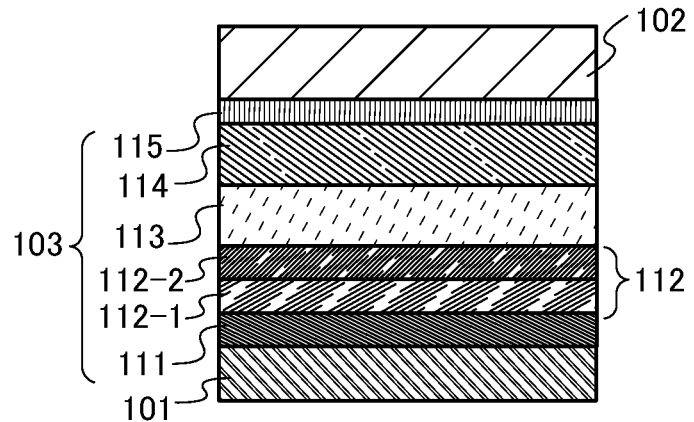
FIGS. 7A to 7C are each a schematic view of an organic EL device.

In this embodiment, the organic EL device of one embodiment of the present invention will be described in detail. FIG. 7A illustrates the organic EL device of one embodiment of the present invention. The organic EL device of one embodiment of the present invention includes an EL layer 103 between an anode 101 and a cathode 102. The EL layer 103 includes a light-emitting layer 113 and a hole-transport layer 112 including at least a first hole-transport layer 112-1 and a second hole-transport layer 112-2. A region between the light-emitting layer 113 and the anode 101 is a hole-transport region where holes serve as carriers, and a region between the light-emitting layer 113 and the cathode 102 is an electron-transport region where electrons serve as carriers.

The first hole-transport layer 112-1 and the second hole-transport layer 112-2 are formed in contact with each other in this order from the anode 101 side. The second hole-transport layer 112-2 is preferably in contact with the light-emitting layer 113. In that case, the second hole-transport layer 112-2 sometimes also functions as an electron-blocking layer. The hole-transport layer 112 may include third and fourth hole-transport layers in addition to the first hole-transport layer 112-1 and the second hole-transport layer 112-2.

A hole-injection layer 111 may be provided between the hole-transport layer 112 and the anode 101. Although FIG. 7A illustrates an electron-transport layer 114 and an electron-injection layer 115 in addition to these layers, the structure of the organic EL device is not limited thereto, and other functional layers such as a carrier-blocking layer, an exciton-blocking layer, and a charge-generation layer may be provided.

Next, examples of specific structures and materials of the above-described organic EL device will be described.

The anode 101 is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer that is in contact with the anode 101 in the EL layer 103, an electrode material can be selected regardless of its work function.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (e.g., a halogen group or a cyano group); for example, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a very high electron-accepting property and thus is preferable. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: H$_2$Pc) and copper phthalocyanine (CuPc), an aromatic amine compound such as 4,4'-bis[N-(4-diphenylaminophenyl)-N-phenylamino]biphenyl (abbreviation: DPAB) and N,N-bis {4-[bis(3-methylphenyl)amino]phenyl}-N,N-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) by application of an electric field.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the anode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1 \times 10^{-6}$ cm$^2$/Vs or higher. Organic compounds that can be used as the material having a hole-transport property in the composite material are specifically given below.

Examples of the aromatic amine compounds that can be used for the composite material include N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracen-9-yl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{NV-[4-(4-diphenylamino)phenyl]phenyl-N-phenylamino}phenyl)methacrylamide] (abbreviation: PTPDMA), and poly[N,N-bis(4-butylphenyl)-N,N-bis(phenyl)benzidine] (abbreviation: poly-TPD).

The material having a hole-transport property that is used in the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the hole-transport material having an N,N-bis(4-biphenyl)amino group is preferable because an organic EL device having a long lifetime can be fabricated. Specific examples of the hole-transport material include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBA-Bnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole}triphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Note that it is further preferable that the material having a hole-transport property to be used in the composite material have a relatively deep HOMO level higher than or equal to −5.7 eV and lower than or equal to −5.4 eV. Using the material with a hole-transport property which has a relatively deep HOMO level in the composite material makes it easy to inject holes into the hole-transport layer 112 and to obtain an organic EL device having a long lifetime.

Note that mixing the above composite material with a fluoride of an alkali metal or an alkaline earth metal (the proportion of fluorine atoms in a layer using the mixed material is preferably greater than or equal to 20%) can lower the refractive index of the layer. This also enables a layer with a low refractive index to be formed in the EL layer 103, leading to higher external quantum efficiency of the organic EL device.

The formation of the hole-injection layer 111 can improve the hole-injection property, which allows the organic EL device to be driven at a low voltage. In addition, the organic compound having an acceptor property is easy to use because it is easily deposited by vapor deposition.

The hole-transport layer 112 is formed using a material having a hole-transport property. The material having a hole-transport property preferably has a hole mobility higher than or equal to $1\times10^{-6}$ cm$^2$/Vs. In the organic EL device of one embodiment of the present invention, at least the first hole-transport layer 112-1 and the second hole-transport layer 112-2 are stacked in contact with each other. Note that the first hole-transport layer 112-1 is positioned on the anode 101 side.

In the organic EL device of one embodiment of the present invention, materials of the layers are selected such that a difference between GSP of an evaporated film of an organic compound in the first hole-transport layer 112-1 (GSP1) and GSP of an evaporated film of an organic compound in the second hole-transport layer 112-2 (GSP2), i.e., ΔGSP (GSP1-GSP2), is less than or equal to 20 (mV/nm).

In the case where the thickness of the first hole-transport layer 112-1 or the second hole-transport layer 112-2 is large, ΔGSP is preferably smaller. Note that ΔGSP is preferably less than or equal to 15 (mV/nm) when the thickness of the first hole-transport layer is greater than or equal to 80 nm and less than or equal to 160 nm; ΔGSP is preferably less than or equal to 10 (mV/nm) when the thickness of the second hole-transport layer is greater than or equal to 20 nm and less than or equal to 140 nm.

Moreover, regardless of the film thickness, ΔGSP is preferably less than or equal to 5 (mV/nm), further preferably less than or equal to 0 (mV/nm).

An organic semiconductor device having such a structure can easily inject holes and thus can have low driving voltage.

Examples of the organic compound that can be used for the hole-transport layer 112 include compounds having an aromatic amine skeleton, such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the organic compound that can be used for the composite material in the hole-injection layer 111 can also be suitably used as the material included in the hole-transport layer 112.

Note that the organic compounds used for the first hole-transport layer 112-1 and the second hole-transport layer 112-2 are each preferably an aromatic amine having an alkyl group, in which case the refractive index of the hole-transport layer 112 can be lowered and light extraction efficiency can be improved. It is further preferable to use an organic compound having a plurality of alkyl groups in one molecule. Preferable examples of such a material include N,N-bis(4-cyclohexylphenyl)-9,9-dimethyl-9H-fluoren-2-amine (abbreviation: dchPAF), N-[(4'-cyclohexyl)-1,1'-biphenyl-4-yl]-N-(4-cyclohexylphenyl)-9,9-dimethyl-9H-fluoren-2-amine (abbreviation: chBichPAF), N,N-bis(4-cyclohexylphenyl)-N-(spiro[cyclohexane-1,9'-[9H]fluoren]-2'yl)amine (abbreviation: dchPASchF), N-[(4'-cyclohexyl)-1,1'-biphenyl-4-yl]-N-(4-cyclohexylphenyl)-N-(spiro[cyclohexane-1,9'-[9H]fluoren]-2'yl)amine (abbreviation: chBichPASchF), N-(4-cyclohexylphenyl)-bis(spiro[cyclohexane-1,9'-[9H]fluoren]-2'-yl)amine (abbreviation: SchFB1chP), N-[(3',5'-ditertiarybutyl)-1,1'-biphenyl-4-yl]-N-(4-cyclohexylphenyl)-9,9-dimethyl-9H-fluoren-2-amine (abbreviation: mmtBuBichPAF), N,N-bis(3',5'-ditertiarybutyl-1,1'-biphenyl-4-yl)-9,9-dimethyl-9H-fluoren-2-amine (abbreviation: dmmtBuBiAF), N-(3,5-ditertiarybutylphenyl)-N-(3',5'-ditertiarybutyl-1,1'-biphenyl-4-yl)-9,9-dimethyl-9H-fluoren-2-amine (abbreviation: mmtBuBimmtBuPAF), N,N-bis(4-cyclohexylphenyl)-9,9-dipropyl-9H-fluoren-2-amine (abbreviation: dchPAPrF), N-[(3',5'-dicyclohexyl)-1,1'-biphenyl-4-yl]-N-(4-cyclohexylphenyl)-9,9-dimethyl-9H-fluoren-2-amine (abbreviation: mmchBichPAF), N-(3,3'',5,5''-tetra-t-butyl-1,1':3',1''-terphenyl-5'-yl)-N-(4-cyclohexylphenyl)-9,9-dimethyl-9H-fluoren-2-amine (abbreviation: mmtBumTPchPAF), N-(4-cyclododecylphenyl)-N-(4-cyclohexylphenyl)-9,9-dimethyl-9H-fluoren-2-amine (abbreviation: CdoPchPAF), N-(3,3'',5,5''-tetra-t-butyl-1,1':3',1''-terphenyl-5'-yl)-N-phenyl-9,9-dimethyl-9H-fluoren-2-amine (abbreviation: mmtBumTPFA), N-(1,1'-biphenyl-4-yl)-N-(3,3'',5,5''-tetra-t-butyl-1,1':3',1''-terphenyl-5'-yl)-9,9-dimethyl-9H-fluoren-2-amine (abbreviation: mmtBumTPFBi), N-(1,1'-biphenyl-2-yl)-N-(3,3'',5,5''-tetra-t-butyl-1,1':3',1''- terphenyl-5'-yl)-9,9-dimethyl-9H-fluoren-2-amine (abbreviation: mmtBumTPoFBi), N-[(3,3',5'-tri-t-butyl)-1,1'-biphenyl-5-yl]-N-(4-cyclohexylphenyl)-9,9-dimethyl-9H-fluoren-2-amine (abbreviation: mmtBumBichPAF), N-(1,1'-biphenyl-2-yl)-N-[(3,3',5'-tri-t-butyl)-1,1'-biphenyl-5-yl]-9,9-dimethyl-9H-fluoren-2-amine (abbreviation: mmtBumBioFBi), N-(4-tert-butylphenyl)-N-(3,3",5,5"-tetra-t-butyl-1,1':3',1"-terphenyl-5'-yl)-9,9-dimethyl-9H-fluoren-2-amine (abbreviation: mmtBumTPtBuPAF), N-(3,3",5',5"-tetra-tert-butyl-1,1':3',1"-terphenyl-5-yl)-N-phenyl-9,9-dimethyl-9H-fluoren-2-amine (abbreviation: mmtBumTPFA-02), N-(1,1'-biphenyl-4-yl)-N-(3,3",5',5"-tetra-tert-butyl-1,1':3',1"-terphenyl-5-yl)-9,9-dimethyl-9H-fluoren-2-amine (abbreviation: mmtBumTPFBi-02), N-(1,1'-biphenyl-2-yl)-N-(3,3",5',5"-tetra-tert-butyl-1,1':3',1"-terphenyl-5-yl)-9,9-dimethyl-9H-fluoren-2-amine (abbreviation: mmtBumTPoFBi-02), N-(4-cyclohexylphenyl)-N-(3,3",5',5"-tetra-tert-butyl-1,1':3',1"-terphenyl-5-yl)-9,9-dimethyl-9H-fluoren-2-amine (abbreviation: mmtBumTPchPAF-02), N-(1,1'-biphenyl-2-yl)-N-(3",5',5"-tri-tert-butyl-1,1':3',1"-terphenyl-5-yl)-9,9-dimethyl-9H-fluoren-2-amine (abbreviation: mmtBumTPoFBi-03), N-(4-cyclohexylphenyl)-N-(3",5',5"-tri-tert-butyl-1,1':3',1"-terphenyl-5-yl)-9,9-dimethyl-9H-fluoren-2-amine (abbreviation: mmtBumTPchPAF-03), N-(3",5',5"-tri-t-butyl-1,1':3',1"-terphenyl-4-yl)-N-(1,1'-biphenyl-2-yl)-9,9-dimethyl-9H-fluoren-2-amine (abbreviation: mmtBumTPoFBi-04), N-(3",5',5"-tri-tert-butyl-1,1':3',1"-terphenyl-4-yl)-N-(4-cyclohexylphenyl)-9,9-dimethyl-9H-fluoren-2-amine (abbreviation: mmtBumTPchPAF-04), N-(1,1'-biphenyl-2-yl)-N-(3,3",5"-tri-tert-butyl-1,1':4',1"-terphenyl-5-yl)-9,9-dimethyl-9H-fluoren-2-amine (abbreviation: mmtBumTPoFBi-05), N-(4-cyclohexylphenyl)-N-(3,3",5"-tri-tert-butyl-1,1':4',1"-terphenyl-5-yl)-9,9-dimethyl-9H-fluoren-2-amine (abbreviation: mmtBumTPchPAF-05), and N-(3',5'-ditertiarybutyl-1,1'-biphenyl-4-yl)-N-(1,1'-biphenyl-2-yl)-9,9-dimethyl-9H-fluoren-2-amine (abbreviation: mmtBuBioFBi).

Alternatively, the organic compounds used for the first hole-transport layer 112-1 and the second hole-transport layer 112-2 each preferably have a fluorene skeleton or a spirofluorene skeleton. Since fluorenylamine has an effect of increasing the HOMO level, when the organic compound in the first hole-transport layer 112-1 or the second hole-transport layer 112-2 is an aromatic amine having a fluorene skeleton, bonding of three fluorenes to nitrogen of the amine possibly increases the HOMO level significantly. In that case, a difference in HOMO level between the organic compound and peripheral materials becomes large, which might affect driving voltage, reliability, or the like. Thus, in the case where the organic compound in the first hole-transport layer 112-1 or the second hole-transport layer 112-2 is an aromatic amine having a fluorene skeleton, the number of fluorene skeletons bonded to nitrogen of the amine is further preferably one or two.

Alternatively, the organic compounds used for the first hole-transport layer 112-1 and the second hole-transport layer 112-2 each preferably have a carbazole skeleton.

The organic compound in the first hole-transport layer 112-1 preferably has a HOMO level in the range of −5.45 eV to −5.20 eV, in which case a property of hole injection from the HIL and the anode 101 can be favorable. This enables the organic EL device to be driven at low voltage.

The light-emitting layer 113 includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used.

Examples of the material that can be used as a fluorescent substance in the light-emitting layer 113 are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N-bis[4-(9-phenyl-9H-fluoren-9-yl)phenyl]pyrene-1,6-diamine (abbreviation: 1,6FLPAPm), N,N-bis(3-methylphenyl)-N,N'-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'- diphenyl-N,N'-(1,6-pyrene-diyl)bis[(6-phenylbenzo[b] naphtho[1,2-d]furan)-8-amine] (abbreviation:1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). Condensed aromatic diamine compounds typified by pyrenediamine compounds such as 1,6FLPAPrn, 1,6mMemFLPAPm, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κN²]phenyl-κC}iridium(III) (abbreviation: [Ir(mpptz-dmp)$_3$]), tris(5-methyl-3,4-diphenyl-4H-1,2,4-triazolato) iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato] iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium (III) (abbreviation: [Ir(iPrpmi)$_3$]) and tris[3-(2,6-dimethylphenyl)-7-methylimidazo[1,2-f]phenanthridinato]iridium (III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C²']iridium (III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl) phenyl]pyridinato-N,C²'}iridium(III) picolinate (abbreviation: [Ir(CF$_3$ppy)$_2$(pic)]), and bis[2-(4',6'-difluorophenyl)pyridinato-N,C²']iridium(III) acetylacetonate (abbreviation: FIr(acac)). These compounds emit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$ (acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$ (acac)]) and (acetylacetonato)bis(5-isopropyl-3-methyl-2-phenylpyrazinato)iridium(III) (abbreviation: [Ir(mppr-iPr)$_2$ (acac)]); organometallic iridium complexes having a pyridine skeleton, such as tris(2-phenylpyridinato-N,C²') iridium(III) (abbreviation: [Ir(ppy)$_3$]), bis(2-phenylpyridinato-N,C²')iridium(III) acetylacetonate (abbreviation: [Ir (ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,C²')iridium(III) (abbreviation: [Ir(pq)$_3$]), and bis(2-phenylquinolinato-N,C²')iridium(III) acetylacetonate (abbreviation: [Ir(pq)$_2$(acac)]); and a rare earth metal complex such as tris(acetylacetonato) (monophenanthroline)terbium(III) (abbreviation: [Tb(acac)$_3$ (Phen)]). These are mainly compounds that emit green phosphorescence and have an emission peak at 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), and bis[4, 6-di(naphthalen-1-yl)pyrimidinato](dipivaloylmethanato) iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2, 3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C²)iridium(III) (abbreviation: [Ir(piq)$_3$]) and bis(1-phenylisoquinolinato-N,C²)iridium(III) acetylacetonate (abbreviation: [Ir(piq)$_2$(acac)]); platinum complexes such as 2,3,7,8,12,13,17,18-octaethyl-21H,23H-porphyrinplatinum (II) (abbreviation: PtOEP); and rare earth metal complexes such as tris(1,3-diphenyl-1,3-propanedionato)(monophenanthroline)europium(III) (abbreviation: [Eu(DBM)$_3$ (Phen)]) and tris[1-(2-thenoyl)-3,3,3-trifluoroacetonato] (monophenanthroline)europium(III) (abbreviation: [Eu (TTA)$_3$(Phen)]). These compounds emit red phosphorescence and have an emission peak at 600 nm to 700 nm. Furthermore, the organometallic iridium complexes having a pyrazine skeleton can provide red light emission with favorable chromaticity.

Besides the above phosphorescent compounds, known phosphorescent substances may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formulae 2]
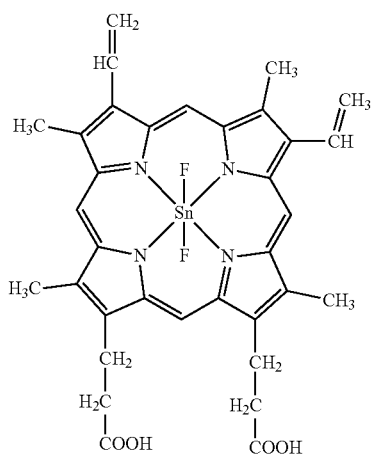
SnF$_2$(Proto IX)
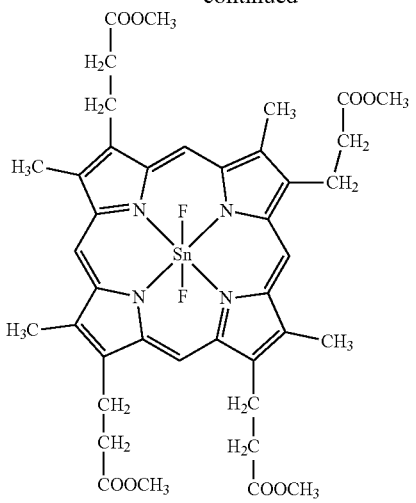
SnF$_2$(Copro III-4Me)
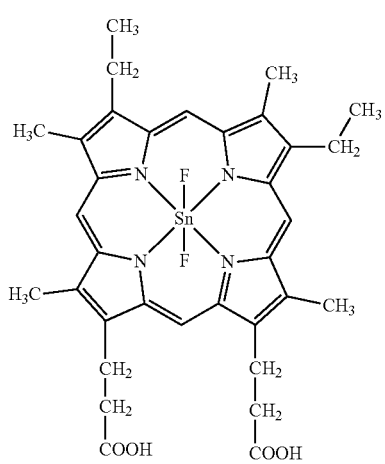
SnF$_2$(Meso IX)
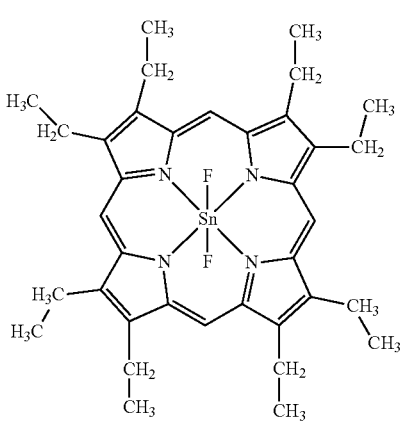
SnF$_2$(OEP)
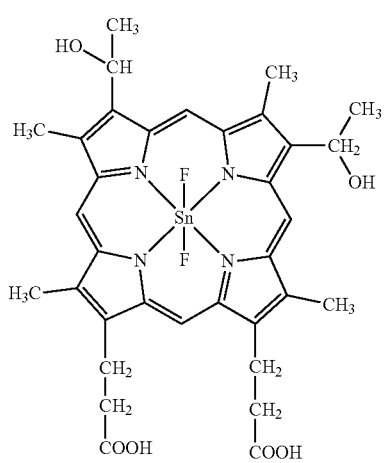
SnF$_2$(Hemato IX)
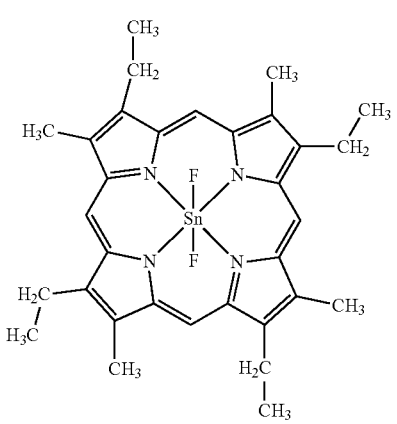
SnF$_2$(Etio I)

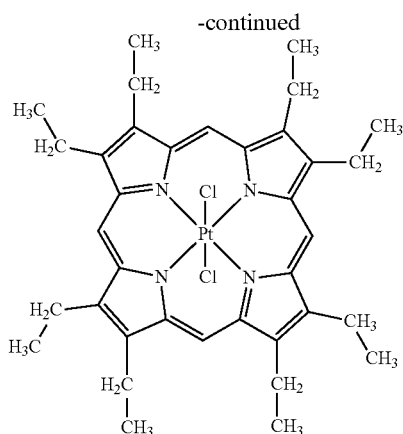

PtCl₂OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the it-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the it-electron rich heteroaromatic ring is directly bonded to the it-electron deficient heteroaromatic ring is particularly preferred because the electron-donating property of the it-electron rich heteroaromatic ring and the electron-accepting property of the it-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formulae 3]

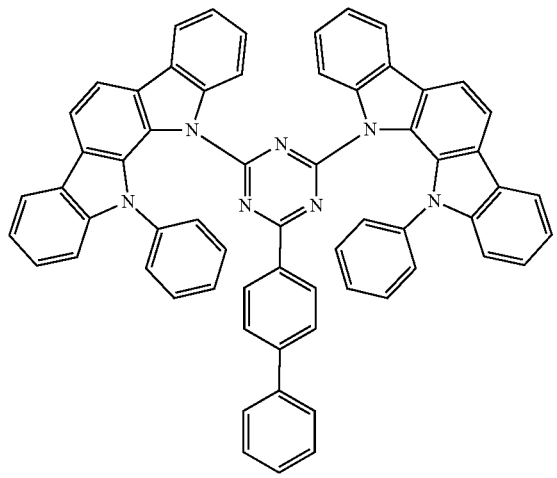

PIC-TRZ

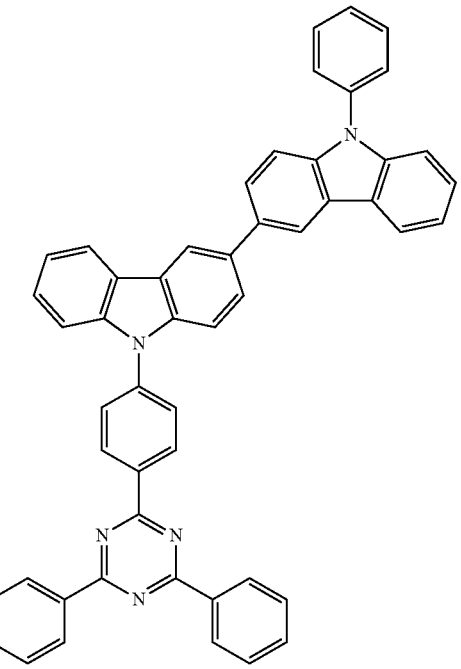

PCCzPTzn

-continued

PXZ-TRZ

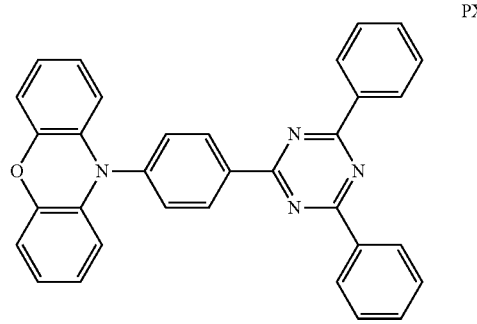

PCCzTzn

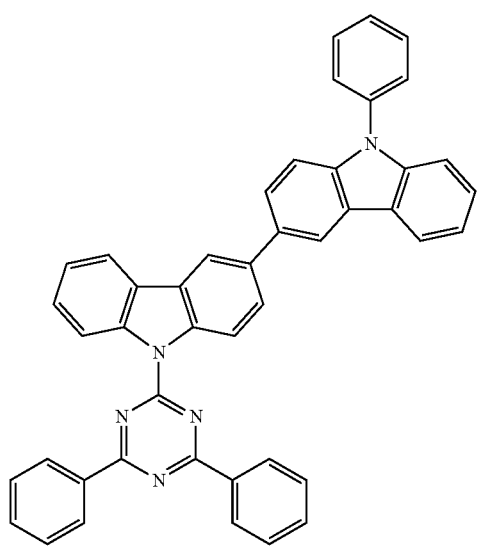

ACRXTN

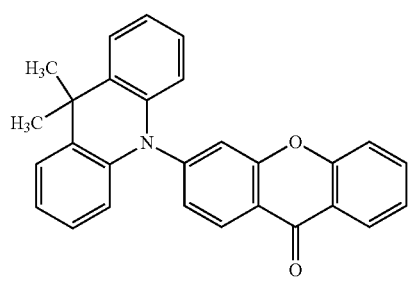

PPZ-3TPT

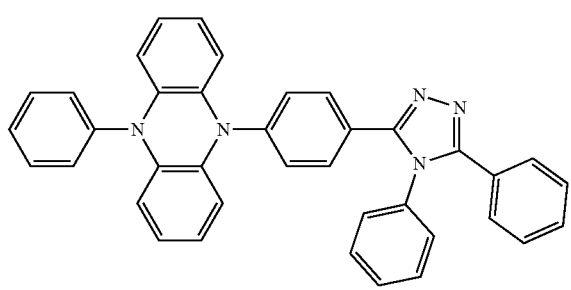

-continued

DMAC-DPS

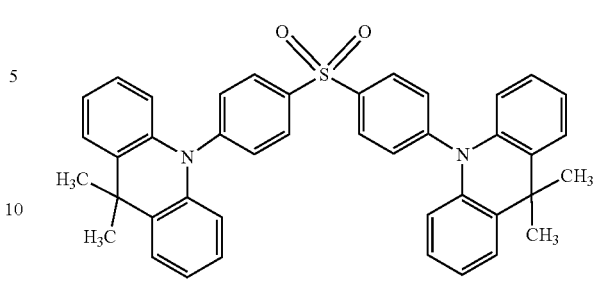

ACRSA

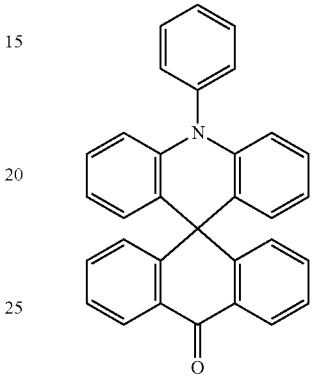

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton or a π-electron rich heteroaromatic ring skeleton, for example. Examples of the material include compounds having an aromatic amine skeleton, such as 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the material having a hole-transport property that is used in the composite material and the material that can be used for the hole-transport layer 112 can also be used.

As the material having an electron-transport property, for example, metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); heterocyclic compounds having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), and 2-{3-[3-(benzo[b]naphtho[1,2-d]furan-6-yl)phenyl]phenyl}-4,6-diphenyl-1,3,5-triazine (abbreviation: mBnfBPTzn-02); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton, the heterocyclic compound having a triazine skeleton, and the heterocyclic compound having a pyridine skeleton have high reliability and thus are preferable. In particular, the heterocyclic compound having a diazine (e.g., pyrimidine or pyrazine) skeleton has a high electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the organic EL device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no 71 bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no 71 bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-PNPAnth). In particular, CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The electron-transport layer 114 contains a substance having an electron-transport property. As the substance having an electron-transport property, it is possible to use any of the above-listed substances having electron-transport properties that can be used as the host material.

Note that the electron-transport layer preferably includes a material having an electron-transport property and an alkali metal, an alkaline earth metal, a compound thereof, or a complex thereof. The electron mobility of the electron-transport layer 114 in the case where the square root of the electric field strength [V/cm] is 600 is preferably higher than or equal to $1 \times 10^{-7}$ cm$^2$/Vs and lower than or equal to $5 \times 10^{-5}$ cm$^2$/Vs. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively deep HOMO level of −5.7 eV or higher and −5.4 eV or lower, in which case a long lifetime can be achieved. In this case, the material having an electron-transport property preferably has a HOMO level of −6.0 eV or higher. The material having an electron-transport property is preferably an organic compound having an anthracene skeleton and further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkaline earth metal, the compound thereof, or the complex thereof have a 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) of the alkali metal, the alkaline earth metal, the compound, or the complex can also be used, for example. There is preferably a difference in the concentration (including 0) of the alkali metal, the alkaline earth metal, the compound thereof, or the complex thereof in the electron-transport layer in the thickness direction.

A layer containing an alkali metal, an alkaline earth metal, or a compound thereof such as lithium fluoride (LiF), cesium fluoride (CsF), calcium fluoride (CaF$_2$), or 8-hydroxyquinolinato-lithium (Liq) may be provided as the electron-injection layer 115 between the electron-transport layer 114 and the cathode 102. An electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer containing a substance that has an electron-transport property (preferably an organic compound having a bipyridine skeleton) and contains a fluoride of the alkali metal or the alkaline earth metal at a concentration higher than that at which the electron-injection layer 115 becomes in a microcrystalline state (50 wt % or higher). Since the layer has a low refractive index, an organic EL device including the layer can have high external quantum efficiency.

Figure 7B:
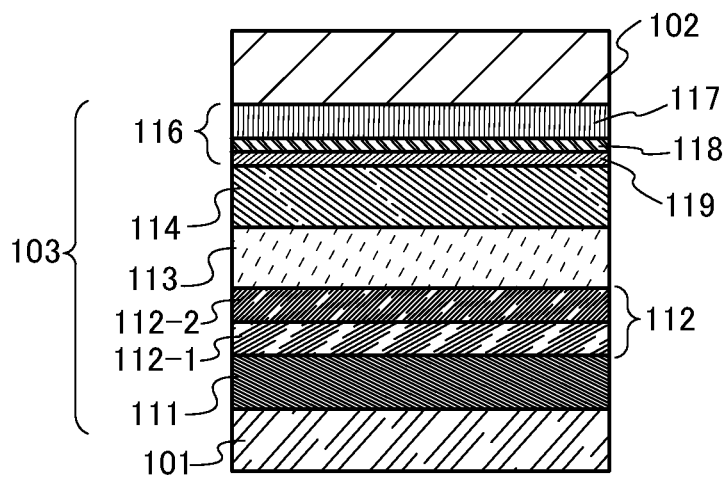

Instead of the electron-injection layer 115, a charge-generation layer 116 may be provided (FIG. 7B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the cathode 102; thus, the organic EL device operates. Since the organic compound of one embodiment of the present invention has a low refractive index, using the organic compound for the p-type layer 117 enables the organic EL device to have high external quantum efficiency.

Note that the charge-generation layer 116 preferably includes an electron-relay layer 118 and/or an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the acceptor substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the cathode 102, a metal, an alloy, an electrically conductive compound, or a mixture thereof each having a low work function (specifically, lower than or equal to 3.8 eV) or the like can be used. Specific examples of such a cathode material include elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the work function. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so as to inhibit quenching due to the proximity of the light-emitting region and a metal used for electrodes or carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of an organic EL device with a structure in which a plurality of light-emitting units are stacked (this type of organic EL device is also referred to as a stacked or tandem device) is described with reference to FIG. 7C. This organic EL device includes a plurality of light-emitting units between an anode and a cathode. One light-emitting unit has substantially the same structure as the EL layer 103 illustrated in FIG. 7A. In other words, the organic EL device illustrated in FIG. 7A or 7B includes a single light-emitting unit, and the organic EL device illustrated in FIG. 7C includes a plurality of light-emitting units.

Figure 7C:
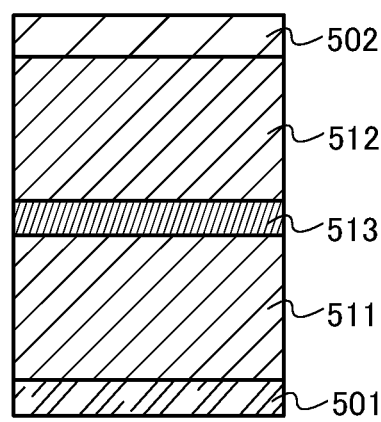

In FIG. 7C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 illustrated in FIG. 7A, and the materials given in the description for FIG. 7A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when voltage is applied between the anode 501 and the cathode 502. That is, in FIG. 7C, the charge-generation layer 513 injects electrons into the first light-emitting unit 511 and holes into the second light-emitting unit 512 when voltage is applied such that the potential of the anode becomes higher than the potential of the cathode.

The charge-generation layer 513 preferably has a structure similar to that of the charge-generation layer 116 described with reference to FIG. 7B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side; thus, an electron-injection layer is not necessarily formed in the light-emitting unit on the anode side.

The organic EL device having two light-emitting units is described with reference to FIG. 7C; however, one embodiment of the present invention can also be applied to an organic EL device in which three or more light-emitting units are stacked. With a plurality of light-emitting units partitioned by the charge-generation layer 513 between a pair of electrodes as in the organic EL device of this embodiment, it is possible to provide a long-life element that can emit light with high luminance at a low current density. A light-emitting apparatus that can be driven at a low voltage and has low power consumption can be provided.

When the emission colors of the light-emitting units are different, light emission of a desired color can be obtained from the organic EL device as a whole. For example, in an organic EL device having two light-emitting units, the emission colors of the first light-emitting unit may be red and green and the emission color of the second light-emitting unit may be blue, so that the organic EL device can emit white light as the whole.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Embodiment 3

In this embodiment, a light-emitting apparatus including the organic EL device described in Embodiments 1 and 2 will be described.

In this embodiment, the light-emitting apparatus manufactured using the organic EL device described in Embodiments 1 and 2 is described with reference to FIGS. 8A and 8B. Note that FIG. 8A is a top view of the light-emitting apparatus and FIG. 8B is a cross-sectional view taken along the lines A-B and C-D in FIG. 8A. This light-emitting apparatus includes a driver circuit portion (source line driver circuit) 601, a pixel portion 602, and a driver circuit portion (gate line driver circuit) 603, which are to control light emission of an organic EL device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 8B. The driver circuit portions and the pixel portion are formed over an element substrate 610; here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastics (FRP), poly(vinyl fluoride) (PVF), polyester, an acrylic resin, or the like.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside.

The pixel portion 602 includes a plurality of pixels each including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve coverage with an EL layer or the like which is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an ink-jet method, and a spin coating method. The EL layer 616 has the structure described in Embodiments 1 and 2. In the case where the EL layer 616 is formed from the first electrode 613 side and the first electrode 613 is an anode, the first hole-transport layer 112-1 and the second hole-transport layer 112-2 are formed in this order, and the anode, the first hole-transport layer, the second hole-transport layer, and the cathode are positioned in this order from the substrate side. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the organic EL device is formed with the first electrode 613, the EL layer 616, and the second electrode 617. The organic EL device is the organic EL device described in Embodiments 1 and 2. In the light-emitting apparatus of this embodiment, the pixel portion, which includes a plurality of organic EL devices, may include both the organic EL device described in Embodiments 1 and 2 and an organic EL device having a different structure.

The sealing substrate 604 is attached to the element substrate 610 with the sealing material 605, so that an organic EL device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material not be permeable to moisture or oxygen as much as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 8A and 8B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be formed by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus manufactured using the organic EL device described in Embodiments 1 and 2 can be obtained.

The light-emitting apparatus in this embodiment is manufactured using the organic EL device described in Embodiments 1 and 2 and thus can have favorable characteristics. Specifically, since the organic EL device described in Embodiments 1 and 2 has low driving voltage, the light-emitting apparatus can achieve low power consumption.

FIGS. 9A and 9B each illustrate an example of a light-emitting apparatus in which full color display is achieved by formation of an organic EL device exhibiting white light emission and with the use of coloring layers (color filters) and the like. In FIG. 9A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of organic EL devices, a partition 1025, an EL layer 1028, a second electrode 1029 of the organic EL devices, a sealing substrate 1031, a sealing material 1032, and the like are illustrated.

In FIG. 9A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 9A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, green, or blue, an image can be displayed using pixels of the four colors.

FIG. 9B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 10:
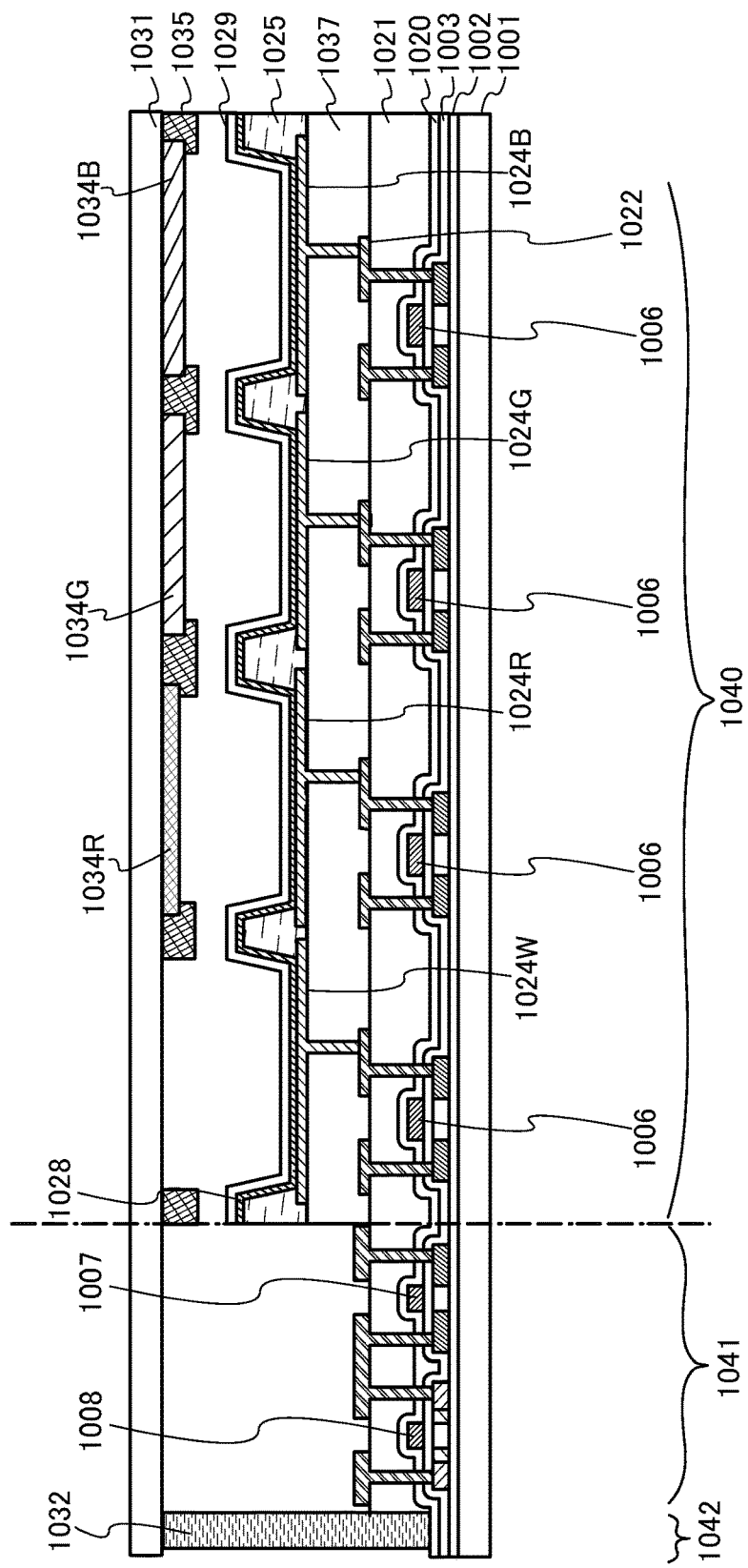
FIG. 10 illustrates an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (a top emission structure). FIG. 10 is a cross-sectional view of a light-emitting apparatus having a top emission structure. In this case, a substrate that does not transmit light can be used as the substrate 1001. The process up to the step of forming a connection electrode that connects the FET and the anode of the organic EL device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024W, 1024R, 1024G, and 1024B of the organic EL devices each serve as an anode here, but may serve as a cathode. Furthermore, in the case of a light-emitting apparatus having atop emission structure as illustrated in FIG. 10, the first electrodes are preferably reflective electrodes. The EL layer 1028 is formed to have a structure similar to the structure of the EL layer 103, which is described in Embodiments 1 and 2, with which white light emission can be obtained.

In the case of a top emission structure as illustrated in FIG. 10, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be suitably employed. An organic EL device with a microcavity structure is formed with the use of a reflective electrode as the first electrode and a transflective electrode as the second electrode. The organic EL device with a microcavity structure includes at least an EL layer between the reflective electrode and the transflective electrode, which includes at least a light-emitting layer serving as a light-emitting region.

Note that the reflective electrode has a visible light reflectivity of 40% to 100%, preferably 70% to 100%, and a resistivity of $1\times10^{-2}$ $\Omega$ cm or lower. In addition, the transfective electrode has a visible light reflectivity of 20% to 80%, preferably 40% to 70%, and a resistivity of $1\times10^{-2}$ $\Omega$cm or lower.

Light emitted from the light-emitting layer included in the EL layer is reflected and resonated by the reflective electrode and the transflective electrode.

In the organic EL device, by changing thicknesses of the transparent conductive film, the composite material, the carrier-transport material, and the like, the optical path length between the reflective electrode and the transfective electrode can be changed. Thus, light with a wavelength that is resonated between the reflective electrode and the transfective electrode can be intensified while light with a wavelength that is not resonated therebetween can be attenuated.

Note that light that is reflected back by the reflective electrode (first reflected light) considerably interferes with light that directly enters the transfective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem organic EL device described above may be combined with a plurality of EL layers; for example, an organic EL device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus which displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the organic EL device described in Embodiments 1 and 2 and thus can have favorable characteristics. Specifically, since the organic EL device described in Embodiments 1 and 2 has low driving voltage, the light-emitting apparatus can achieve low power consumption.

Figure 11A:
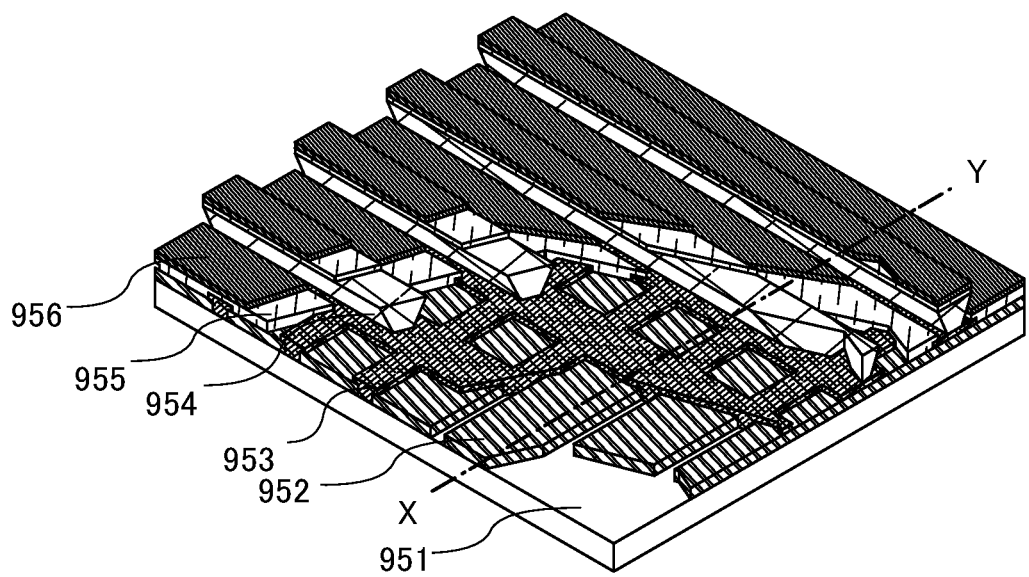
FIGS. 11A and 11B illustrate a passive matrix light-emitting apparatus.
Figure 11B:
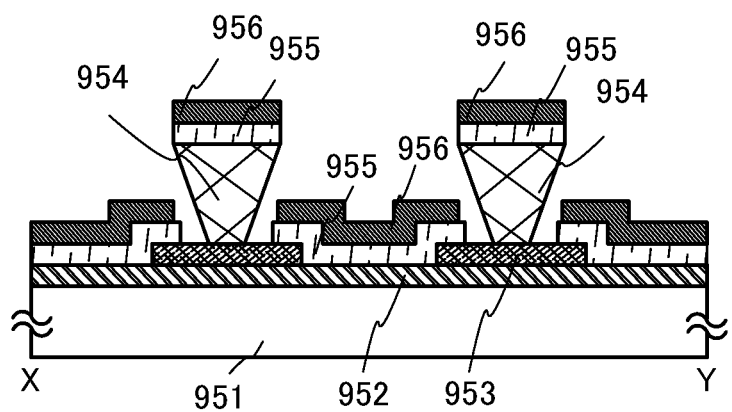

An active matrix light-emitting apparatus is described above, whereas a passive matrix light-emitting apparatus is described below. FIGS. 11A and 11B illustrate a passive matrix light-emitting apparatus manufactured using the present invention. Note that FIG. 11A is a perspective view of the light-emitting apparatus, and FIG. 11B is a cross-sectional view taken along the line X-Y in FIG. 11A. In FIGS. 11A and 11B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 provided in this manner can prevent defects in the organic EL device due to static electricity or others. The passive matrix light-emitting apparatus also includes the organic EL device described in Embodiments 1 and 2; thus, the light-emitting apparatus can have low power consumption.

Since many minute organic EL devices arranged in a matrix in the light-emitting apparatus described above can each be controlled, the light-emitting apparatus can be suitably used as a display device for displaying images.

This embodiment can be freely combined with any of the other embodiments.

Embodiment 4

In this embodiment, a structure of a light-emitting apparatus 700 and a method for manufacturing the light-emitting apparatus 700 will be described.

Figure 51A:
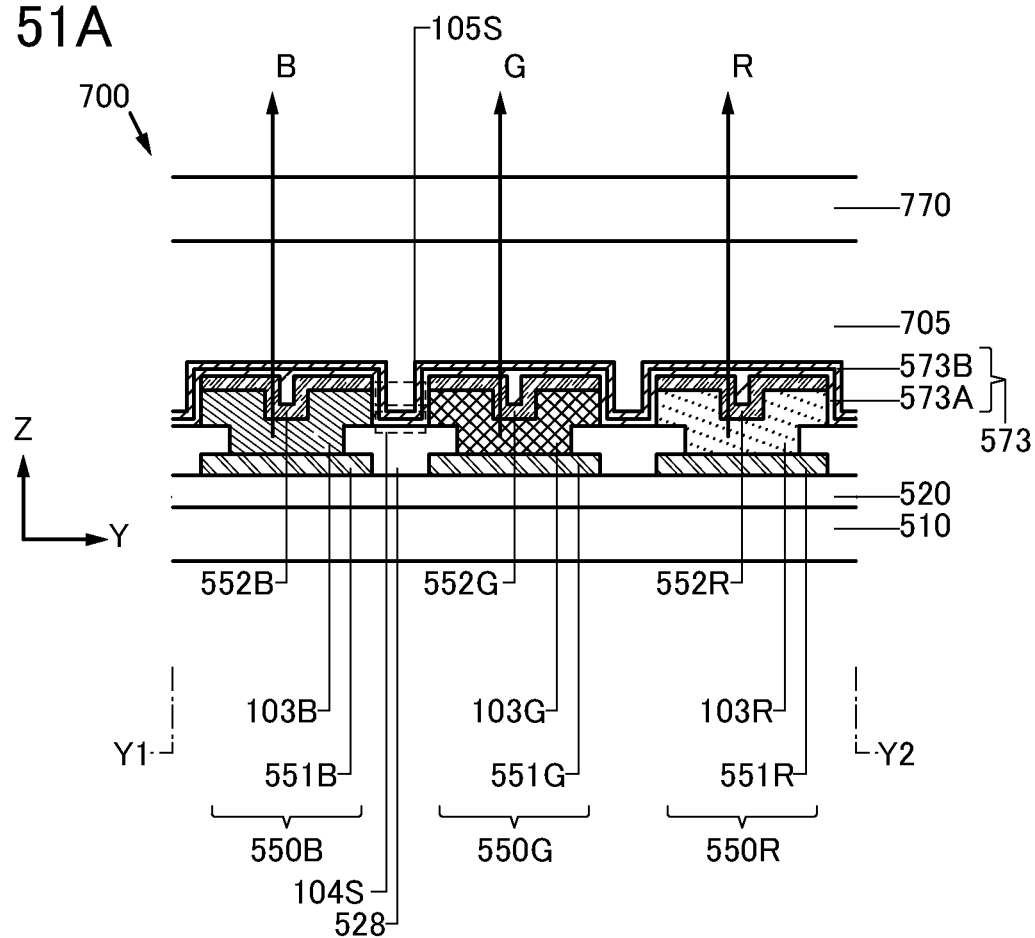
FIGS. 51A and 51B illustrate a display device of one embodiment of the present invention.

The light-emitting apparatus 700 described in this embodiment includes a light-emitting device 550B, a light-emitting device 550G, a light-emitting device 550R, and a partition wall 528 (see FIG. 51A).

The light-emitting device 550B, the light-emitting device 550G, the light-emitting device 550R, and the partition wall 528 are formed over a functional layer 520 provided over a base 510, for example. An element for driving the light-emitting devices, such as a transistor, may be provided in the functional layer 520. The light-emitting device 550B, the light-emitting device 550G, the light-emitting device 550R, and the partition wall 528 overlap with a base 770 with an insulating layer 705 positioned therebetween. The insulating layer 705 has a function of fixing the base 770.

The light-emitting device 550B includes an electrode 551B, an electrode 552B, and an EL layer 103B. The electrode 552B overlaps with the electrode 551B.

The EL layer 103B includes a region positioned between the electrode 551B and the electrode 552B. The EL layer 103B has a structure similar to that of the EL layer 103 described in Embodiment 2 or an EL layer 503. The EL layer 103B can emit blue light, for example.

The light-emitting device 550G includes an electrode 551G, an electrode 552G, and an EL layer 103G. The electrode 552G overlaps with the electrode 551G.

The EL layer 103G includes a region positioned between the electrode 551G and the electrode 552G. The EL layer 103G has a structure similar to that of the EL layer 103 described in Embodiment 2 or the EL layer 503. The EL layer 103G can emit green light, for example.

When electrical conduction is established between the EL layer 103B and the EL layer 103G in a display panel with a high resolution exceeding 1000 ppi, a crosstalk phenomenon narrows a color gamut that can be expressed by the display panel. Providing a space 104S in a display panel with a high resolution exceeding 1000 ppi, preferably exceeding 2000 ppi, or further preferably in a display panel with an ultrahigh resolution exceeding 5000 ppi enables the display panel to exhibit bright colors.

Thus, holes can be supplied from the anode side to the cathode side. Since the EL layer 103G of the light-emitting device 550G is separated from the EL layer 103B of the light-emitting device 550B, a crosstalk phenomenon can be inhibited. As a result, a novel display panel that is highly convenient, useful, or reliable can be provided.

Figure 51B:
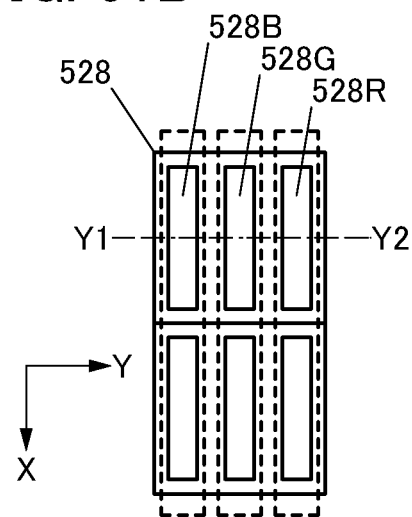

The partition wall 528 includes an opening 528R, an opening 528B, and an opening 528G (see FIG. 51B). The opening 528B overlaps with the electrode 551B, and the opening 528G overlaps with the electrode 551G.

The partition wall 528 overlaps with a space 105S between the opening 528B and the opening 528G (see FIG. 51B).

The partition wall 528 overlaps with the space 104S between the opening 528B and the opening 528G.

An inorganic material, an organic material, a composite material of an inorganic material and an organic material, or the like can be used for the partition wall 528. Specifically, an inorganic oxide film, an inorganic nitride film, an inorganic oxynitride film, and the like, or a layered material obtained by stacking some of these films can be used for the partition wall 528. For example, a silicon oxide film, a film containing an acrylic resin, a film containing polyimide, or the like can be used as the partition wall 528.

The light-emitting device 550R includes an electrode 551R, an electrode 552R, and an EL layer 103R.

The EL layer 103R includes a region positioned between the electrode 551R and the electrode 552R. The EL layer 103R has a structure similar to that of the EL layer 103 described in Embodiment 2 or the EL layer 503. The EL layer 103R can emit red light, for example.

For example, a blue light-emitting material can be used for the EL layer 103B, a green light-emitting material can be used for the EL layer 103G, and a red light-emitting material can be used for the EL layer 103R. This can increase the emission efficiency of each of the light-emitting devices. In addition, light emitted from each of the light-emitting devices can be efficiently utilized.

Accordingly, a crosstalk phenomenon between the first light-emitting device 550B and the second light-emitting device 550G can be inhibited. As a result, a novel display panel that is highly convenient, useful, or reliable can be provided.

The electrode 552B is positioned between an insulating film 573 and the electrode 551B, and the electrode 552G is positioned between the insulating film 573 and the electrode 551G (see FIG. 51A).

For example, a stacked film of an insulating film 573A and an insulating film 573B can be used as the insulating film 573.

For the insulating film 573, aluminum oxide, magnesium oxide, hafnium oxide, gallium oxide, indium gallium zinc oxide, silicon nitride, silicon nitride oxide, or the like can be used, for example.

Diffusion of impurities around the light-emitting device 550B into the light-emitting device 550B can be inhibited. In addition, diffusion of impurities around the light-emitting device 550G into the light-emitting device 550G can be inhibited. As a result, a novel display panel that is highly convenient, useful, or reliable can be provided.

<Manufacturing Method Example of Display Device>

The display device described in this embodiment can be manufactured as follows.

Figure 52A:
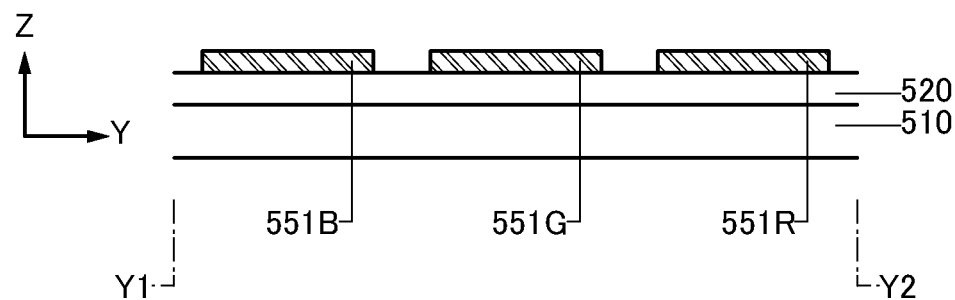
FIGS. 52A and 52B illustrate an example of a method for manufacturing a display device of one embodiment of the present invention.

First, the electrode 551B, the electrode 551G, and the electrode 551R are formed. For example, a conductive film is formed over the base 510 and processed into a predetermined shape by a photolithography method (see FIG. 52A).

Figure 52B:
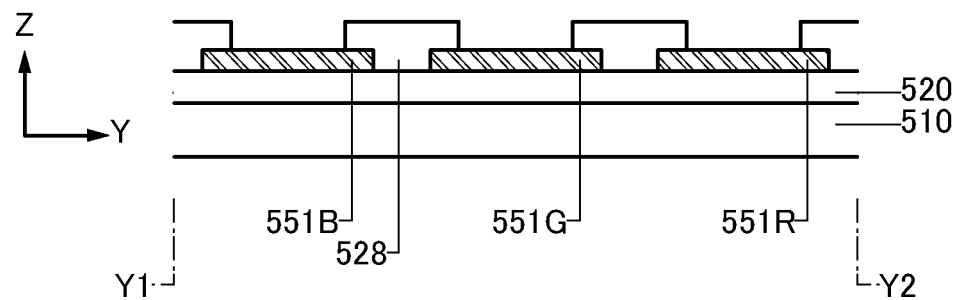

Next, the partition wall 528 is formed between the electrode 551B and the electrode 551G. For example, an insulating film covering the electrodes 551B, 551G, and 551R is formed, and openings are formed by a photolithography method to partly expose the electrodes 551B, 551G, and 551R (see FIG. 52B).

The EL layer 103B is formed over the electrode 551B and the electrode 551G. For example, the EL layer 103B is formed by a vacuum evaporation method over the electrode 551B, the electrode 551G, and the electrode 551R to cover these electrodes.

Figure 53A:
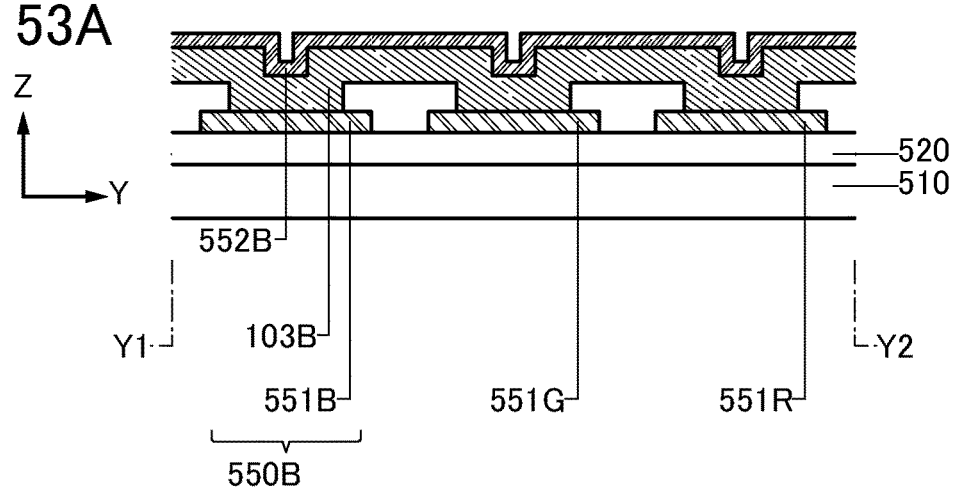
FIGS. 53A to 53C illustrate an example of a method for manufacturing a display device of one embodiment of the present invention.

Next, the electrode 552B is formed over the EL layer 103B. For example, the electrode 552B is formed by a vacuum evaporation method (see FIG. 53A).

Figure 53B:
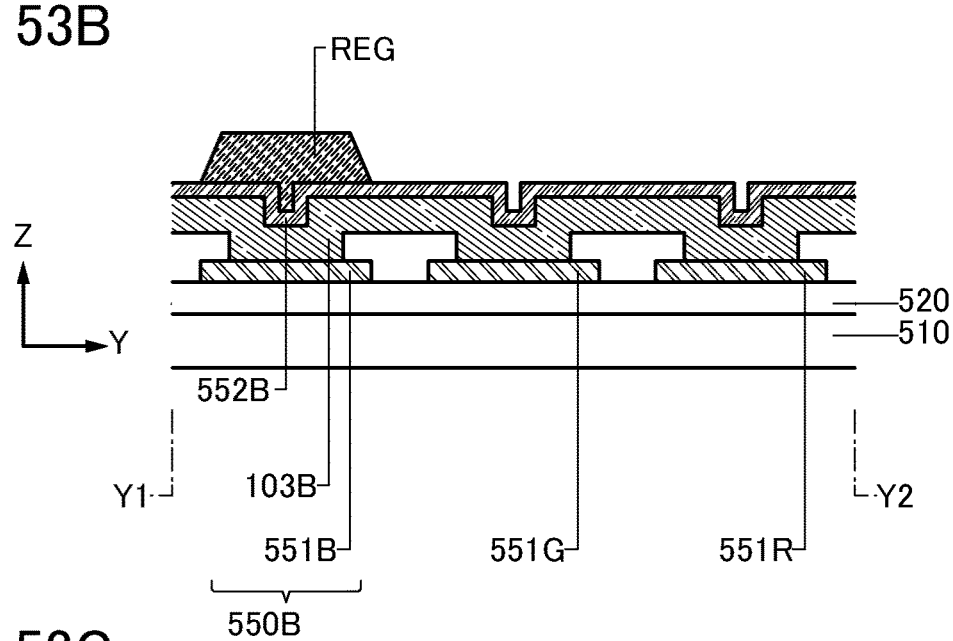
Figure 53C:
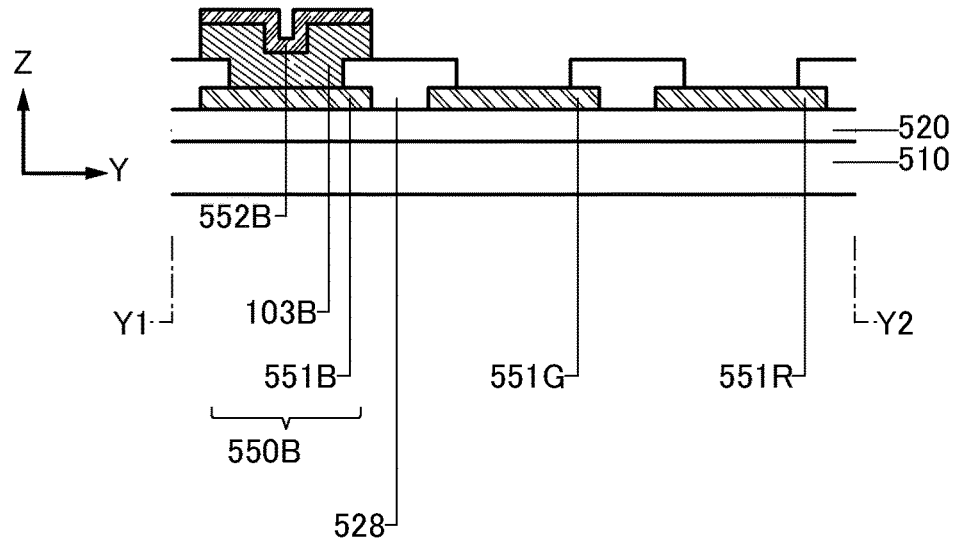

After that, the EL layer 103B and the electrode 552B are processed into predetermined shapes (see FIG. 53C). For example, the EL layer 103B and the electrode 552B over the electrode 551G are removed by a photoetching method to process them into a belt-like shape extending in a direction intersecting with the horizontal direction of the figure, so that the first light-emitting device 550B is formed.

Specifically, a resist REG formed over the electrode 552B is used (see FIG. 53B). Moreover, the partition wall 528 can be used as an etching stopper.

The EL layer 103B and the electrode 552B are processed by a photoetching method in this manner, so that a high-resolution display device can be manufactured. In the light-emitting device in which the EL layer 103B is processed by a photoetching method, end portions of the EL layer 103B are positioned on the same plane. That is, end faces of each functional layer included in the EL layer 103B are positioned on substantially the same plane. In particular, a hole-injection layer included in a hole-transport region between an anode and a light-emitting layer often has high conductivity and thus sometimes causes crosstalk. Processing by a photoetching method enables the light-emitting devices to be separated from each other, which can inhibit generation of crosstalk. The light-emitting layer and the hole-transport region are processed by photoetching at the same time; thus, their end faces are positioned on substantially the same plane as described above.

Next, the EL layer 103G is formed over the electrode 552B and the electrode 551G. For example, the EL layer 103G is formed by a vacuum evaporation method over the electrode 551G and the electrode 551R to cover these electrodes.

Figure 54A:
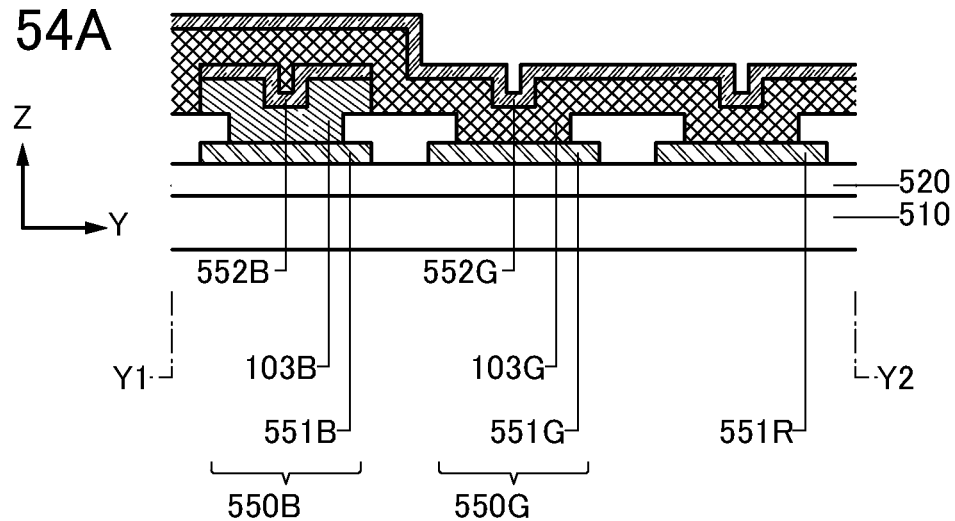
FIGS. 54A to 54C illustrate an example of a method for manufacturing a display device of one embodiment of the present invention.

After that, the electrode 552G is formed over the EL layer 103G. For example, the electrode 552G is formed by a vacuum evaporation method (see FIG. 54A).

Figure 54B:
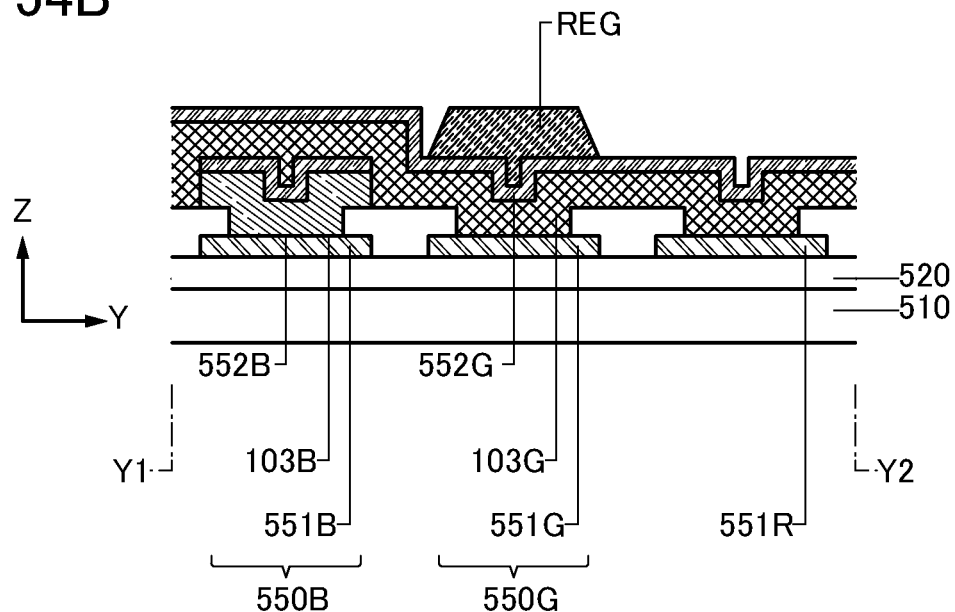
Figure 54C:
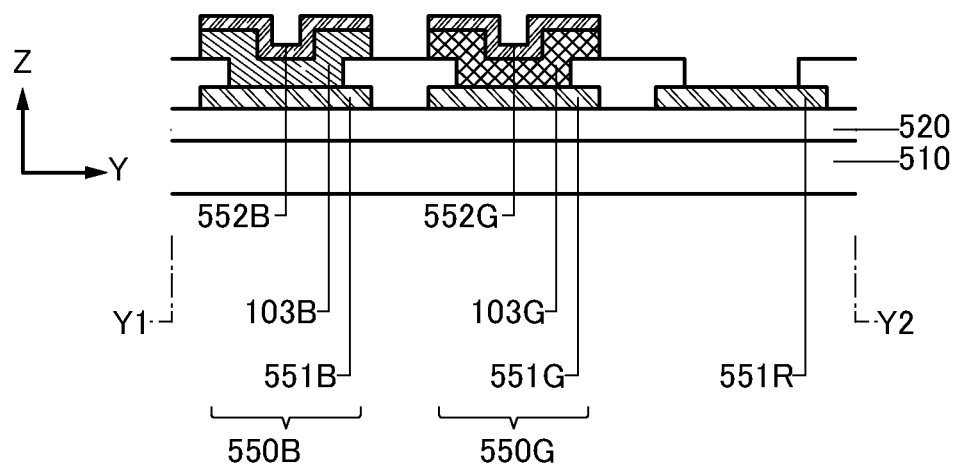

Then, the EL layer 103G and the electrode 552G are processed into predetermined shapes (see FIG. 54C). For example, the EL layer 103G and the electrode 552G over the electrode 552B are removed by a photoetching method to process them into a belt-like shape extending in a direction intersecting with the horizontal direction of the figure so as to be separated from the light-emitting device 550B. Thus, the second light-emitting device 550G can be formed.

Specifically, the resist REG formed over the electrode 552B is used (see FIG. 54B). Moreover, the partition wall 528 can be used as an etching stopper.

The EL layer 103G and the electrode 552G are processed by a photoetching method in this manner, so that a high-resolution display device can be manufactured. In the light-emitting device in which the EL layer 103G is processed by a photoetching method, end portions of the EL layer 103G are positioned on the same plane. That is, end faces of each functional layer included in the EL layer 103G are positioned on substantially the same plane. In particular, a hole-injection layer included in a hole-transport region between an anode and a light-emitting layer often has high conductivity and thus sometimes causes crosstalk. Processing by a photoetching method enables the light-emitting devices to be separated from each other, which can inhibit generation of crosstalk. The light-emitting layer and the hole-transport region are processed by photoetching at the same time; thus, their end faces are positioned on substantially the same plane as described above.

Figure 55A:
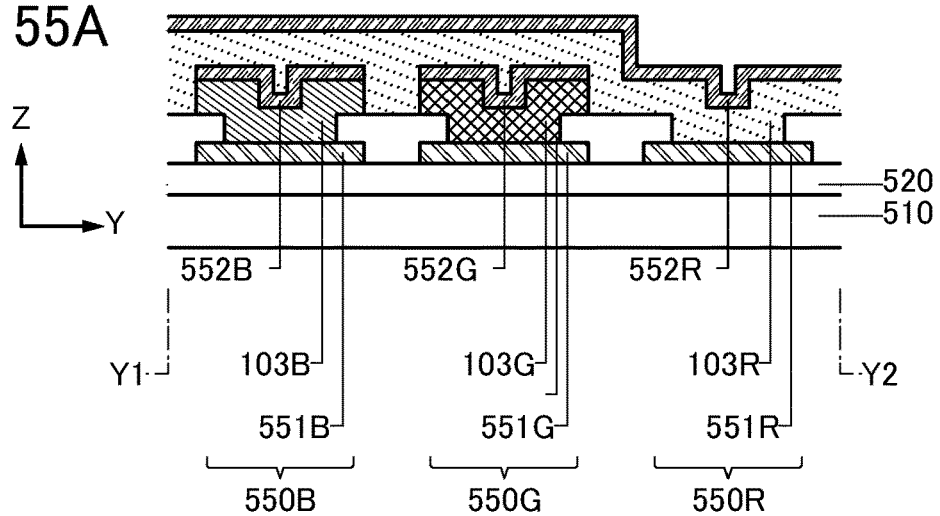
FIGS. 55A to 55C illustrate an example of a method for manufacturing a display device of one embodiment of the present invention.

Next, the EL layer 103R and the electrode 552R are formed in this order. For example, the EL layer 103R and the electrode 552R are formed to cover the electrode 551R by a vacuum evaporation method (see FIG. 55A).

Figure 55B:
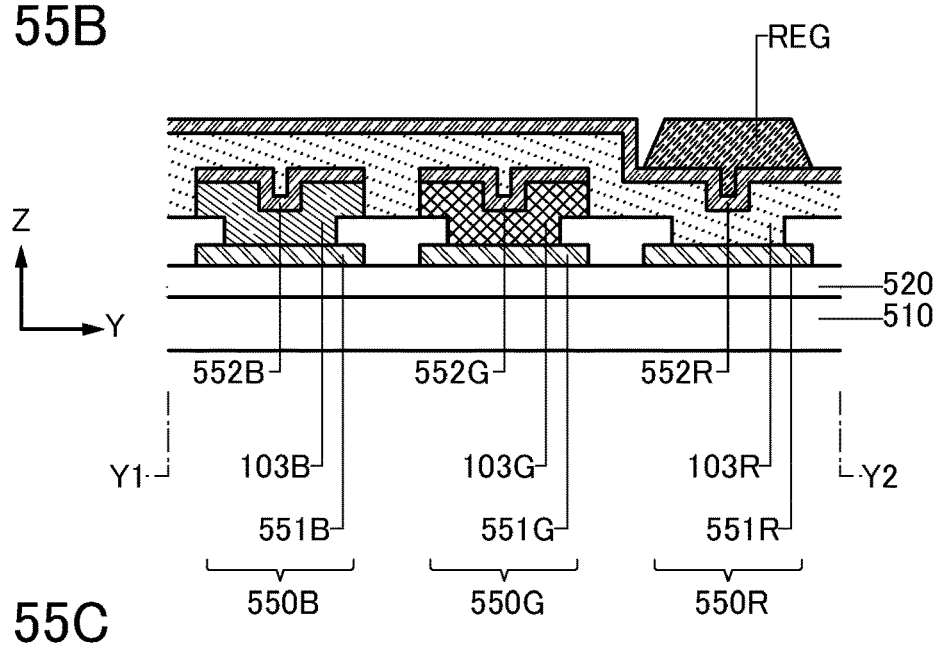
Figure 55C:
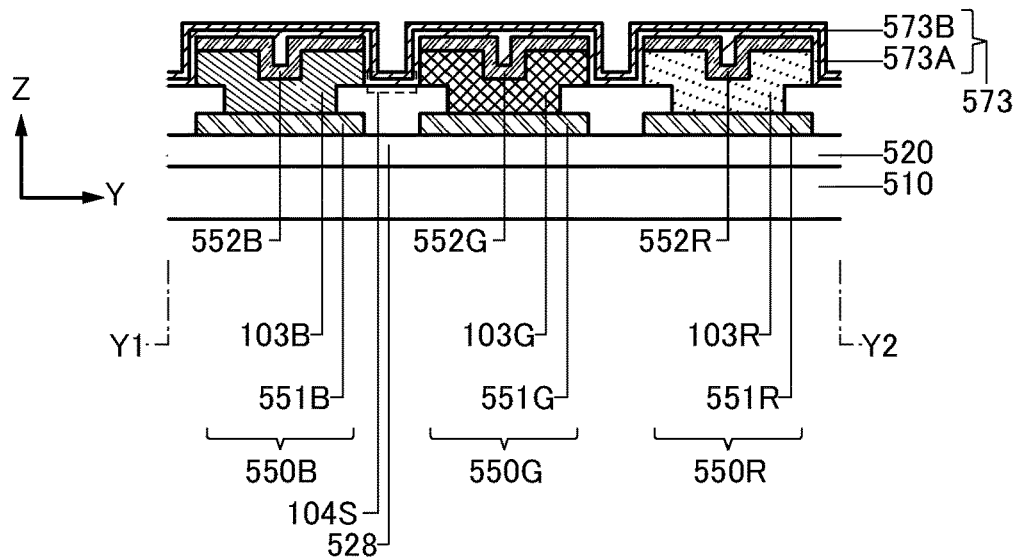

After that, the EL layer 103R and the electrode 552R are processed into predetermined shapes (see FIG. 55C). For example, the EL layer 103R and the electrode 552R are processed into a belt-like shape extending in a direction intersecting with the horizontal direction of the figure.

Specifically, the resist REG formed over the electrode 552R and an etching method are used (see FIG. 55B). Moreover, the electrode 552B, the electrode 552G, and the partition wall 528 can be used as etching stoppers.

Through the above steps, the light-emitting device 550B, the light-emitting device 550G, and the light-emitting device 550R can be formed separately from each other.

The EL layer 103R and the electrode 552R are processed by a photoetching method in this manner, so that a high-resolution display device can be manufactured. In the light-emitting device in which the EL layer 103R is processed by a photoetching method, end portions of the EL layer 103R are positioned on the same plane. That is, end faces of each functional layer included in the EL layer 103R are positioned on substantially the same plane. In particular, a hole-injection layer included in a hole-transport region between an anode and a light-emitting layer often has high conductivity and thus sometimes causes crosstalk. Processing by a photoetching method enables the light-emitting devices to be separated from each other, which can inhibit generation of crosstalk. The light-emitting layer and the hole-transport region are processed by photoetching at the same time; thus, their end faces are positioned on substantially the same plane as described above.

After that, the insulating film 573 in contact with the partition wall 528 is formed to cover the light-emitting device 550G and the light-emitting device 550B. Through the above steps, the light-emitting device 550G and the light-emitting device 550B can be protected by the insulating film 573 (see FIG. 55C).

Figure 56:
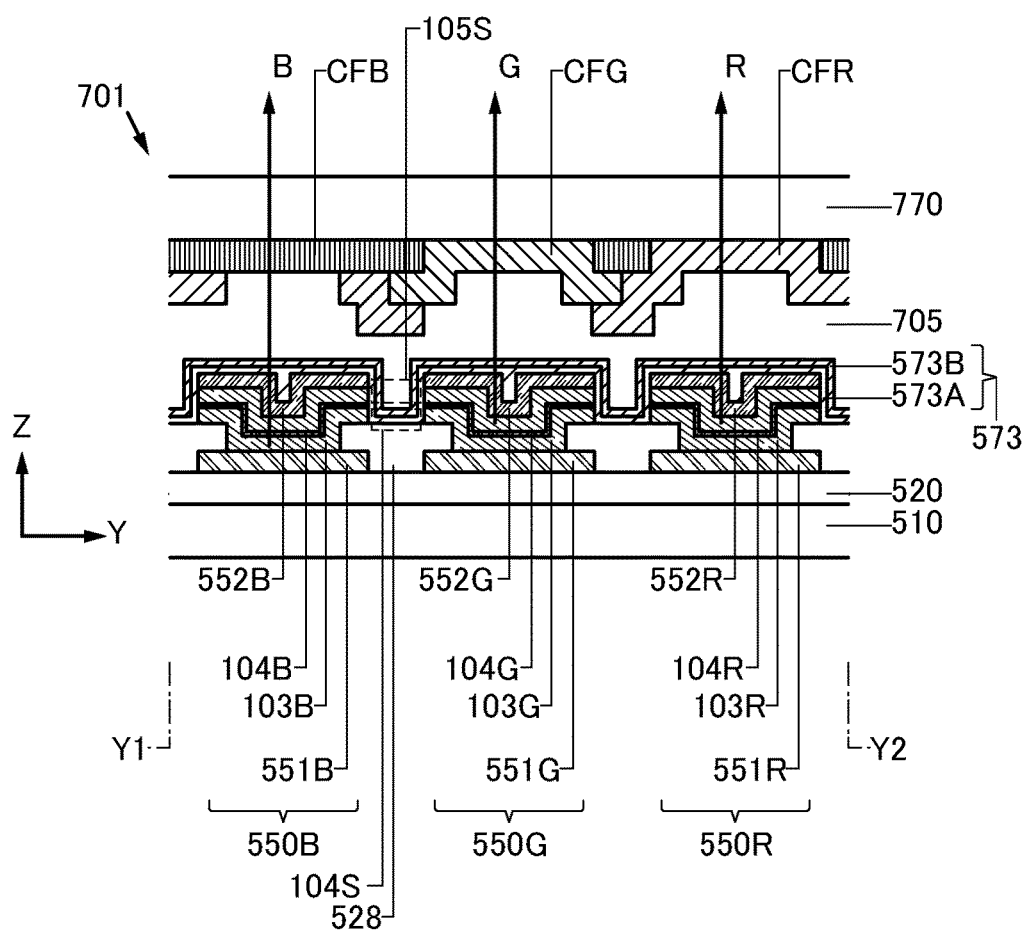
FIG. 56 illustrates a display device of one embodiment of the present invention.

As illustrated in FIG. 56, the EL layer 103B, the EL layer 103G, and the EL layer 103R may have tandem structures respectively including a charge-generation layer 104B, a charge-generation layer 104G, and a charge-generation layer 104R. When the EL layers each have a tandem structure to obtain white light emission, the EL layer 103B, the EL layer 103G, and the EL layer 103R can have the same structure, which enables the light-emitting devices to be formed by photoetching performed once in a manufacturing process of the light-emitting devices after formation of the anode. Since white light emission is obtained, light is extracted from the light-emitting device 550B, the light-emitting device 550G, and the light-emitting device 550R through a blue color filter CFB, a green color filter CFG, and a red color filter CFR, respectively, so that light of blue, green, and red can be obtained.

Figure 57:
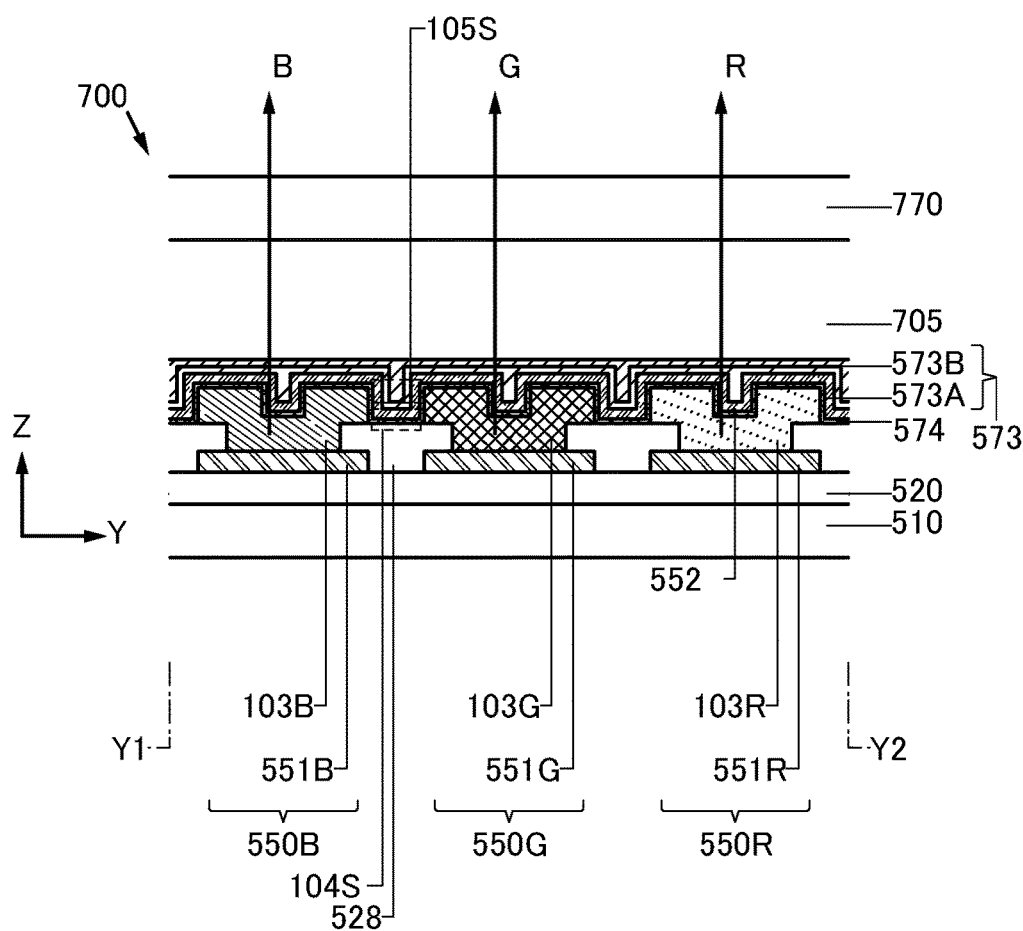
FIG. 57 illustrates a display device of one embodiment of the present invention.
Figure 58:
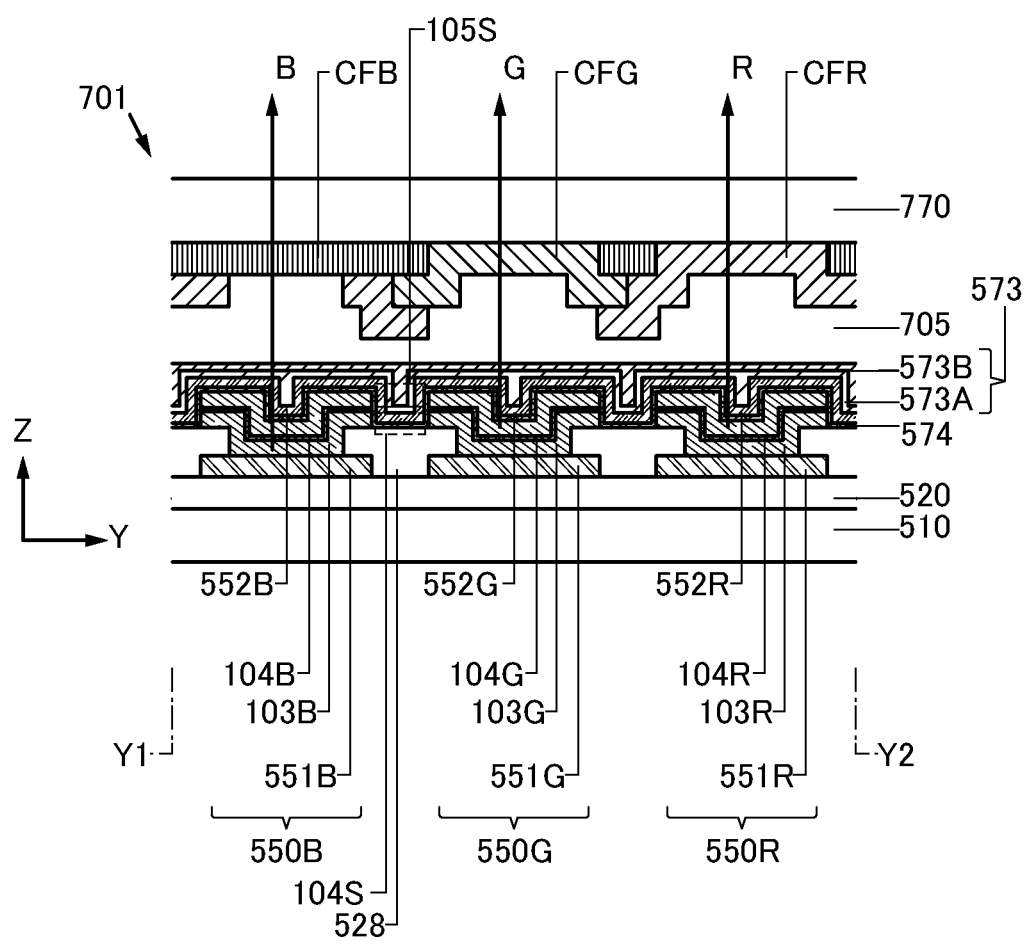
FIG. 58 illustrates a display device of one embodiment of the present invention.

The light-emitting apparatus 700 and a light-emitting apparatus 701 illustrated in FIGS. 55A to 55C and FIG. 56 may have structures illustrated in FIG. 57 and FIG. 58, respectively. In the light-emitting apparatuses 700 and 701 illustrated in FIG. 57 and FIG. 58, the EL layers are etched before the formation of the electrodes 552R, 552G, and 552B serving as the cathodes in FIGS. 55A to 55C and FIG. 56, and lastly, a short circuit prevention layer 574, an electron-transport organic compound, and the electrode 552 are formed. Accordingly, the number of manufacturing steps can be smaller than the light-emitting apparatuses 700 and 701 illustrated in FIGS. 55A to 55C and FIG. 56.

Figure 59:
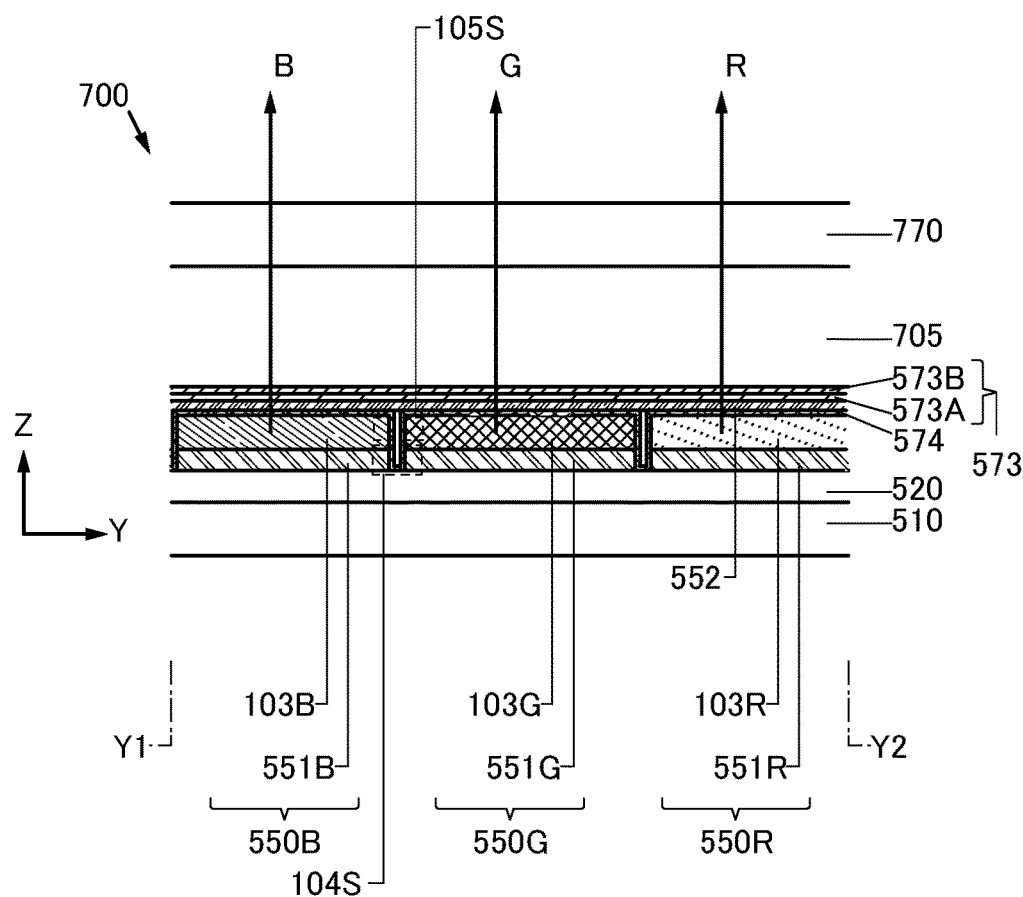
FIG. 59 illustrates a display device of one embodiment of the present invention.
Figure 60:
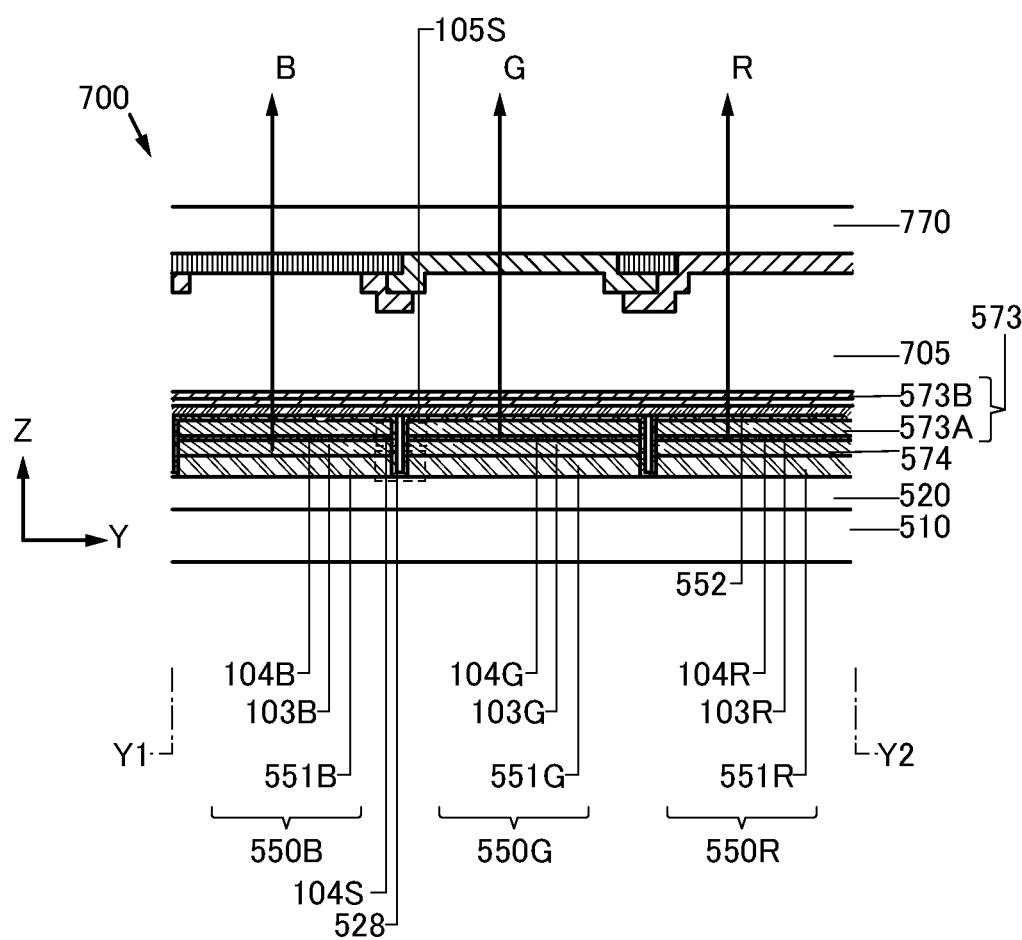
FIG. 60 illustrates a display device of one embodiment of the present invention.

The light-emitting apparatuses 700 and 701 illustrated in FIG. 57 and FIG. 58 may have structures illustrated in FIG. 59 and FIG. 60, respectively. In the light-emitting apparatus 700 illustrated in each of FIG. 59 and FIG. 60, the partition wall 528 in FIG. 57 and FIG. 58 is not formed, and the electrode 551R, the electrode 551G, and the electrode 551B are etched at the same time as the EL layer 103. This can further narrow the spaces 104S and 105S, which facilitates the manufacture of an ultra-high-resolution light-emitting apparatus.

Embodiment 5

Figure 12A:
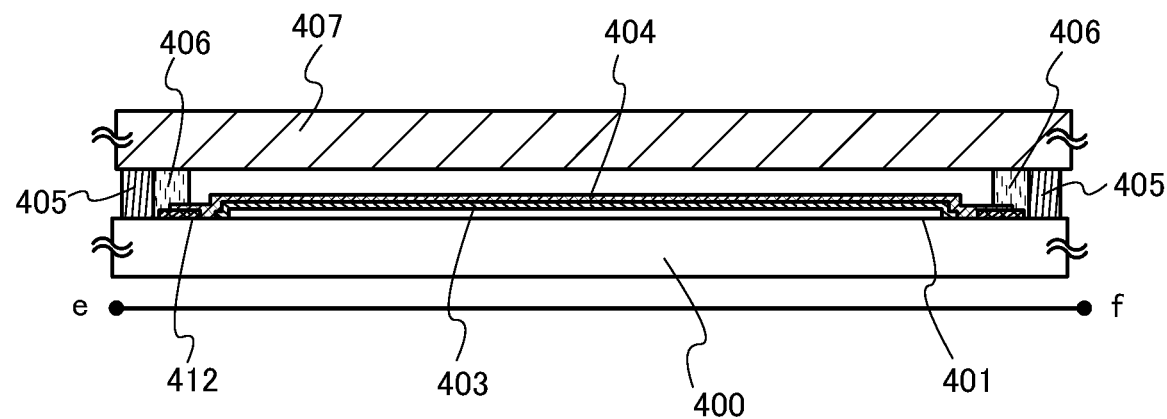
FIGS. 12A and 12B illustrate a lighting device.
Figure 12B:
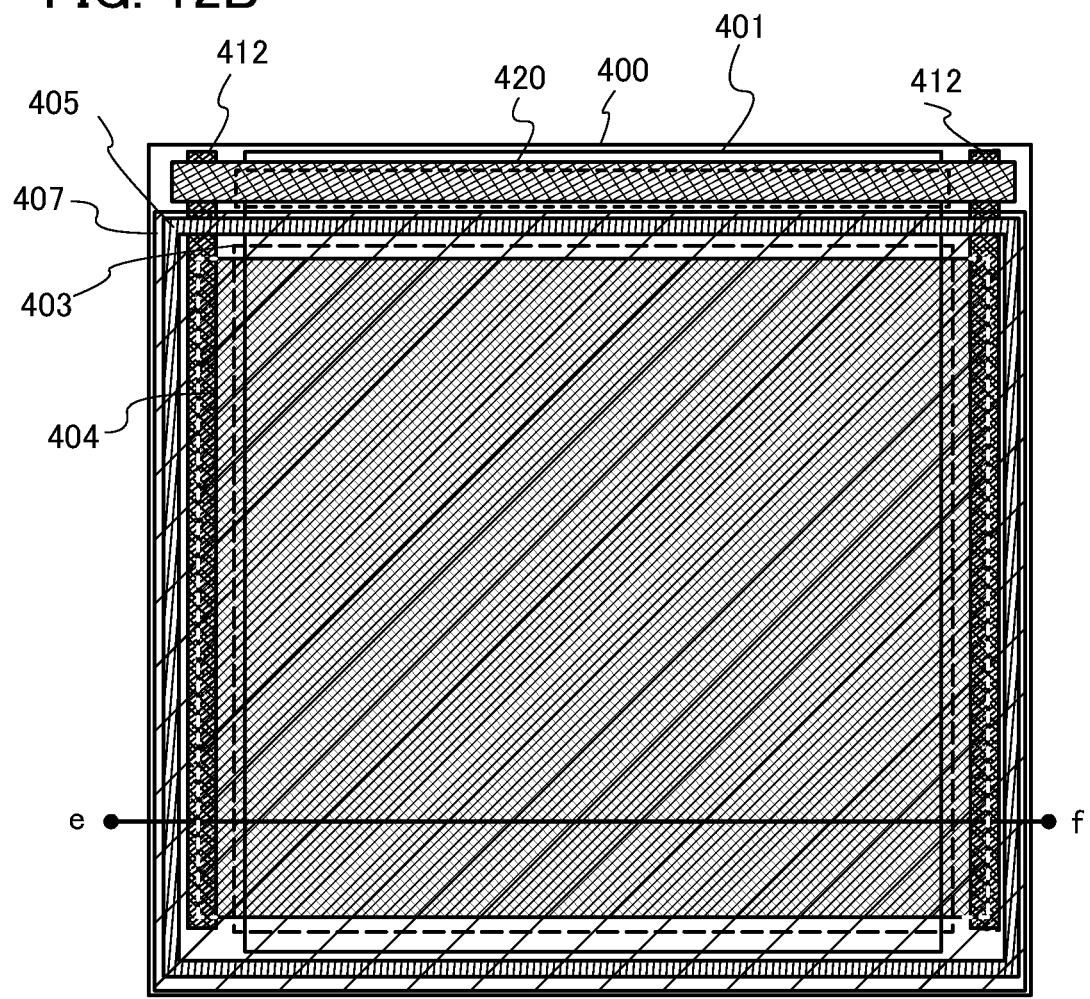

In this embodiment, an example in which the organic EL device described in Embodiments 1 and 2 is used for a lighting device will be described with reference to FIGS. 12A and 12B. FIG. 12B is a top view of the lighting device, and FIG. 12A is a cross-sectional view taken along the line e-f in FIG. 12B.

In the lighting device in this embodiment, a first electrode 401 is formed over a substrate 400 which is a support and has a light-transmitting property. The first electrode 401 corresponds to the anode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. Refer to the description for the structures.

The second electrode 404 is formed to cover the EL layer 403. The second electrode 404 corresponds to the cathode 102 in Embodiment 1. The second electrode 404 is formed using a material having high reflectance when light is extracted through the first electrode 401 side. The second electrode 404 is connected to the pad 412, whereby voltage is applied.

As described above, the lighting device described in this embodiment includes a light-emitting device including the first electrode 401, the EL layer 403, and the second electrode 404. Since the light-emitting device is an organic EL device with low driving voltage, the lighting device in this embodiment can have low power consumption.

The substrate 400 provided with the organic EL device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not illustrated in FIG. 12B) can be mixed with a desiccant that enables moisture to be adsorbed, which increases reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the organic EL device described in Embodiments 1 and 2; thus, the light-emitting apparatus can consume less power.

Embodiment 6

In this embodiment, examples of electronic devices each including the organic EL device described in Embodiments 1 and 2 will be described. The organic EL device described in Embodiments 1 and 2 has low driving voltage and low power consumption. As a result, the electronic devices described in this embodiment can each include a light-emitting portion having low power consumption.

Examples of the electronic device including the above organic EL device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

FIG. 13A illustrates an example of a television device. In the television device, a display portion 7103 is incorporated in a housing 7101. Here, the housing 7101 is supported by a stand 7105. Images can be displayed on the display portion 7103, and in the display portion 7103, the organic EL devices described in Embodiments 1 and 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers, for example) data communication can be performed.

FIG. 13B1 illustrates a computer, which includes a main body 7201, a housing 7202, a display portion 7203, a keyboard 7204, an external connection port 7205, a pointing device 7206, and the like. Note that this computer is manufactured using the organic EL devices described in Embodiments 1 and 2 and arranged in a matrix in the display portion 7203. The computer illustrated in FIG. 13B1 may have a structure illustrated in FIG. 13B2. A computer illustrated in FIG. 13B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 13C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the organic EL devices described in Embodiments 1 and 2 and arranged in a matrix.

When the display portion 7402 of the portable terminal illustrated in FIG. 13C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-andinput mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source that emits near-infrared light in the display portion, an image of a finger vein, a palm vein, or the like can be taken.

Note that the structure described in this embodiment can be combined with any of the structures described in Embodiments 1 to 5 as appropriate.

As described above, the application range of the light-emitting apparatus including the organic EL device described in Embodiments 1 and 2 is extremely wide, so that this light-emitting apparatus can be used for electronic devices in a variety of fields. By using the organic EL device described in Embodiments 1 and 2, an electronic device with low power consumption can be obtained.

Figure 14A:
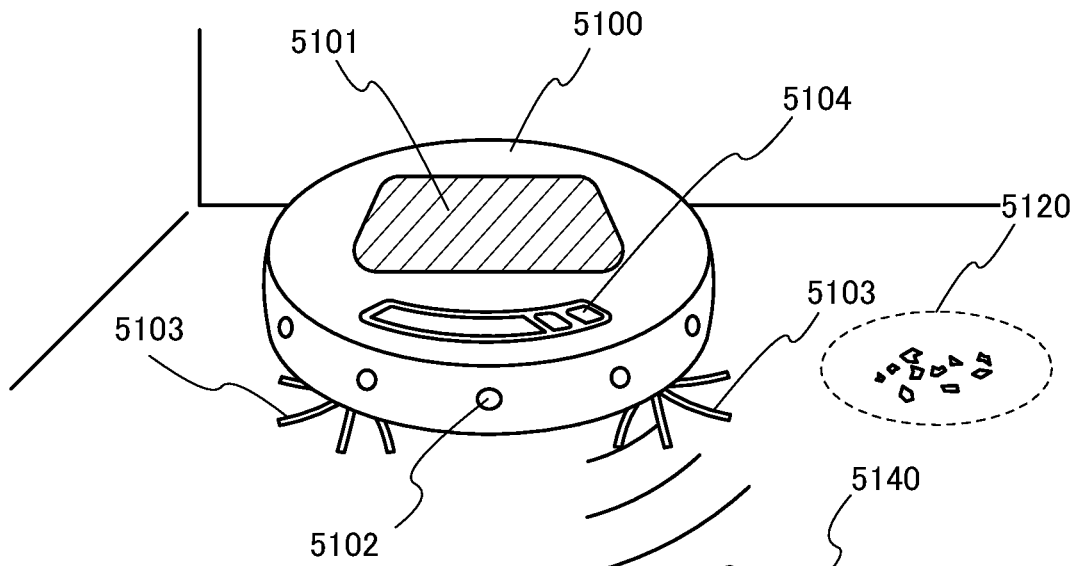
FIGS. 14A to 14C illustrate electronic devices.

FIG. 14A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device such as a smartphone.

The light-emitting apparatus of one embodiment of the present invention can be used for the display 5101.

Figure 14B:
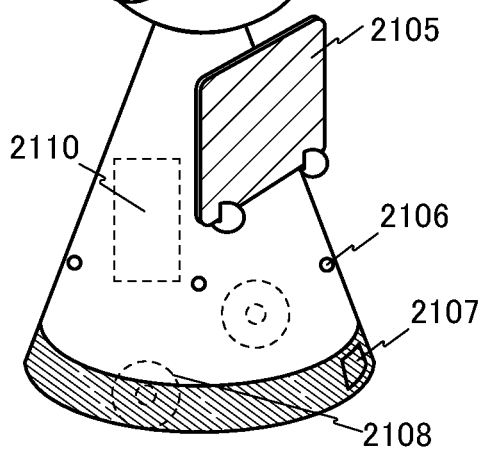

A robot 2100 illustrated in FIG. 14B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 14C:
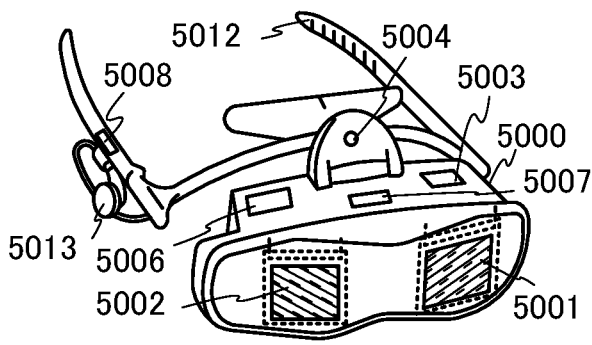

FIG. 14C illustrates an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 15:
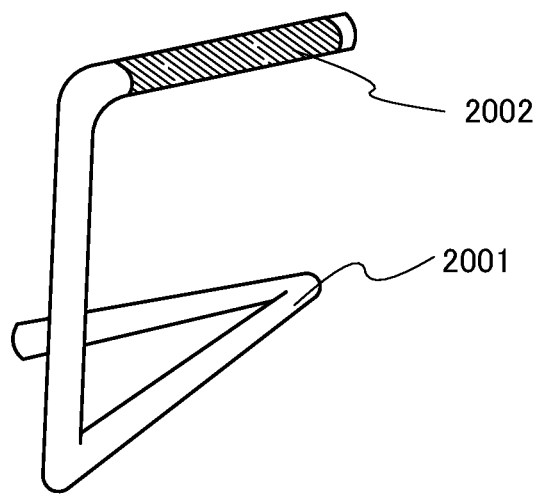
FIG. 15 illustrates a lighting device.

FIG. 15 illustrates an example in which the organic EL device described in Embodiments 1 and 2 is used for a table lamp which is alighting device. The table lamp illustrated in FIG. 15 includes a housing 2001 and a light source 2002, and the lighting device described in Embodiment 3 may be used for the light source 2002.

Figure 16:
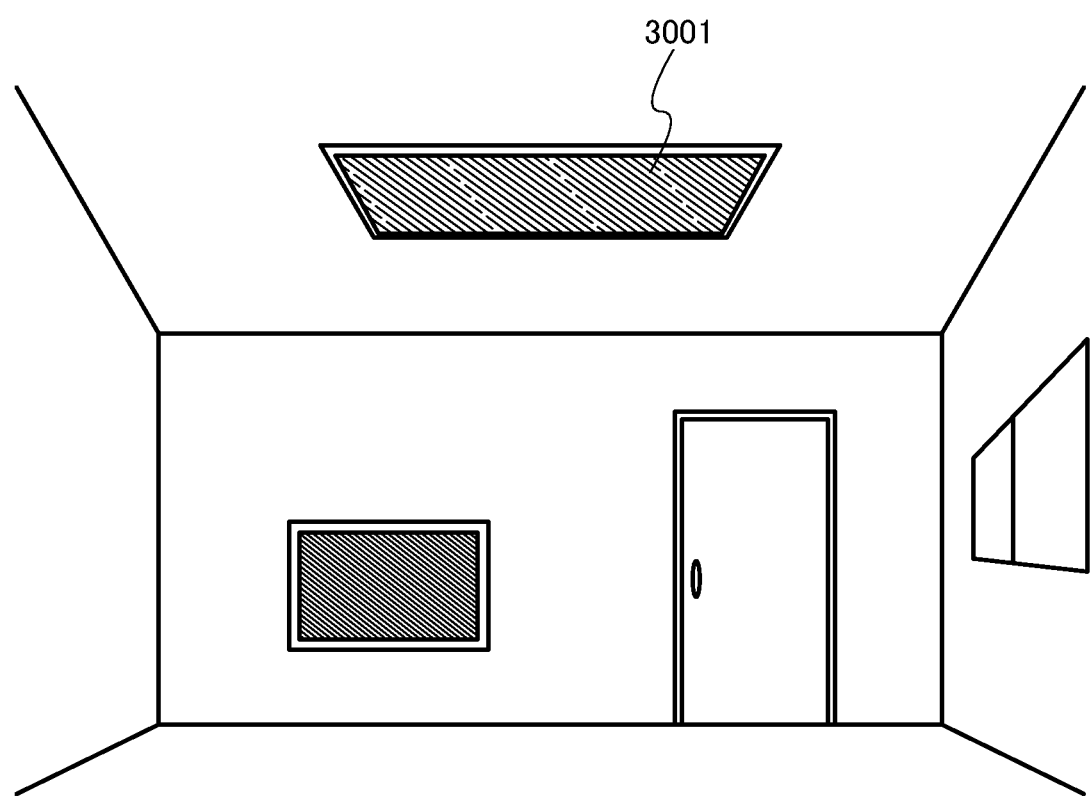
FIG. 16 illustrates a lighting device.

FIG. 16 illustrates an example in which the organic EL device described in Embodiments 1 and 2 is used for an indoor lighting device 3001. Since the organic EL device described in Embodiments 1 and 2 has low driving voltage, the lighting device can have low power consumption. Furthermore, since the organic EL device described in Embodiments 1 and 2 can have a large area, the organic EL device can be used for a large-area lighting device. Furthermore, since the organic EL device described in Embodiments 1 and 2 is thin, the organic EL device can be used for a lighting device having a reduced thickness.

Figure 17:
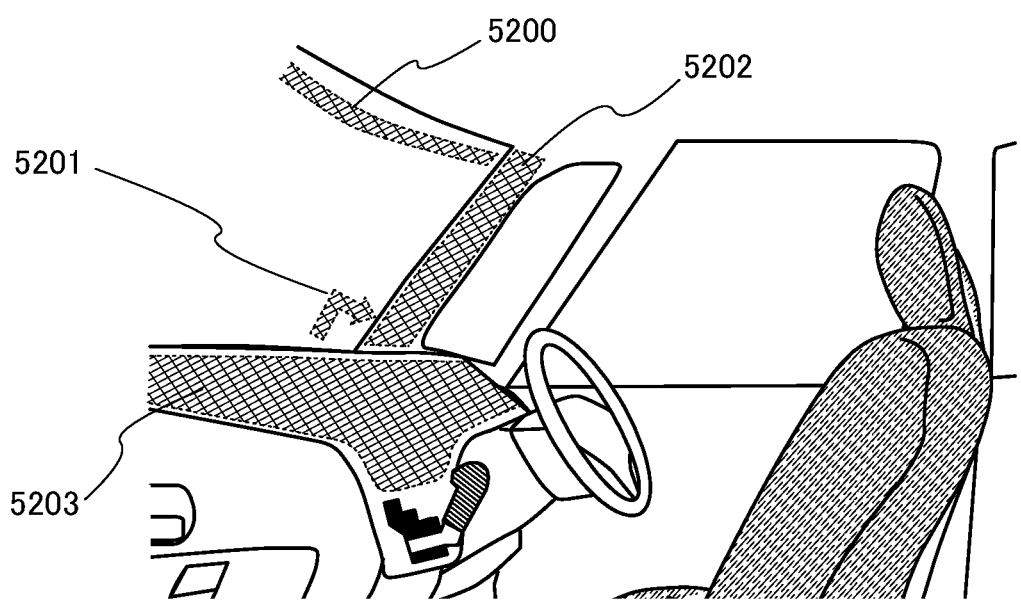
FIG. 17 illustrates in-vehicle display devices and lighting devices.

The organic EL device described in Embodiments 1 and 2 can also be used for an automobile windshield, an automobile dashboard, or the like. FIG. 17 illustrates one mode in which the organic EL devices described in Embodiments 1 and 2 are used for an automobile windshield, an automobile dashboard, and the like. Display regions 5200 to 5203 each include the organic EL device described in Embodiments 1 and 2.

The display regions 5200 and 5201 are display devices which are provided in the automobile windshield and include the organic EL device described in Embodiments 1 and 2. The organic EL device described in Embodiments 1 and 2 can be formed into what is called a see-through display device, through which the opposite side can be seen, by including a first electrode and a second electrode formed of light-transmitting electrodes. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and includes the organic EL device described in Embodiments 1 and 2. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information such as navigation data, the speed, the number of rotations, air-condition setting, and the like. The content or layout of the display can be changed freely by a user as appropriate. Note that such information can also be displayed on the display regions 5200 to 5202. The display regions 5200 to 5203 can also be used as lighting devices.

Figure 18A:
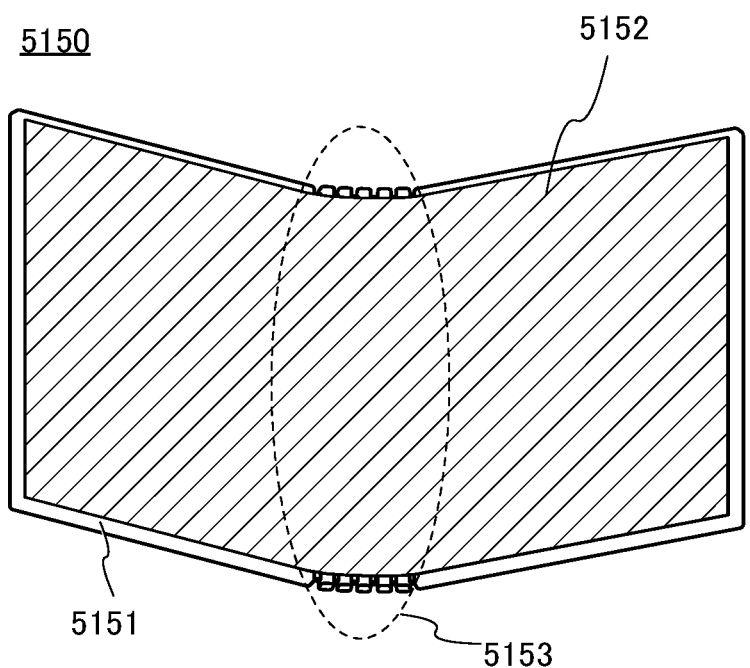
FIGS. 18A and 18B illustrate an electronic device.
Figure 18B:
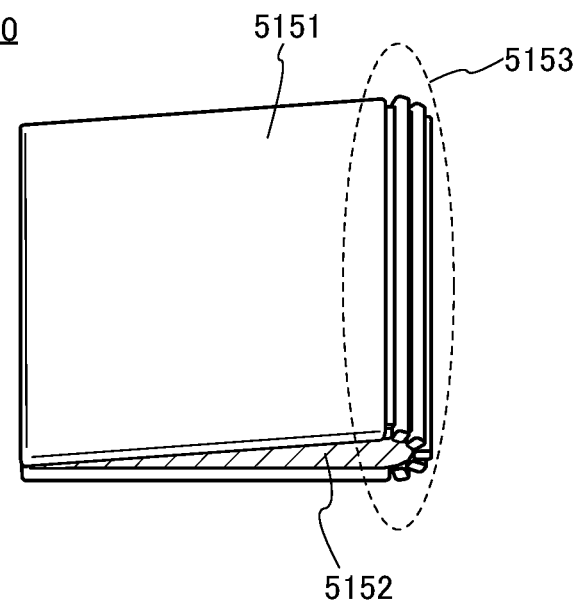

FIGS. 18A and 18B illustrate a foldable portable information terminal 5150. The foldable portable information terminal 5150 includes a housing 5151, a display region 5152, and a bend portion 5153. FIG. 18A illustrates the portable information terminal 5150 that is opened. FIG. 18B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 19A:
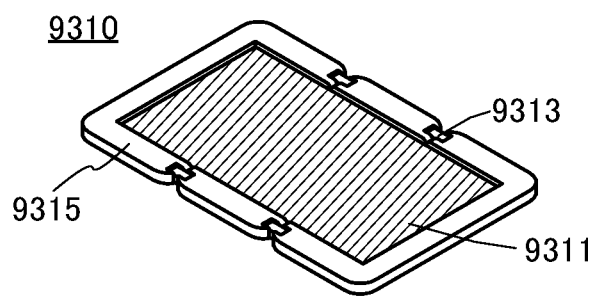
FIGS. 19A to 19C illustrate an electronic device.
Figure 19B:
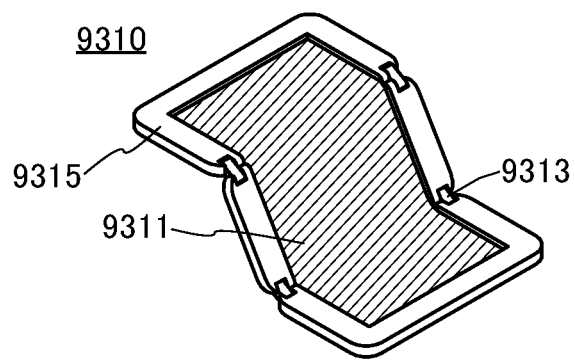
Figure 19C:
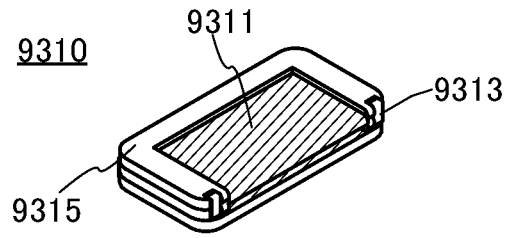

FIGS. 19A to 19C illustrate a foldable portable information terminal 9310. FIG. 19A illustrates the portable information terminal 9310 that is opened. FIG. 19B illustrates the portable information terminal 9310 that is being opened or being folded. FIG. 19C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

In this example, the organic EL device of one embodiment of the present invention (hereinafter, referred to as an OEL device) will be described in detail. Structural formulae of typical organic compounds used in this example are shown below.

[Chemical Formulae 4]

(i)

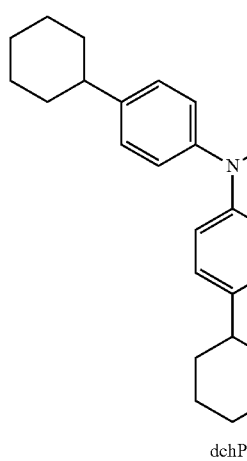

dchPAF (ii)

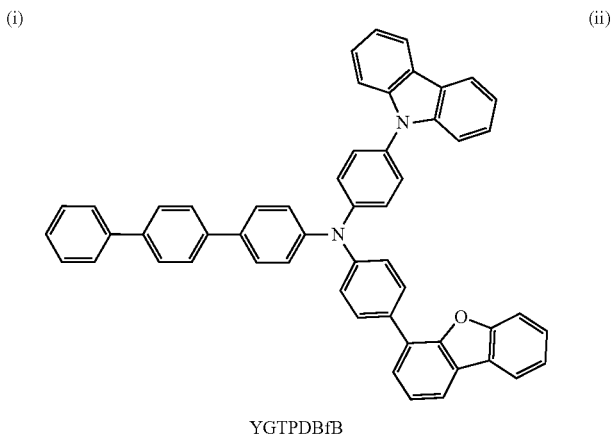

YGTPDBfB

-continued

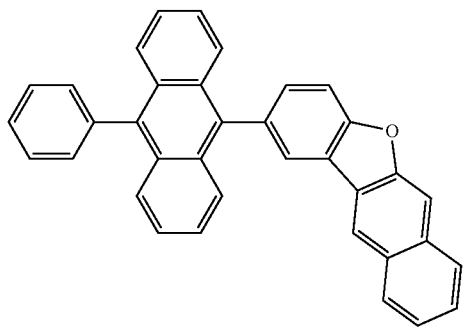

Bnf(II)PhA

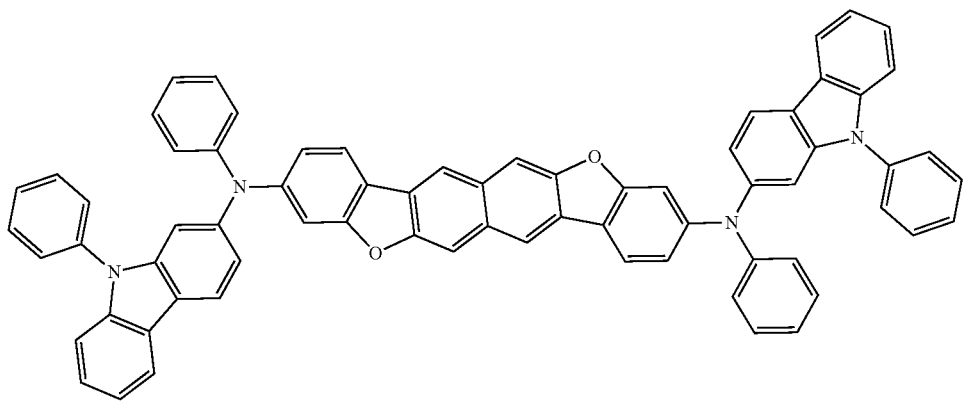

3,10PCA2Nbf(IV)-02

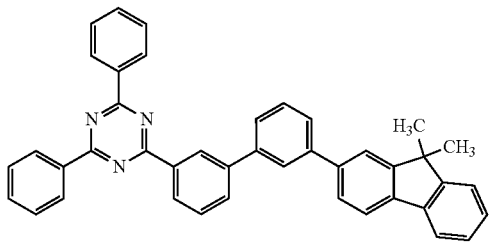

mFBPTzn

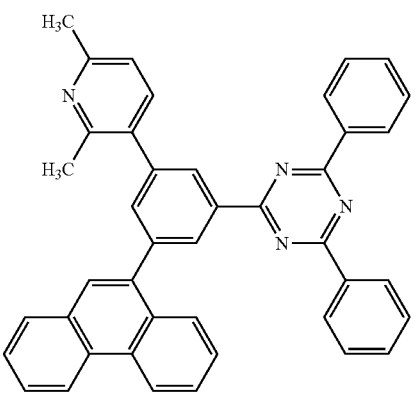

mPn-mDMePyPTzn

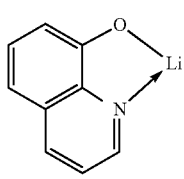

Liq (Method for Fabricating OEL Device 1)

First, indium tin oxide containing silicon oxide (ITSO) was deposited over a glass substrate by a sputtering method to form the anode 101. The thickness of the anode 101 was 55 nm and the electrode area was 2 mm×2 mm.

Next, in pretreatment for forming the OEL device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, N,N-bis(4-cyclohexylphenyl)-9,9-dimethyl-9H-fluoren-2-amine (abbreviation: dchPAF) represented by Structural Formula (i) and an electron acceptor material (OCHD-003) having a molecular weight of 672 and containing fluorine were deposited by co-evaporation to a thickness of 10 nm over the anode 101 using a resistance-heating method such that the weight ratio of dchPAF to OCHD-003 was 1:0.1, whereby the hole-injection layer 111 was formed.

Next, dchPAF was deposited by evaporation over the hole-injection layer 111 to a thickness of 30 nm to form the first hole-transport layer, and then N-[4-(9H-carbazol-9-yl)phenyl]-N-[4-(4-dibenzofuranyl)phenyl]-[1,1':4',1''-terphenyl]-4-amine (abbreviation: YGTPDBfB) represented by Structural Formula (ii) was deposited by evaporation to a thickness of 25 nm, whereby the hole-transport layer 112 was formed.

Over the hole-transport layer 112, 2-(10-phenyl-9-anthracenyl)-benzo[b]naphtho[2,3-d]furan (abbreviation: Bnf(II)PhA) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were deposited by co-evaporation to a thickness of 25 nm such that the weight ratio of Bnf(II)PhA to 3,10PCA2Nbf(IV)-02 was 1:0.015, whereby the light-emitting layer 113 was formed.

Next, 2-[3'-(9,9-dimethyl-9H-fluoren-2-yl)-1,1'-biphenyl-3-yl]-4,6-diphenyl-1,3,5-triazine (abbreviation: mFBPTzn) represented by Structural Formula (v) was deposited by evaporation over the light-emitting layer 113 to a thickness of 10 nm, whereby a hole-blocking layer was formed.

After that, 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by Structural Formula (vi) and 8-quinolinolato-lithium (abbreviation: Liq) represented by Structural Formula (vii) were deposited by co-evaporation to a thickness of 20 nm such that the weight ratio of mPn-mDMePyPTzn to Liq was 1:1, whereby the electron-transport layer 114 was formed.

After the formation of the electron-transport layer 114, Liq was deposited by evaporation to a thickness of 1 nm to form the electron-injection layer 115, and lastly, aluminum was deposited by evaporation to a thickness of 200 nm to form the cathode 102. Thus, the OEL device 1 was fabricated.

The structure of the OEL device 1 is listed in the following table.

TABLE 7

|  | Film thickness |  | OEL device 1 |
|---|---|---|---|
| Electron-injection layer | 1 nm |  | Liq |
| Electron-transport layer | 20 nm |  | mPn-mDMePyPTzn:Liq (1:1) |
| Hole-blocking layer | 10 nm |  | mFBPTzn |
| Light-emitting layer | 25 nm |  | Bnf(II)PhA:3,10PCA2Nbf(IV)-02 (1:0.015) |
| Hole-transport layer | 2 | 25 nm | YGTPDBfB |
|  | 1 | 30 nm | dchPAF |
| Hole-injection layer |  | 10 nm | dchPAF: OCHD-003 (1:0.1) |

The OEL device 1 was sealed using a glass substrate in a glove box containing a nitrogen atmosphere so as not to be exposed to the air (a sealing material was applied to surround the device and UV treatment and heat treatment at 80° C. for one hour were performed at the time of sealing). Then, the initial characteristics of the OEL device 1 were measured. Note that particular treatment for improving outcoupling efficiency was not performed on the glass substrate over which the OEL device was formed.

Figure 20:
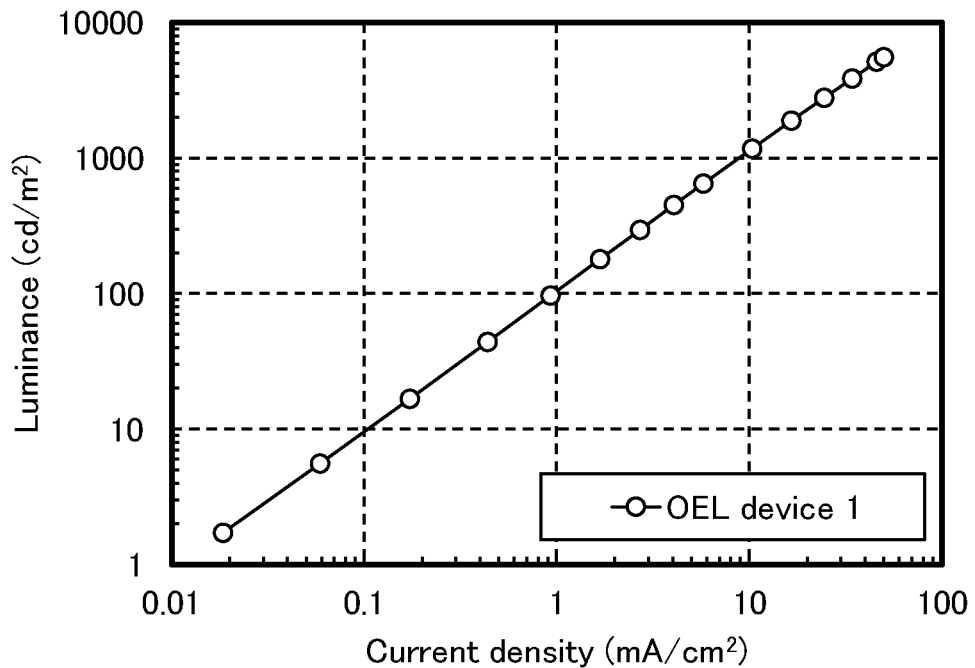
FIG. 20 shows the luminance-current density characteristics of an OEL device 1.
Figure 21:
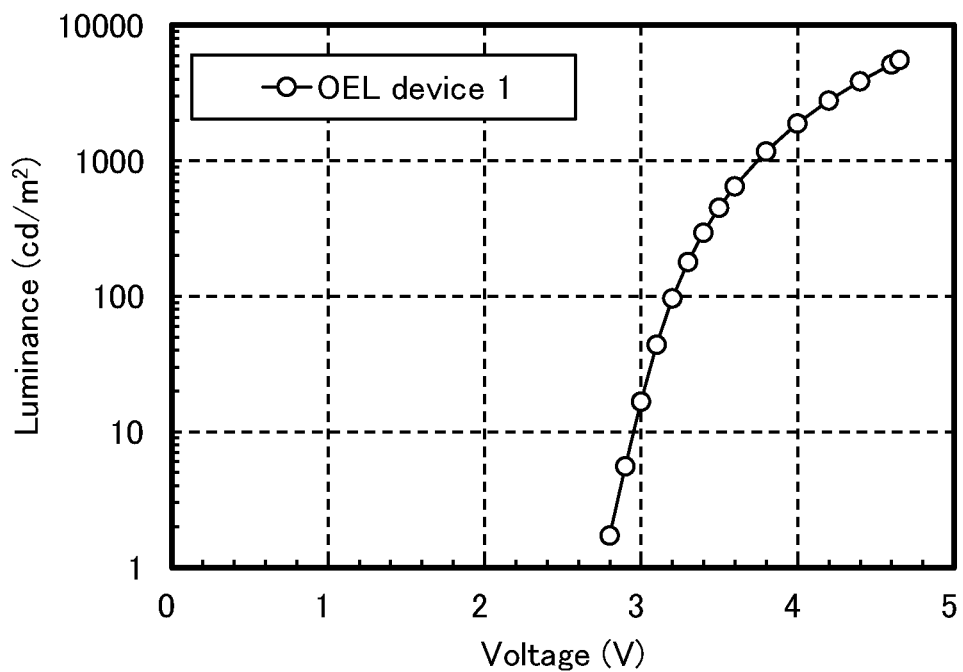
FIG. 21 shows the luminance-voltage characteristics of the OEL device 1.
Figure 22:
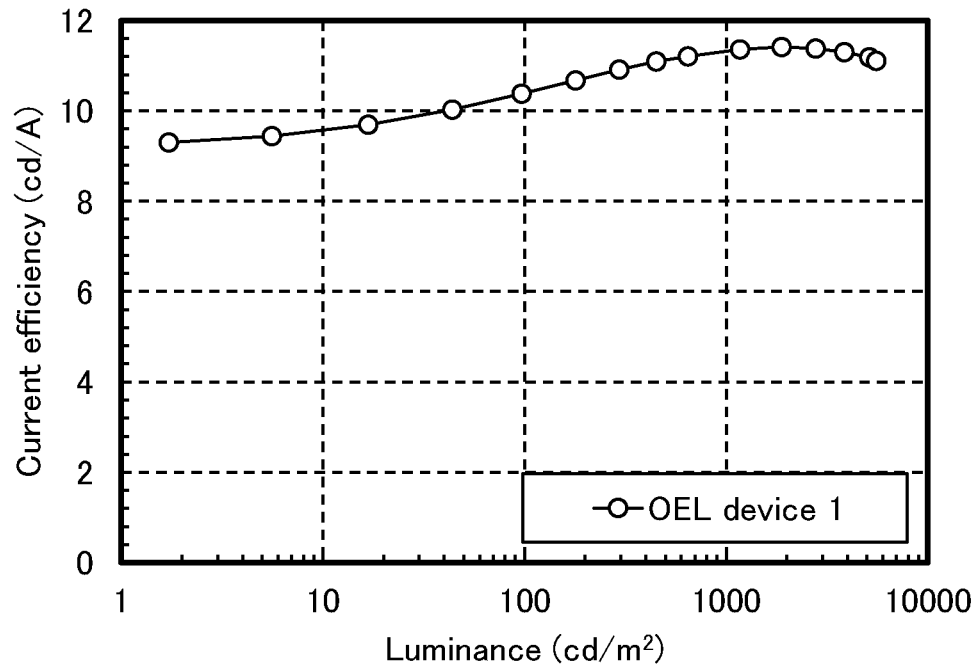
FIG. 22 shows the current efficiency-luminance characteristics of the OEL device 1.
Figure 23:
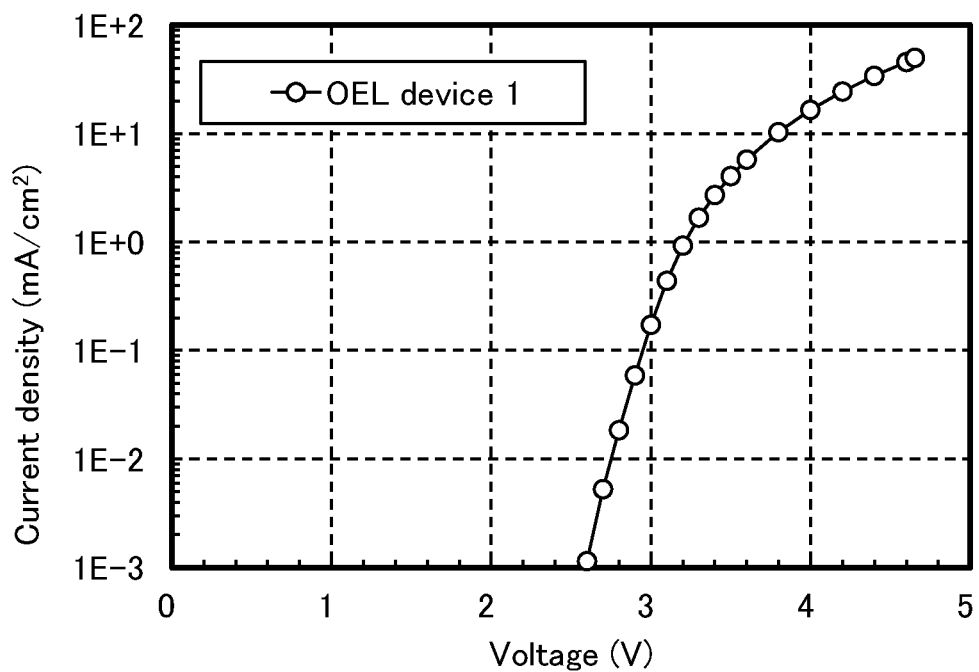
FIG. 23 shows the current density-voltage characteristics of the OEL device 1.
Figure 24:
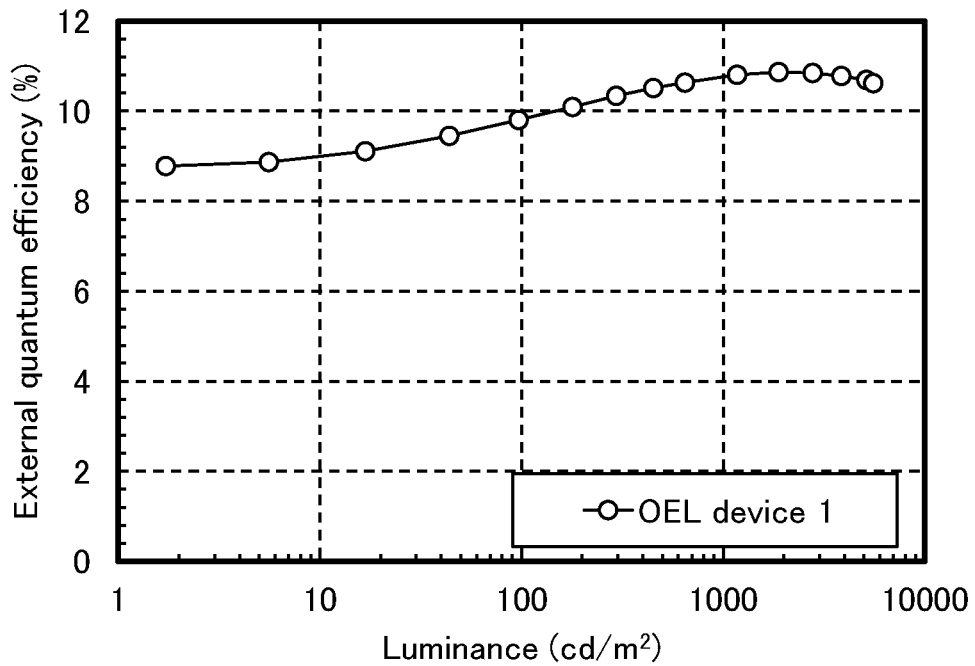
FIG. 24 shows the external quantum efficiency-luminance characteristics of the OEL device 1.
Figure 25:
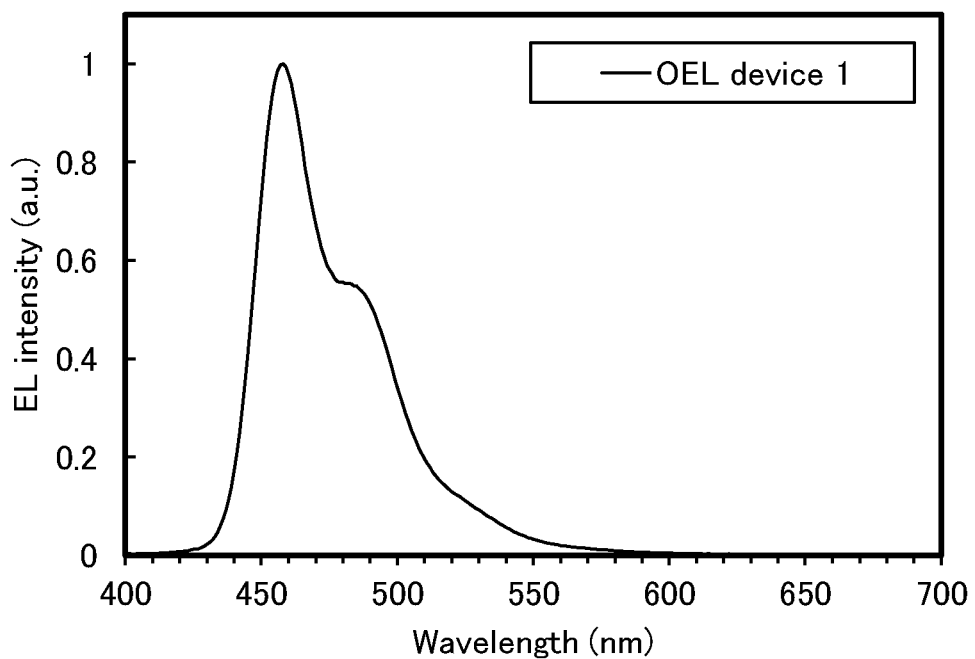
FIG. 25 shows an emission spectrum of the OEL device 1.

FIG. 20 shows the luminance-current density characteristics of the OEL device 1. FIG. 21 shows the luminance-voltage characteristics of the OEL device 1. FIG. 22 shows the current efficiency-luminance characteristics of the OEL device 1. FIG. 23 shows the current density-voltage characteristics of the OEL device 1. FIG. 24 shows the external quantum efficiency-luminance characteristics of the OEL device 1. FIG. 25 shows the emission spectrum of the OEL device 1. Table 8 shows the main characteristics of the OEL device 1 at a luminance of approximately 1000 cd/m². Luminance, CIE chromaticity, and emission spectra were measured at normal temperature with a spectroradiometer (UR-UL1R produced by TOPCON TECHNOHOUSE CORPORATION). The external quantum efficiency was calculated from the measured luminance and emission spectra, on the assumption that the OEL device 1 had Lambertian light-distribution characteristics.

TABLE 8

|  | Voltage (V) | Current (mA) | Current density (mA/cm²) | Chromaticity x | Chromaticity y | Current efficiency (cd/A) | External quantum efficiency (%) |
|---|---|---|---|---|---|---|---|
| OEL device 1 | 3.8 | 0.41 | 10.3 | 0.13 | 0.13 | 11.4 | 11 |

FIG. 20 to FIG. 25 and Table 8 show that the OEL device 1 has favorable characteristics with low driving voltage and high emission efficiency.

Here, the results of GSP (mV/nm) of the evaporated films of the hole-transport organic compounds used for the hole-transport layers in the OEL device 1 are summarized in the following table. The following table also shows a value (ΔGSP) obtained by subtracting GSP (GSP2) of the hole-transport organic compound (HTM2) used for the second hole-transport layer formed later from GSP (GSP1) of the hole-transport organic compound (HTM1) used for the first hole-transport layer formed first.

TABLE 9

|  | OEL device 1 |
| --- | --- |
| HTM2 | YGTPDBfB |
| GSP2 (mV/nm) | 8.7 |
| HTM1 | dchPAF |
| GSP1 (mV/nm) | 22.4 |
| ΔGSP (mV/nm) | 13.7 |

As shown above, the OEL device 1 has a small ΔGSP of 13.7 (mV/nm). The above demonstrates that the OEL device of one embodiment of the present invention has favorable characteristics with low driving voltage.

Example 2

In this example, an OEL device of one embodiment of the present invention and a comparative OEL device will be described in detail. Structural formulae of typical organic compounds used in this example are shown below.

[Chemical Formulae 5]

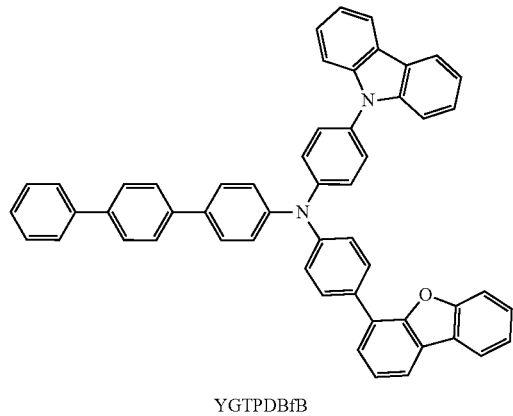

YGTPDBfB

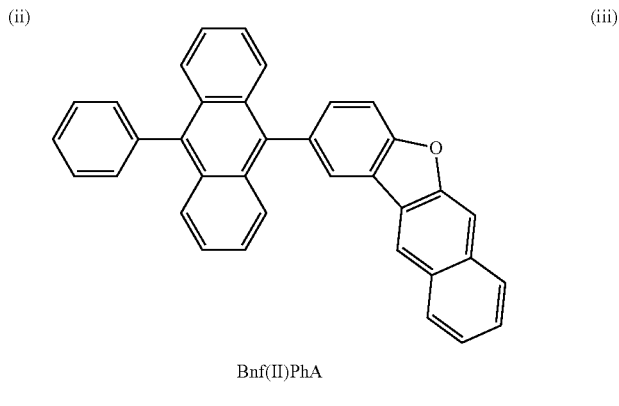

Bnf(II)PhA

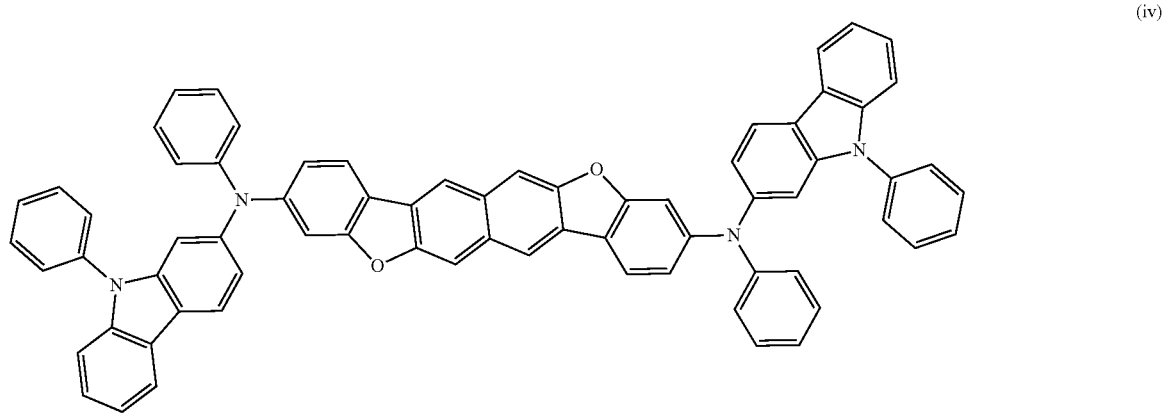

3,10PCA2Nbf(IV)-02

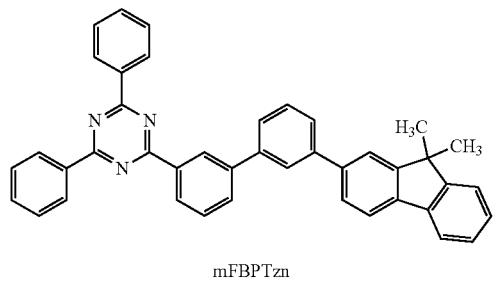
mFBPTzn (v)
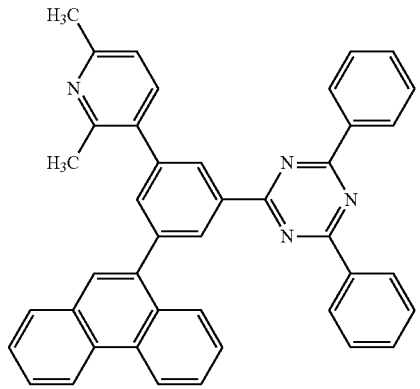
mPn-mDMePyPTzn (vi)
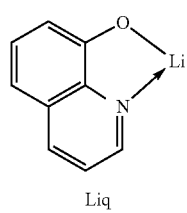
Liq
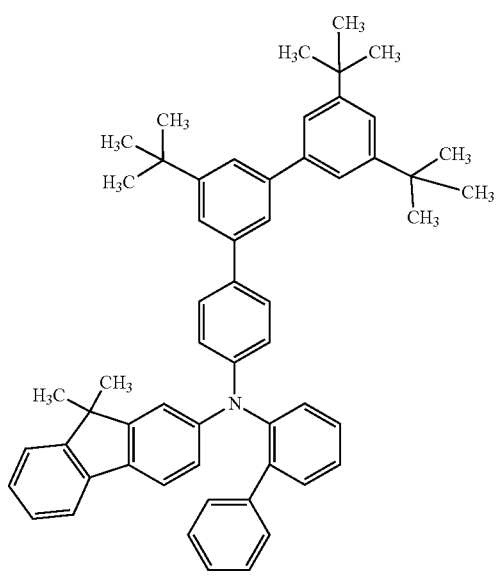
mmtBumTPoFBi-04 (viii)

(ix)

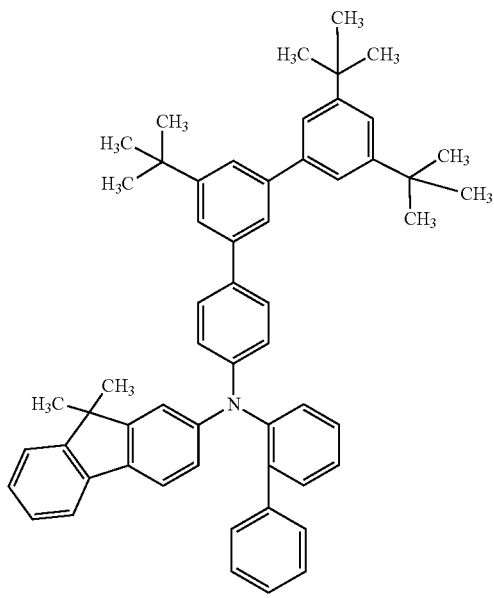

mmtBumBioFBi (Method for Fabricating OEL Device 2)

First, indium tin oxide containing silicon oxide (ITSO) was deposited over a glass substrate by a sputtering method to form the anode 101. The thickness of the anode 101 was 55 nm and the electrode area was 2 mm×2 mm.

Next, in pretreatment for forming the OEL device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, N-(3",5',5"-tri-t-butyl-1,1': 3',1"-terphenyl-4-yl)-N-(1,1'-biphenyl-2-yl)-9,9-dimethyl-9H-fluoren-2-amine (abbreviation: mmtBumTPoFBi-04) represented by Structural Formula (viii) and an electron acceptor material (OCHD-003) having a molecular weight of 672 and containing fluorine were deposited by co-evaporation to a thickness of 10 nm over the anode 101 using a resistance-heating method such that the weight ratio of mmtBumTPoFBi-04 to OCHD-003 was 1:0.1, whereby the hole-injection layer 111 was formed.

Next, mmtBumTPoFBi-04 was deposited by evaporation over the hole-injection layer 111 to a thickness of 100 nm to form the first hole-transport layer, and then N-[4-(9H-carbazol-9-yl)phenyl]-N-[4-(4-dibenzofuranyl)phenyl]-[1, 1':4',1"-terphenyl]-4-amine (abbreviation: YGTPDBfB) represented by Structural Formula (ii) was deposited by evaporation to a thickness of 10 nm, whereby the hole-transport layer 112 was formed.

Over the hole-transport layer 112, 2-(10-phenyl-9-anthracenyl)-benzo[b]naphtho[2,3-d]furan (abbreviation: Bnf(II)PhA) represented by Structural Formula (iii) and 3,10-bis [N-(9-phenyl-9H-carbazol-2-yl)-N-phenylamino]naphtho [2,3-b;6,7-b']bisbenzofuran (abbreviation: 3,10PCA2Nbf (IV)-02) represented by Structural Formula (iv) were deposited by co-evaporation to a thickness of 25 nm such that the weight ratio of Bnf(II)PhA to 3,10PCA2Nbf(IV)-02 was 1:0.015, whereby the light-emitting layer 113 was formed.

Next, 2-[3'-(9,9-dimethyl-9H-fluoren-2-yl)-1,1'-biphenyl-3-yl]-4,6-diphenyl-1,3,5-triazine (abbreviation: mFBPTzn) represented by Structural Formula (v) was deposited by evaporation over the light-emitting layer 113 to a thickness of 10 nm, whereby a hole-blocking layer was formed.

After that, 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by Structural Formula (vi) and 8-quinolinolato-lithium (abbreviation: Liq) represented by Structural Formula (vii) were deposited by co-evaporation to a thickness of 15 nm such that the weight ratio of mPn-mDMePyPTzn to Liq was 1:1, whereby the electron-transport layer 114 was formed.

After the formation of the electron-transport layer 114, Liq was deposited by evaporation to a thickness of 1 nm to form the electron-injection layer 115, and lastly, aluminum was deposited by evaporation to a thickness of 200 nm to form the cathode 102. Thus, the OEL device 2 was fabricated.

(Method for Fabricating Comparative OEL Device 2)

A comparative OEL device 2 was fabricated in the same manner as the OEL device 2 except that mmtBumTPoFBi-04 in the OEL device 2 was replaced with N-(1,1'-biphenyl-2-yl)-N-[(3,3',5'-tri-t-butyl)-1,1'-biphenyl-5-yl]-9,9-dimethyl-9H-fluoren-2-amine (abbreviation: mmtBumBioFBi) represented by Structural Formula (ix).

The structures of the OEL device 2 and the comparative OEL device 2 are listed in the following table.

TABLE 10

| | Film thickness | OEL device 2 | Comparative OEL device 2 |
|---|---|---|---|
| Electron-injection layer | 1 nm | Liq | |
| Electron-transport layer | 15 nm | mPn-mDMePyPTzn:Liq (1:1) | |
| Hole-blocking layer | 10 nm | mFBPTzn | |
| Light-emitting layer | 25 nm | Bnf(II)PhA:3, 10PCA2Nbf(IV)-02 (1:0.015) | |
| Hole-transport layer 1 | 10 nm | YGTPDBfB | |
| | 100 nm | mmtBumTPoFBi-04 mmtBumTPoFBi-04: OCHD-003 (1:0.1) | mmtBumBioFBi mmtBumBioFBi: OCHD-003 (1:0.1) |
| Hole-injection layer | 10 nm | | |

The OEL device 2 and the comparative OEL device 2 were sealed using a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the OEL devices were measured. Note that particular treatment for improving outcoupling efficiency was not performed on the glass substrate over which the OEL device was formed.

Figure 26:
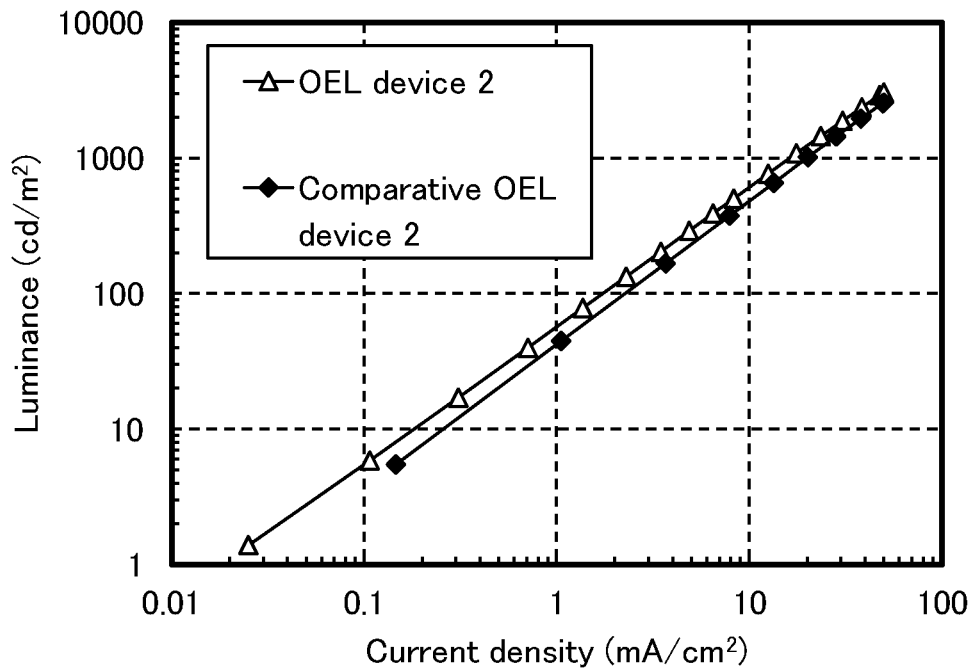
FIG. 26 shows the luminance-current density characteristics of an OEL device 2 and a comparative OEL device 2.
Figure 27:
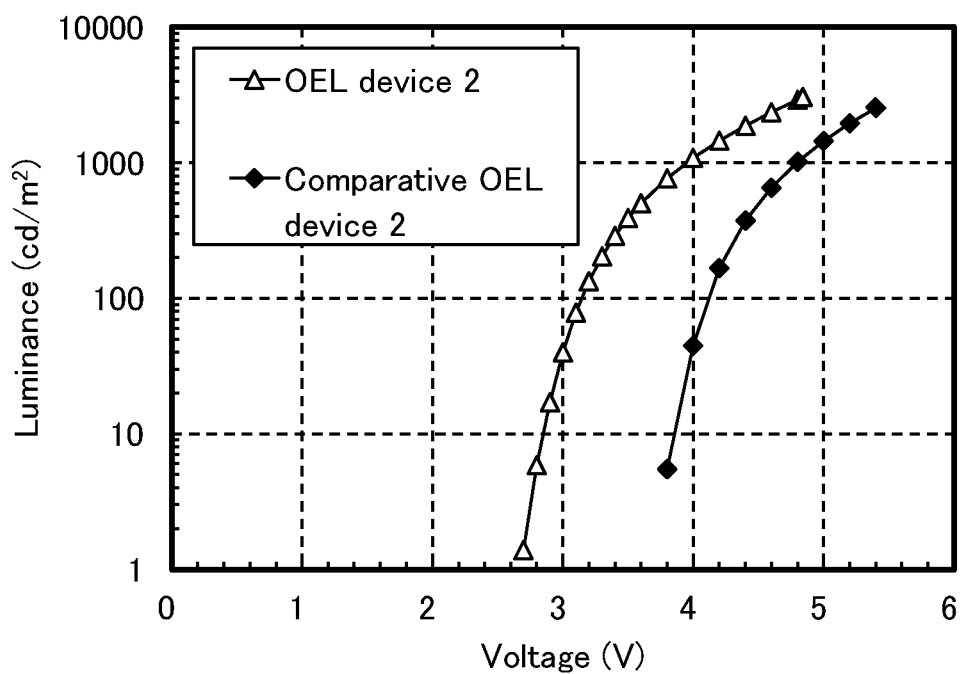
FIG. 27 shows the luminance-voltage characteristics of the OEL device 2 and the comparative OEL device 2.
Figure 28:
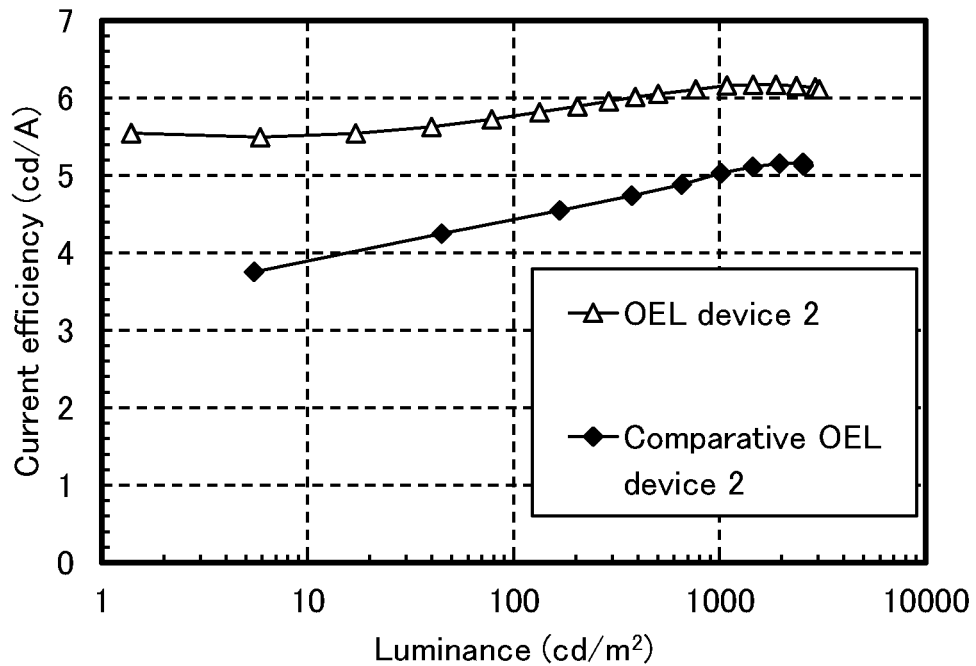
FIG. 28 shows the current efficiency-luminance characteristics of the OEL device 2 and the comparative OEL device 2.
Figure 29:
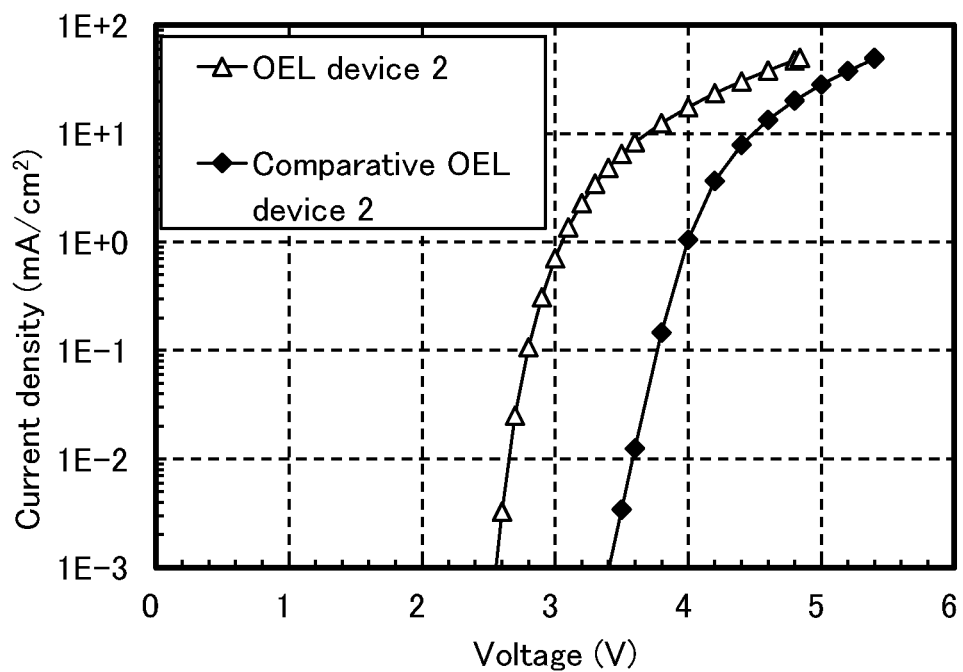
FIG. 29 shows the current density-voltage characteristics of the OEL device 2 and the comparative OEL device 2.
Figure 30:
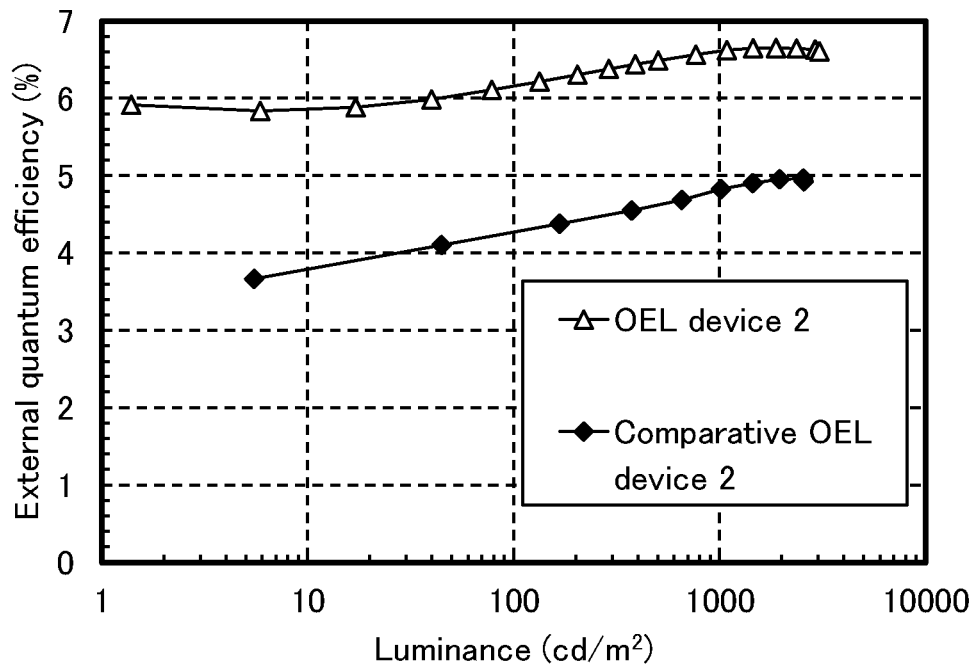
FIG. 30 shows the external quantum efficiency-luminance characteristics of the OEL device 2 and the comparative OEL device 2.
Figure 31:
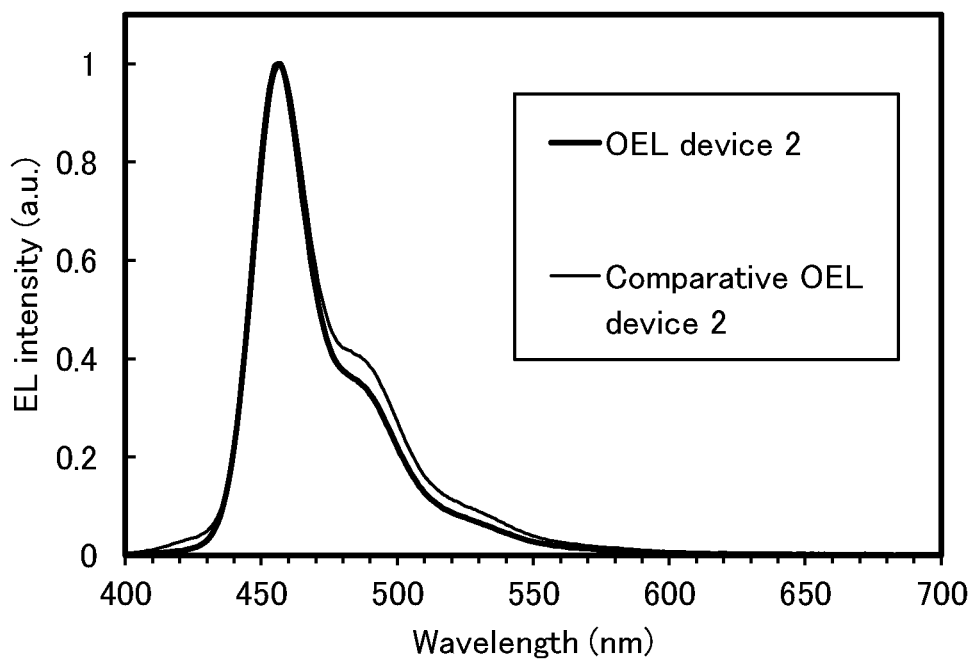
FIG. 31 shows emission spectra of the OEL device 2 and the comparative OEL device 2.

FIG. 26 shows the luminance-current density characteristics of the OEL device 2 and the comparative OEL device 2. FIG. 27 shows the luminance-voltage characteristics of the OEL device 2 and the comparative OEL device 2. FIG. 28 shows the current efficiency-luminance characteristics of the OEL device 2 and the comparative OEL device 2. FIG. 29 shows the current density-voltage characteristics of the OEL device 2 and the comparative OEL device 2. FIG. 30 shows the external quantum efficiency-luminance characteristics of the OEL device 2 and the comparative OEL device 2. FIG. 31 shows the emission spectra of the OEL device 2 and the comparative OEL device 2. Table 11 shows the main characteristics of the OEL devices at a luminance of approximately 1000 cd/m². Luminance, CIE chromaticity, and emission spectra were measured at normal temperature with a spectroradiometer (UR-UL1R produced by TOPCON TECHNOHOUSE CORPORATION). The external quantum efficiency was calculated from the measured luminance and emission spectra, on the assumption that the OEL devices had Lambertian light-distribution characteristics.

TABLE 11

| | Voltage (V) | Current (mA) | Current density (mA/cm²) | Chromaticity x | Chromaticity y | Current efficiency (cd/A) | External quantum efficiency (%) |
|---|---|---|---|---|---|---|---|
| OEL device 2 | 4.0 | 0.70 | 17.6 | 0.14 | 0.10 | 6.2 | 7 |
| Comparative OEL device 2 | 4.8 | 0.81 | 20.2 | 0.14 | 0.12 | 5.0 | 5 |

FIG. 26 to FIG. 31 and Table 11 show that the OEL device 2 has favorable characteristics with lower driving voltage and higher emission efficiency than the comparative OEL device 2.

Here, the results of GSP (mV/nm) of the evaporated films of the hole-transport organic compounds used for the hole-transport layers in the OEL devices are summarized in the following table. The following table also shows a value (ΔGSP) obtained by subtracting GSP (GSP2) of the hole-transport organic compound (HTM2) used for the second hole-transport layer formed later from GSP (GSP1) of the hole-transport organic compound (HTM1) used for the first hole-transport layer formed first.

TABLE 12

| | OEL device 2 | Comparative OEL device 2 |
|---|---|---|
| HTM2 | YGTPDBfB | |
| GSP2 (mV/nm) | 8.7 | |
| HTM1 | mmtBumTPoFBi-04 | mmtBumBioFBi |
| GSP1 (mV/nm) | 16.7 | 40.6 |
| ΔGSP (mV/nm) | 8 | 31.9 |

As shown above, the comparative OEL device 2 has large ΔGSP, which implies that a poor property of hole injection from the first hole-transport layer to the second hole-transport layer increases driving voltage. By contrast, the OEL device of one embodiment of the present invention with small ΔGSP has favorable characteristics with low driving voltage.

Example 3

In this example, OEL devices of one embodiment of the present invention and a comparative OEL device will be described in detail. Structural formulae of typical organic compounds used in this example are shown below.

[Chemical Formulae 6]
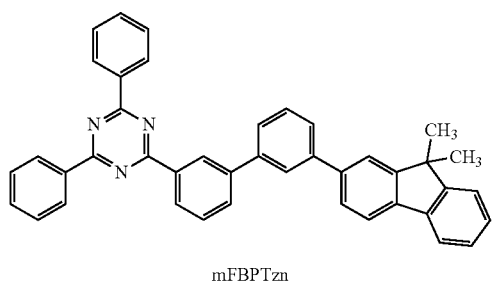
mFBPTzn (v)
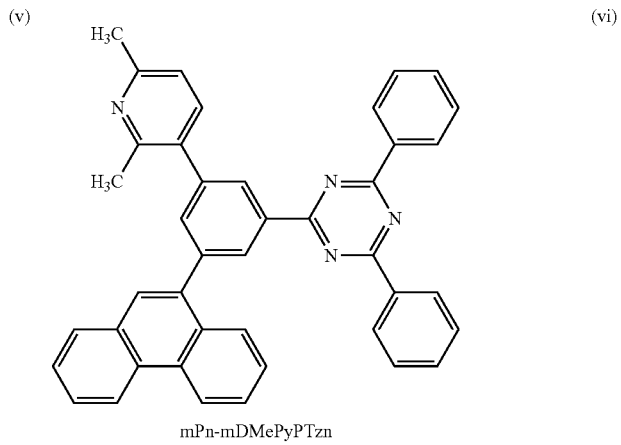
mPn-mDMePyPTzn (vi)
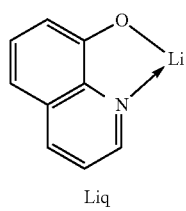
Liq (vii)
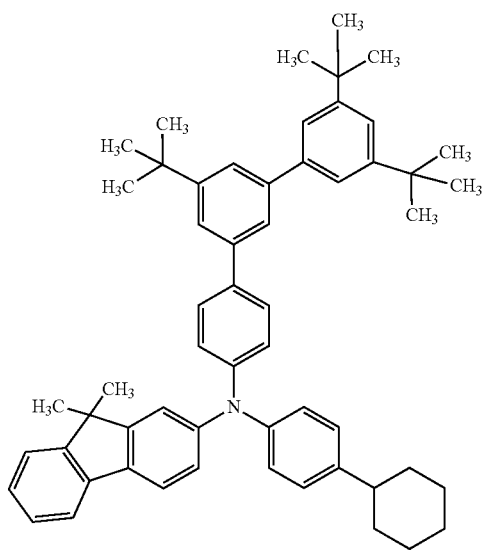
mmtBumTPchPAF-04 (x)
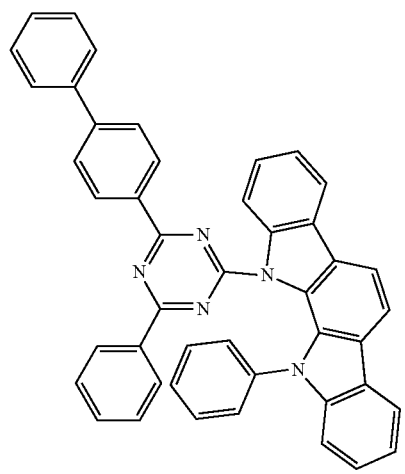
BP-Icz(II)Tzn (xi)
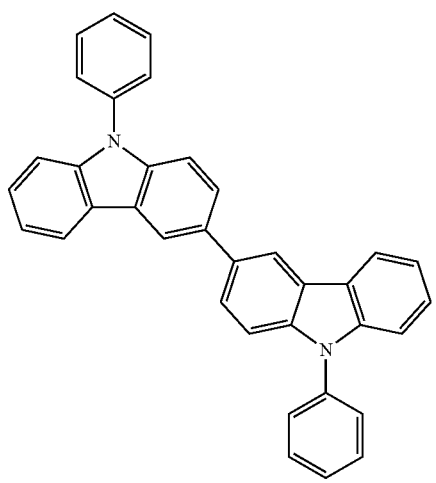
PCCP (xii)

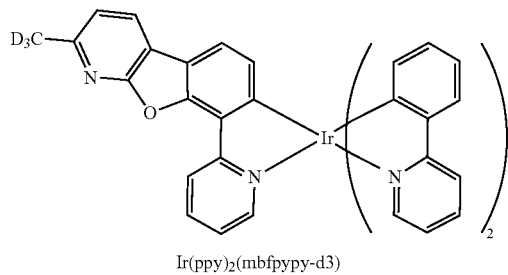

Ir(ppy)₂(mbfpypy-d3)

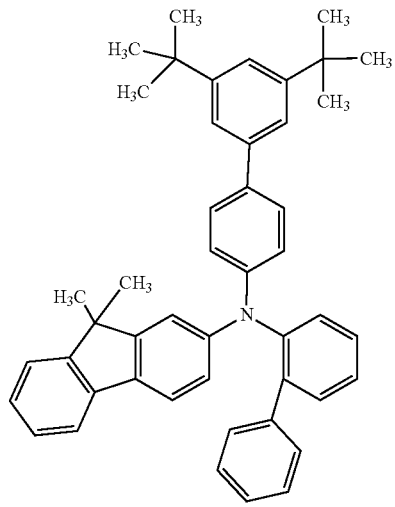

mmtBuBioFBi

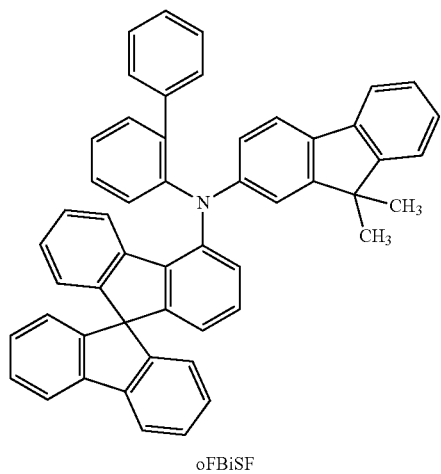

oFBiSF (Method for Fabricating OEL Device 3-1)

First, indium tin oxide containing silicon oxide (ITSO) was deposited over a glass substrate by a sputtering method to form the anode 101. The thickness of the anode 101 was 110 nm and the electrode area was 2 mm×2 mm.

Next, in pretreatment for forming the OEL device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, N-(3",5',5"-tri-tert-butyl-1,1':3',1"-terphenyl-4-yl)-N-(4-cyclohexylphenyl)-9,9-dimethyl-9H-fluoren-2-amine (abbreviation: mmtBumTPchPAF-04) represented by Structural Formula (x) and an electron acceptor material (OCHD-003) having a molecular weight of 672 and containing fluorine were deposited by co-evaporation to a thickness of 10 nm over the anode 101 using a resistance-heating method such that the weight ratio of mmtBumTPchPAF-04 to OCHD-003 was 1:0.1, whereby the hole-injection layer 111 was formed.

Next, over the hole-injection layer 111, mmtBumTPchPAF-04 was deposited by evaporation to a thickness of 100 nm to form the first hole-transport layer, and then, mmtBumTPchPAF-04 was deposited by evaporation to a thickness of 40 nm to form the second hole-transport layer, whereby the hole-transport layer 112 was formed.

Over the hole-transport layer 112, 11-(4-[1,1'-biphenyl]-4-yl-6-phenyl-1,3,5-triazin-2-yl)-11,12-dihydro-12-phenyl-indolo[2,3-a]carbazole (abbreviation: BP-Icz(II)Tzn) represented by Structural Formula (xi), 3,3'-bis(9-phenyl-9H-carbazole) (abbreviation: PCCP) represented by Structural Formula (xii), and [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d3)]) represented by Structural Formula (xiii) were deposited by co-evaporation to a thickness of 40 nm such that the weight ratio of BP-Icz(II)Tzn to PCCP and [Ir(ppy)$_2$(mbfpypy-d3)] was 0.5:0.5:0.10, whereby the light-emitting layer 113 was formed.

Next, 2-[3'-(9,9-dimethyl-9H-fluoren-2-yl)-1,1'-biphenyl-3-yl]-4,6-diphenyl-1,3,5-triazine (abbreviation: mFBPTzn) represented by Structural Formula (v) was deposited by evaporation over the light-emitting layer 113 to a thickness of 10 nm, whereby a hole-blocking layer was formed.

After that, 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by Structural Formula (vi) and 8-quinolinolato-lithium (abbreviation: Liq) represented by Structural Formula (vii) were deposited by co-evaporation to a thickness of 25 nm such that the weight ratio of mPn-mDMePyPTzn to Liq was 1:1, whereby the electron-transport layer 114 was formed.

After the formation of the electron-transport layer 114, Liq was deposited by evaporation to a thickness of 1 nm to form the electron-injection layer 115, and lastly, aluminum was deposited by evaporation to a thickness of 200 nm to form the cathode 102. Thus, the OEL device 3-1 was fabricated.

(Method for Fabricating OEL Device 3-2)

An OEL device 3-2 was fabricated in the same manner as the OEL device 3-1 except that the second hole-transport layer was formed using N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) represented by Structural Formula (xiv) instead of mmtBumTPoFBi-04 used in the OEL device 3-1.

(Method for Fabricating Comparative OEL Device 3)

A comparative OEL device 3 was fabricated in the same manner as the OEL device 3-1 except that the second hole-transport layer was formed using N-(1,1'-biphenyl-2-yl)-N-(9,9-dimethyl-9H-fluoren-2-yl)-9,9'-spirobi[9H-fluoren]-4-amine (abbreviation: oFBiSF) represented by Structural Formula (xv) instead of mmtBumTPoFBi-04 in the OEL device 3-1.

The structures of the OEL device 3-1, the OEL device 3-2, and the comparative OEL device 3 are listed in the following table.

TABLE 13

| | Film thickness | OEL device 3-1 | OEL device 3-2 | Comparative OEL device 3 |
|---|---|---|---|---|
| Electron-injection layer | 1 nm | Liq | | |
| Electron-transport layer | 25 nm | mPn-mDMePyPTzn:Liq (1:1) | | |
| Hole-blocking layer | 10 nm | mFBPTzn | | |
| Light-emitting layer | 40 nm | BP-Icz(II)TznPCCP:[Ir(ppy)$_2$(mbfpypy-d3)] (0.5:0.5:0.10) | | |
| Hole-transport layer 2 | 40 nm | mmtBumTPchPAF-04 | mmtBuBioFBi | oFBiSF |
| Hole-transport layer 1 | 100 nm | mmtBumTPchPAF-04 | | |
| Hole-injection layer | 10 nm | mmtBumTPchPAF-04:OCHD-003 (1:0.1) | | |

The OEL devices 3-1 and 3-2 and the comparative OEL device 3 were sealed using a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the OEL devices were measured. Note that particular treatment for improving outcoupling efficiency was not performed on the glass substrate over which the OEL device was formed.

Figure 32:
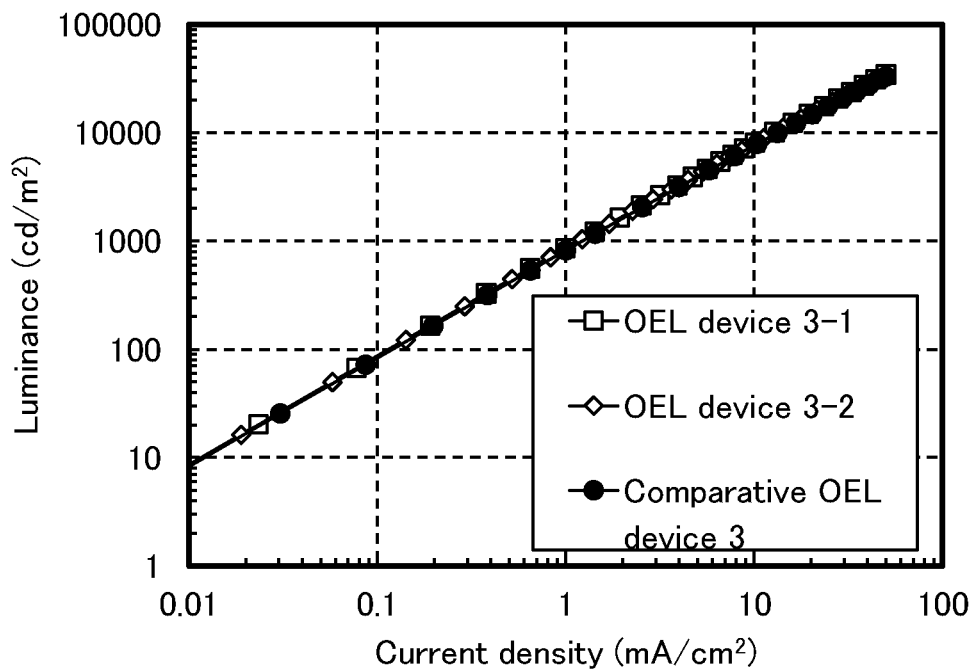
FIG. 32 shows the luminance-current density characteristics of an OEL device 3-1, an OEL device 3-2, and a comparative OEL device 3.
Figure 33:
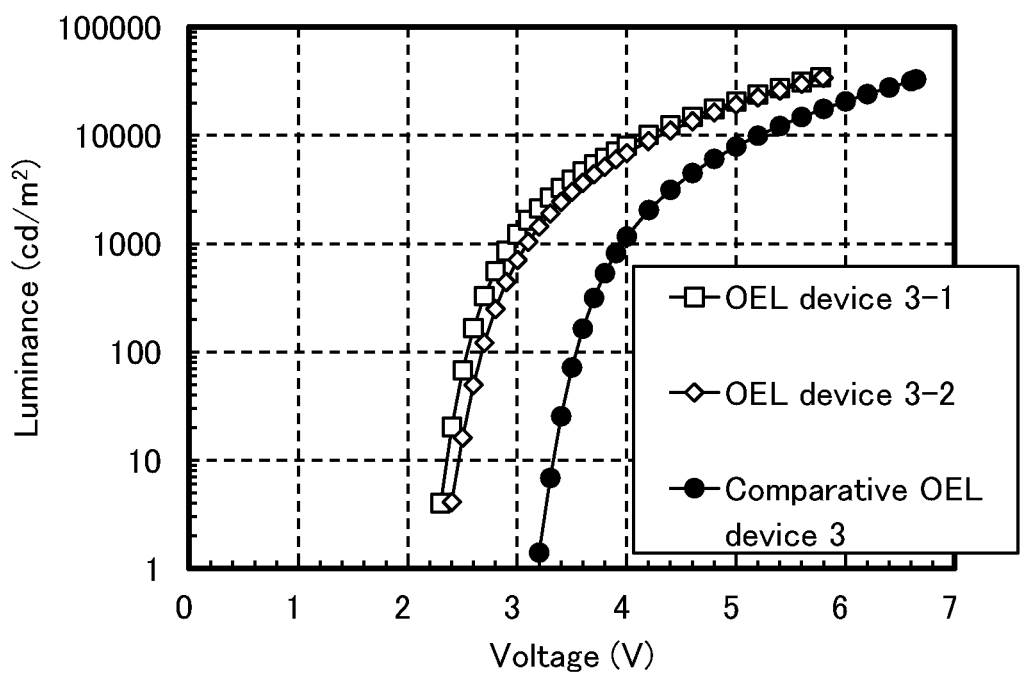
FIG. 33 shows the luminance-voltage characteristics of the OEL device 3-1, the OEL device 3-2, and the comparative OEL device 3.
Figure 34:
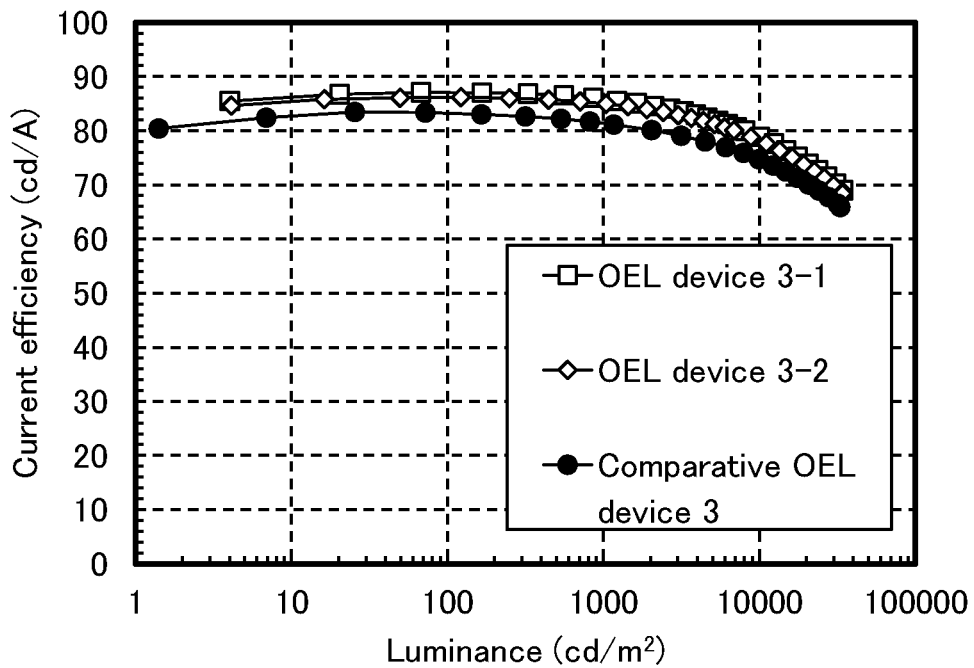
FIG. 34 shows the current efficiency-luminance characteristics of the OEL device 3-1, the OEL device 3-2, and the comparative OEL device 3.
Figure 35:
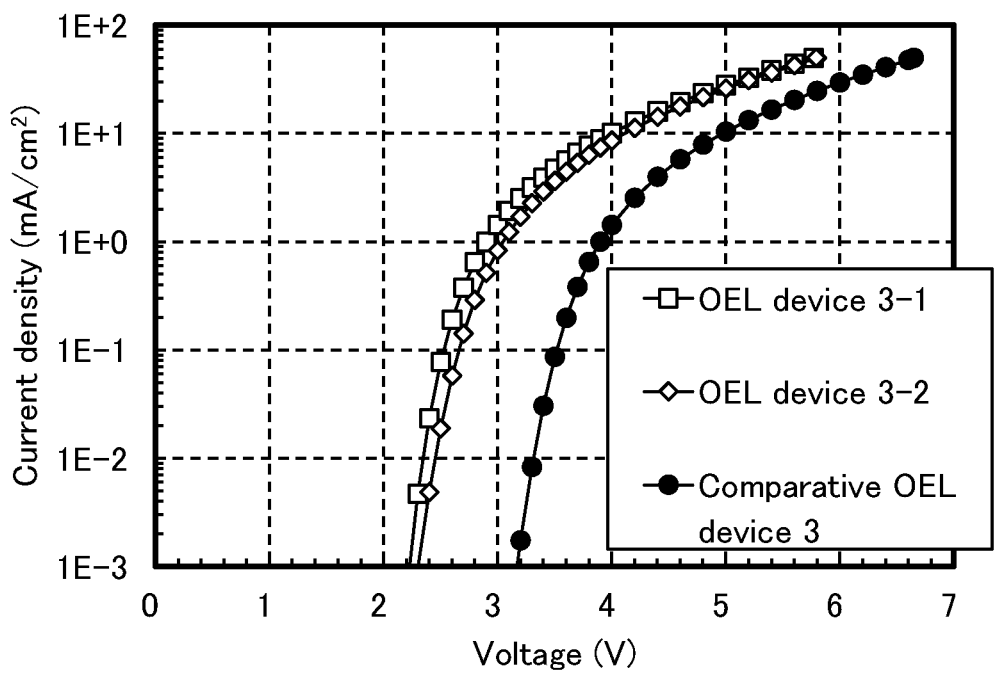
FIG. 35 shows the current density-voltage characteristics of the OEL device 3-1, the OEL device 3-2, and the comparative OEL device 3.
Figure 36:
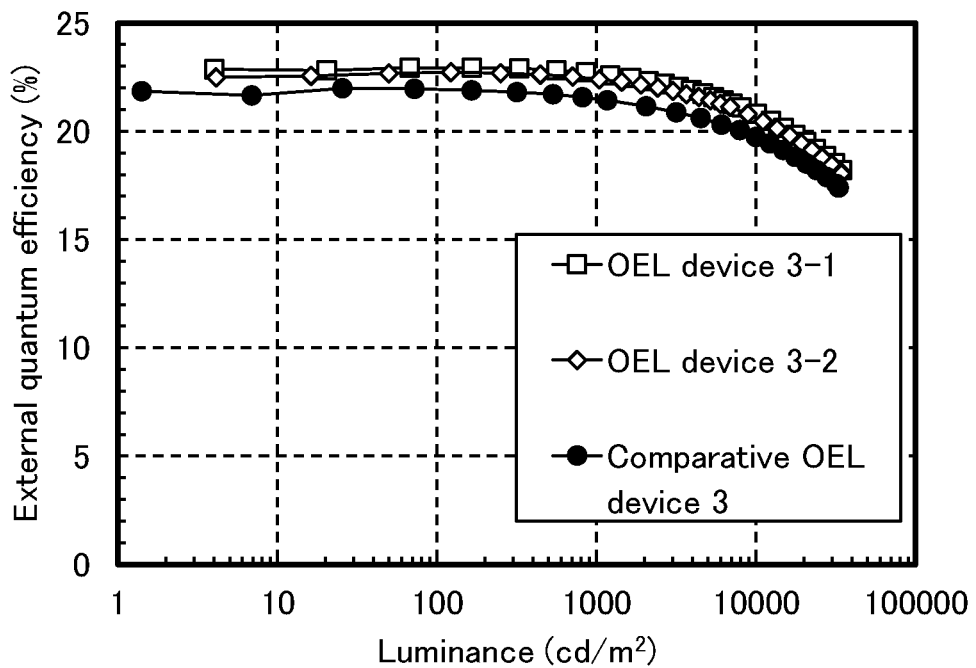
FIG. 36 shows the external quantum efficiency-luminance characteristics of the OEL device 3-1, the OEL device 3-2, and the comparative OEL device 3.
Figure 37:
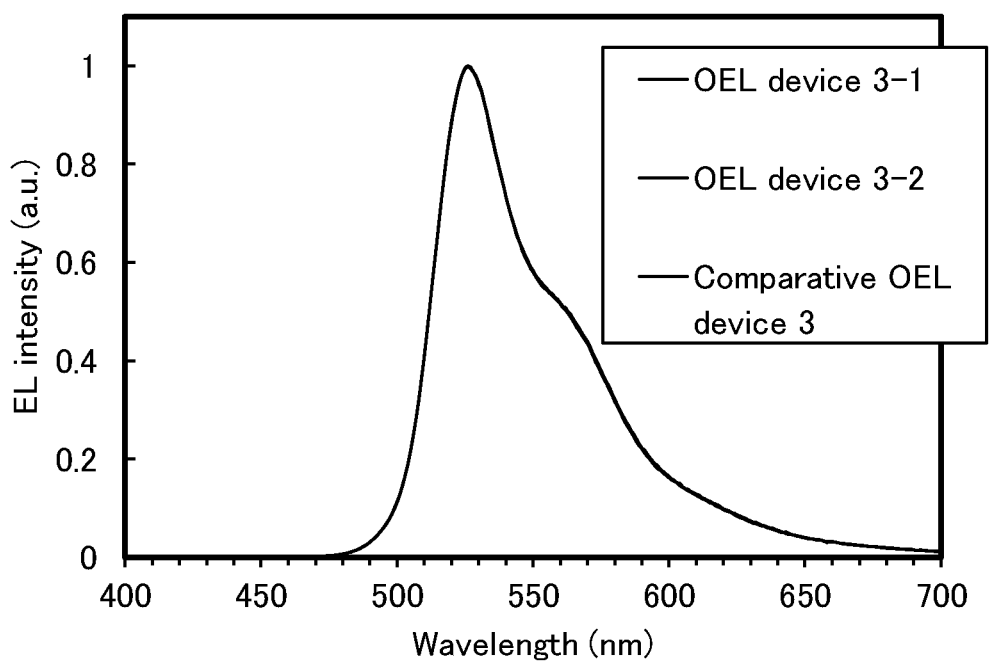
FIG. 37 shows emission spectra of the OEL device 3-1, the OEL device 3-2, and the comparative OEL device 3.

FIG. 32 shows the luminance-current density characteristics of the OEL devices 3-1 and 3-2 and the comparative OEL device 3. FIG. 33 shows the luminance-voltage characteristics of the OEL devices 3-1 and 3-2 and the comparative OEL device 3. FIG. 34 shows the current efficiency-luminance characteristics of the OEL devices 3-1 and 3-2 and the comparative OEL device 3. FIG. 35 shows the current density-voltage characteristics of the OEL devices 3-1 and 3-2 and the comparative OEL device 3. FIG. 36 shows the external quantum efficiency-luminance characteristics of the OEL devices 3-1 and 3-2 and the comparative OEL device 3. FIG. 37 shows the emission spectra of the OEL devices 3-1 and 3-2 and the comparative OEL device 3. Table 14 shows the main characteristics of the OEL devices at a luminance of approximately 1000 cd/m$^2$. Luminance, CIE chromaticity, and emission spectra were measured at normal temperature with a spectroradiometer (UR-UL1R produced by TOPCON TECHNOHOUSE CORPORATION). The external quantum efficiency was calculated from the measured luminance and emission spectra, on the assumption that the OEL devices had Lambertian light-distribution characteristics.

TABLE 14

| | Voltage (V) | Current (mA) | Current density (mA/cm²) | Chromaticity x | Chromaticity y | Current efficiency (cd/A) | External quantum efficiency (%) |
|---|---|---|---|---|---|---|---|
| OEL device 3-1 | 2.9 | 0.04 | 1.0 | 0.32 | 0.64 | 86.1 | 23 |
| OEL device 3-2 | 3.1 | 0.05 | 1.2 | 0.32 | 0.64 | 85.0 | 22 |
| Comparative OEL device 3 | 4.0 | 0.06 | 1.4 | 0.32 | 0.64 | 81.1 | 21 |

FIG. 32 to FIG. 37 and Table 14 show that the OEL device 3-1 and the OEL device 3-2 have favorable characteristics with much lower driving voltage than the comparative OEL device 3.

Here, the results of GSP (mV/nm) of the evaporated films of the hole-transport organic compounds used for the hole-transport layers in the OEL devices are summarized in the following table. The following table also shows a value (ΔGSP) obtained by subtracting GSP (GSP2) of the hole-transport organic compound (HTM2) used for the second hole-transport layer formed later from GSP (GSP1) of the hole-transport organic compound (HTM1) used for the first hole-transport layer formed first.

TABLE 15

| | OEL device 3-1 | OEL device 3-2 | Comparative OEL device 3 |
|---|---|---|---|
| HTM2 | mmtBumTPchPAF-04 | mmtBuBioFBi | oFBiSF |
| GSP2 (mV/nm) | 33.9 | 25.5 | 11.3 |

TABLE 15-continued

| | OEL device 3-1 | OEL device 3-2 | Comparative OEL device 3 |
|---|---|---|---|
| HUM | | mmtBumTPchPAF-04 | |
| GSP1 (mV/nm) | | 33.9 | |
| ΔGSP (mV/nm) | 0 | 8.4 | 22.6 |

As shown above, the comparative OEL device 3 has large ΔGSP, which implies that a poor property of hole injection from the first hole-transport layer to the second hole-transport layer increases driving voltage. By contrast, the OEL device 3-1 and the OEL device 3-2 of one embodiment of the present invention with small ΔGSP have favorable characteristics with low driving voltage.

Example 4

In this example, an OEL device of one embodiment of the present invention will be described in detail. Structural formulae of typical organic compounds used in this example are shown below.

[Chemical Formulae 7]

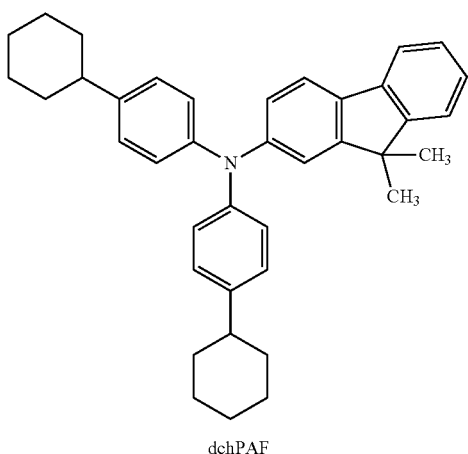

dchPAF

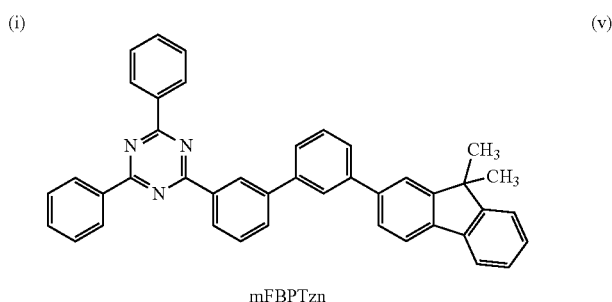

mFBPTzn

-continued
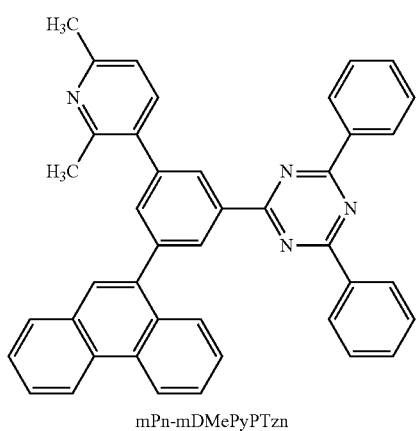
mPn-mDMePyPTzn
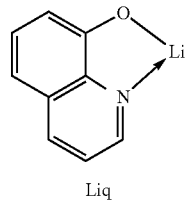
Liq
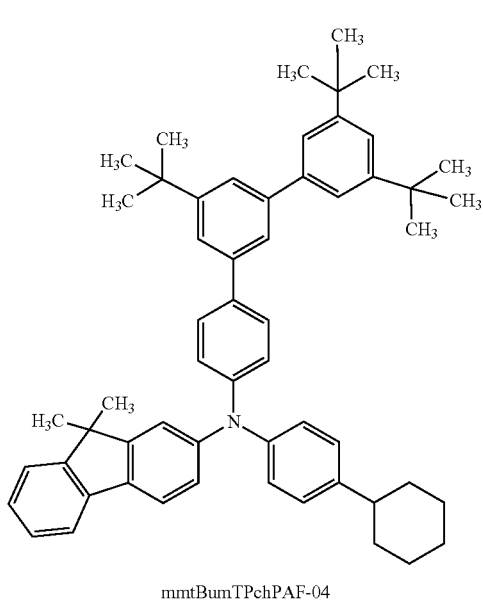
mmtBumTPchPAF-04
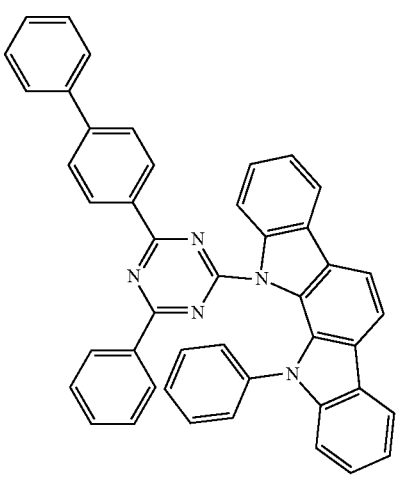
BP-Ic(II)Tzn
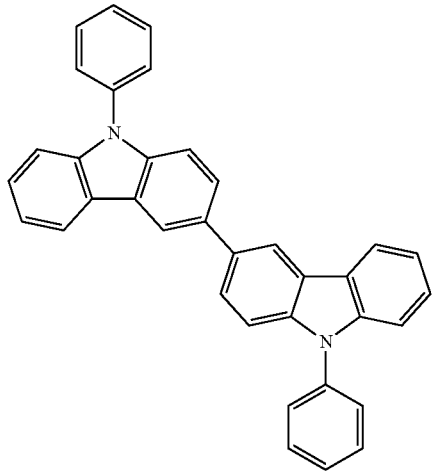
PCCP
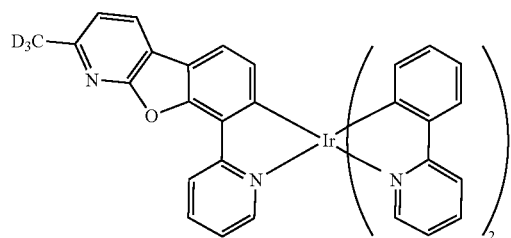
Ir(ppy)₂(mbfpypy-d3)

(Method for Fabricating OEL Device 4)

First, indium tin oxide containing silicon oxide (ITSO) was deposited over a glass substrate by a sputtering method to form the anode 101. The thickness of the anode 101 was 110 nm and the electrode area was 2 mm×2 mm.

Next, in pretreatment for forming the OEL device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, N,N-bis(4-cyclohexylphenyl)-9,9-dimethyl-9H-fluoren-2-amine (abbreviation: dchPAF) represented by Structural Formula (i) and an electron acceptor material (OCHD-003) having a molecular weight of 672 and containing fluorine were deposited by co-evaporation to a thickness of 10 nm over the anode 101 using a resistance-heating method such that the weight ratio of dchPAF to OCHD-003 was 1:0.1, whereby the hole-injection layer 111 was formed.

Next, over the hole-injection layer 111, dchPAF was deposited by evaporation to a thickness of 100 nm to form the first hole-transport layer, and then, N-(3",5',5"-tri-tert-butyl-1,1':3',1"-terphenyl-4-yl)-N-(4-cyclohexylphenyl)-9,9-dimethyl-9H-fluoren-2-amine (abbreviation: mmtBumTPchPAF-04) represented by Structural Formula (x) was deposited by evaporation to a thickness of 40 nm to form the second hole-transport layer, whereby the hole-transport layer 112 was formed.

Over the hole-transport layer 112, 11-(4-[1,1'-biphenyl]-4-yl-6-phenyl-1,3,5-triazin-2-yl)-11,12-dihydro-12-phenyl-indolo[2,3-a]carbazole (abbreviation: BP-Icz(II)Tzn) represented by Structural Formula (xi), 3,3'-bis(9-phenyl-9H-carbazole) (abbreviation: PCCP) represented by Structural Formula (xii), and [2-d3-methyl-(2-pyridinyl-κN)benzofuro[2,3-b]pyridine-κC]bis[2-(2-pyridinyl-κN)phenyl-κC] iridium(III) (abbreviation: [Ir(ppy)$_2$(mbfpypy-d3)]) represented by Structural Formula (xiii) were deposited by co-evaporation to a thickness of 40 nm such that the weight ratio of BP-Icz(II)Tzn to PCCP and [Ir(ppy)$_2$(mbfpypy-d3)] was 0.5:0.5:0.10, whereby the light-emitting layer 113 was formed.

Next, 2-[3'-(9,9-dimethyl-9H-fluoren-2-yl)-1,1'-biphenyl-3-yl]-4,6-diphenyl-1,3,5-triazine (abbreviation: mFBPTzn) represented by Structural Formula (v) was deposited by evaporation over the light-emitting layer 113 to a thickness of 10 nm, whereby a hole-blocking layer was formed.

After that, 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by Structural Formula (vi) and 8-quinolinolato-lithium (abbreviation: Liq) represented by Structural Formula (vii) were deposited by co-evaporation to a thickness of 25 nm such that the weight ratio of mPn-mDMePyPTzn to Liq was 1:1, whereby the electron-transport layer 114 was formed.

After the formation of the electron-transport layer 114, Liq was deposited by evaporation to a thickness of 1 nm to form the electron-injection layer 115, and lastly, aluminum was deposited by evaporation to a thickness of 200 nm to form the cathode 102. Thus, the OEL device 4 was fabricated.

The structure of the OEL device 4 is listed in the following table.

TABLE 16

|  |  | Film thickness | OEL device 4 |
|---|---|---|---|
| Electron-injection layer |  | 1 nm | Liq |
| Electron-transport layer |  | 25 nm | mPn-mDMePyPTzn:Liq (1:1) |
| Hole-blocking layer |  | 10 nm | mFBPTzn |
| Light-emitting layer |  | 40 nm | BP-Icz(II)Tzn:PCCP:Ir(ppy)$_2$ (mbfpypy-d3)(0.5:0.5:0.10) |
| Hole-transport layer | 2 | 40 nm | mmtBumTPchPAF-04 |
|  | 1 | 100 nm | dchPAF |
| Hole-injection layer |  | 10 nm | dchPAF:OCHD-003 (1:0.1) |

The OEL device 4 was sealed using a glass substrate in a glove box containing a nitrogen atmosphere so as not to be exposed to the air (a sealing material was applied to surround the device and UV treatment and heat treatment at 80° C. for one hour were performed at the time of sealing). Then, the initial characteristics of the OEL device were measured. Note that particular treatment for improving outcoupling efficiency was not performed on the glass substrate over which the OEL device was formed.

Figure 38:
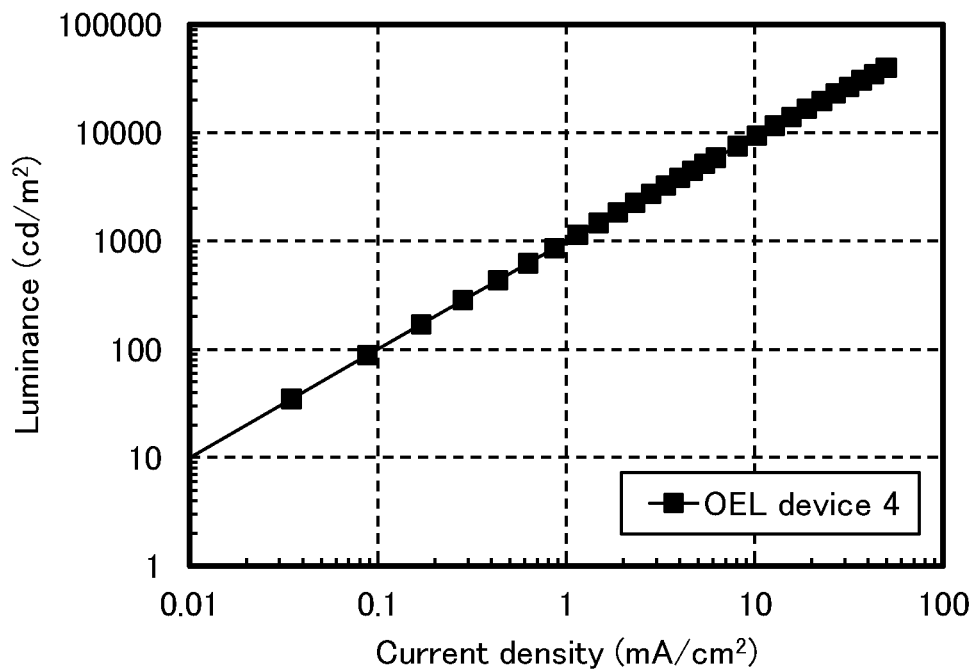
FIG. 38 shows the luminance-current density characteristics of an OEL device 4.
Figure 39:
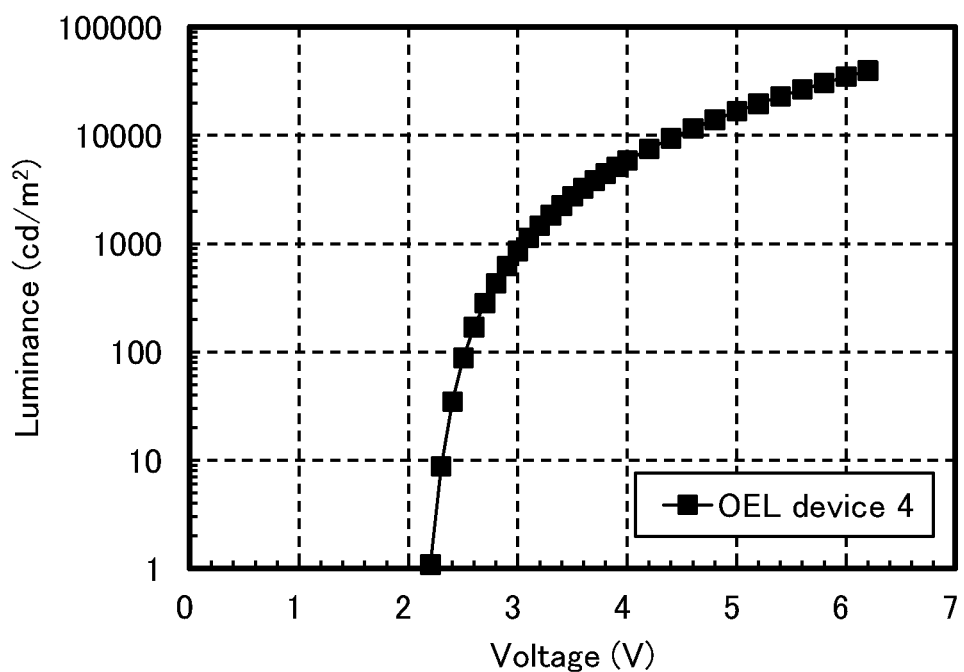
FIG. 39 shows the luminance-voltage characteristics of the OEL device 4.
Figure 40:
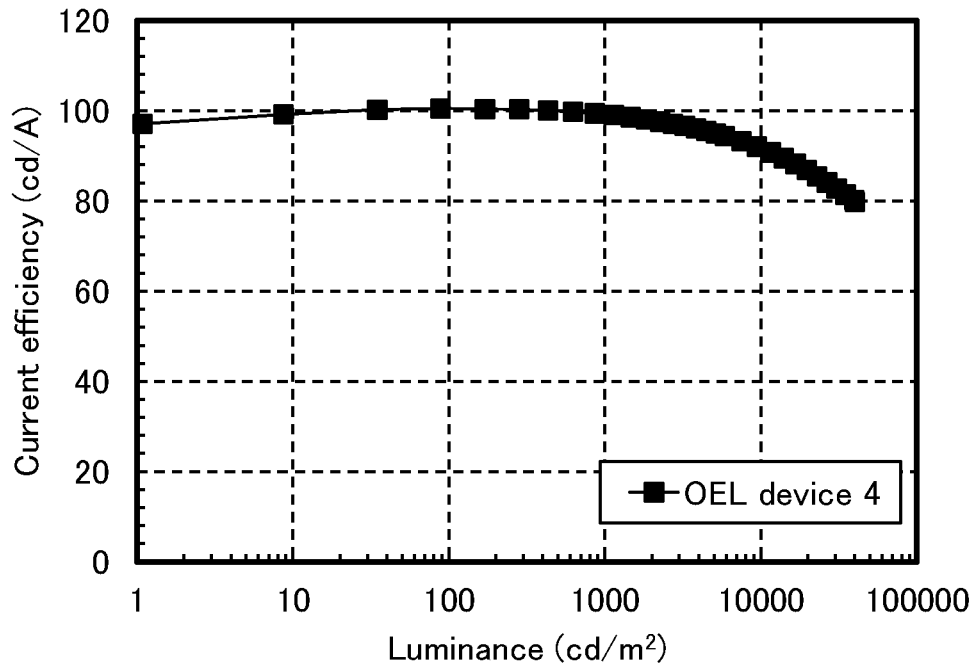
FIG. 40 shows the current efficiency-luminance characteristics of the OEL device 4.
Figure 41:
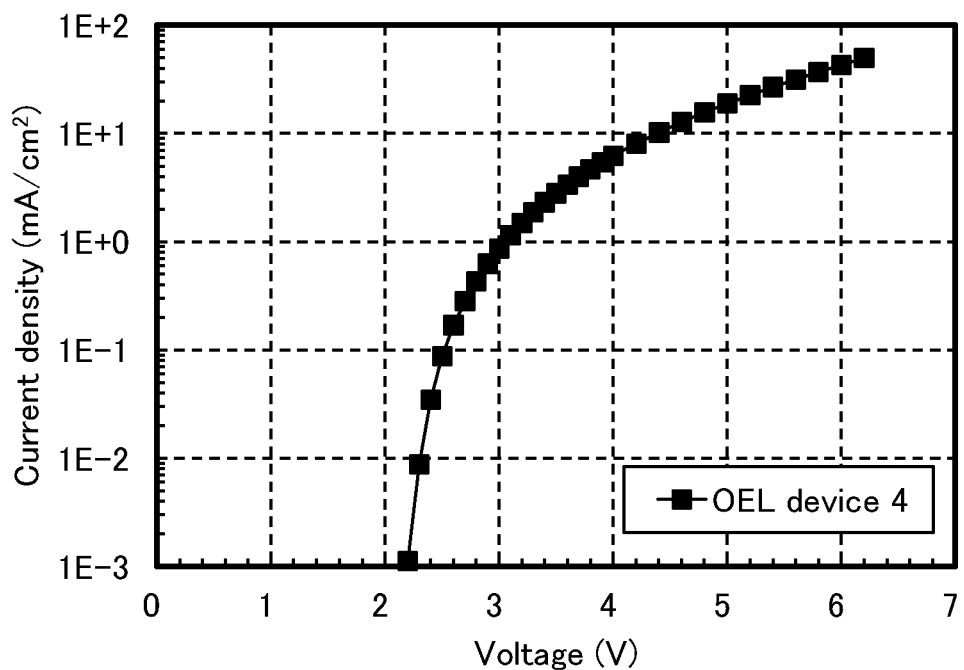
FIG. 41 shows the current density-voltage characteristics of the OEL device 4.
Figure 42:
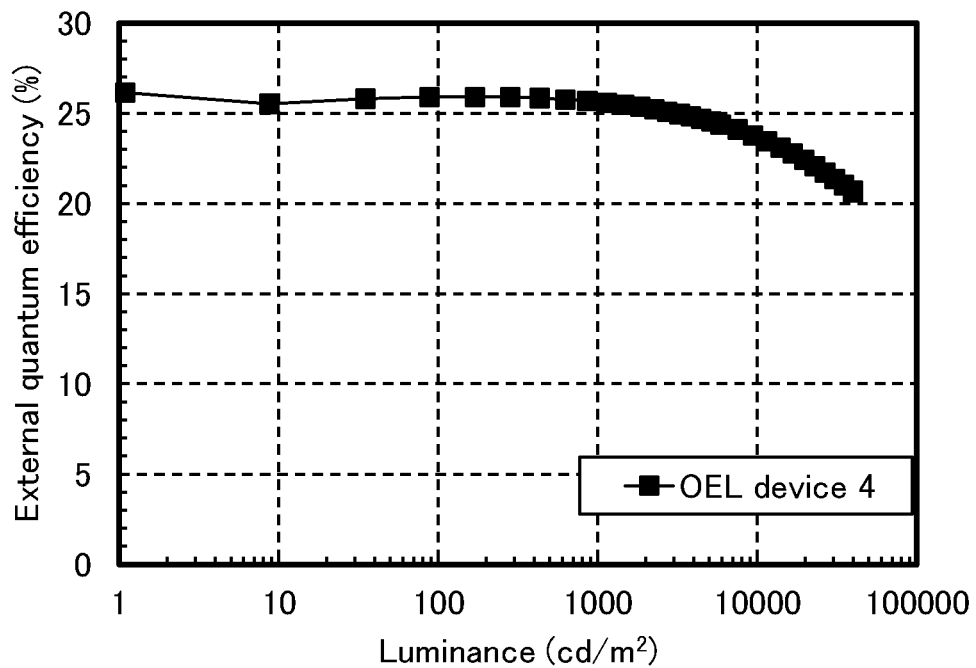
FIG. 42 shows the external quantum efficiency-luminance characteristics of the OEL device 4.
Figure 43:
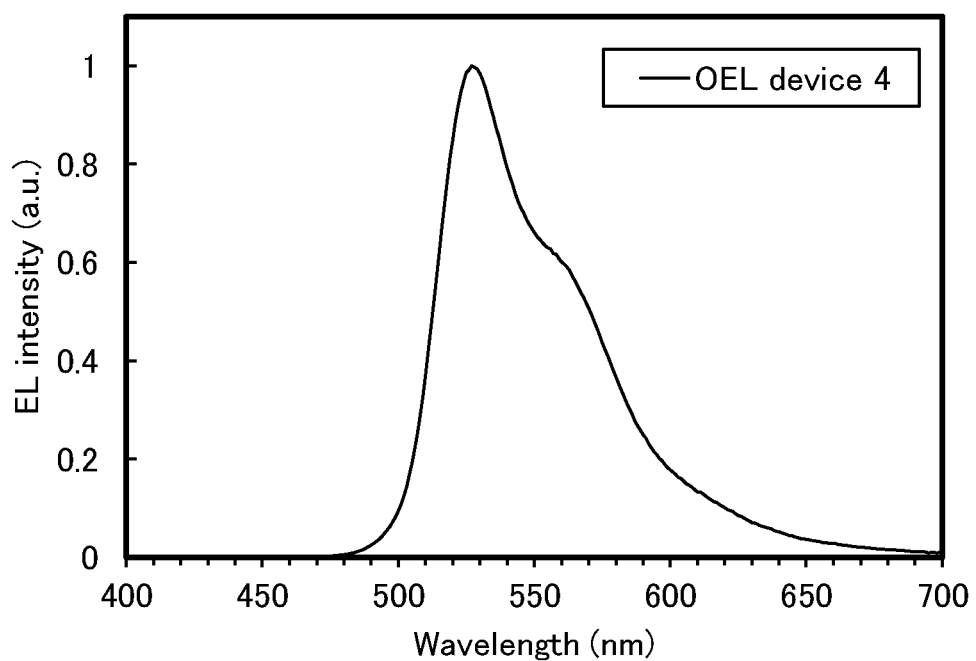
FIG. 43 shows an emission spectrum of the OEL device 4.

FIG. 38 shows the luminance-current density characteristics of the OEL device 4. FIG. 39 shows the luminance-voltage characteristics of the OEL device 4. FIG. 40 shows the current efficiency-luminance characteristics of the OEL device 4. FIG. 41 shows the current density-voltage characteristics of the OEL device 4. FIG. 42 shows the external quantum efficiency-luminance characteristics of the OEL device 4. FIG. 43 shows the emission spectrum of the OEL device 4. Table 17 shows the main characteristics of the OEL device 4 at a luminance of approximately 1000 cd/m$^2$. Luminance, CIE chromaticity, and emission spectra were measured at normal temperature with a spectroradiometer (UR-UL1R produced by TOPCON TECHNOHOUSE CORPORATION). The external quantum efficiency was calculated from the measured luminance and emission spectra, on the assumption that the OEL device had Lambertian light-distribution characteristics.

TABLE 17

|  | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| OEL device 4 | 3.1 | 0.05 | 1.1 | 0.33 | 0.64 | 99.0 | 26 |

FIG. 38 to FIG. 43 and Table 17 show that the OEL device 4 has favorable characteristics with low driving voltage.

Here, the results of GSP (mV/nm) of the evaporated films of the hole-transport organic compounds used for the hole-transport layers in the OEL device 4 are summarized in the following table. The following table also shows a value (ΔGSP) obtained by subtracting GSP (GSP2) of the hole-transport organic compound (HTM2) used for the second hole-transport layer formed later from GSP (GSP1) of the hole-transport organic compound (HTM1) used for the first hole-transport layer formed first.

TABLE 18

| | OEL device 4 |
|---|---|
| HTM2 | mmtBumTPchPAF-04 |
| GSP2 (mV/nm) | 33.9 |

TABLE 18-continued

| | OEL device 4 |
|---|---|
| HTM1 | dchPAF |
| GSP1 (mV/nm) | 22.4 |
| ΔGSP (mV/nm) | −11.5 |

As shown above, the OEL device 4 of one embodiment of the present invention with small ΔGSP has favorable characteristics with low driving voltage.

Example 5

In this example, OEL devices of one embodiment of the present invention and a comparative OEL device will be described in detail. Structural formulae of typical organic compounds used in this example are shown below.

[Chemical Formulae 8]

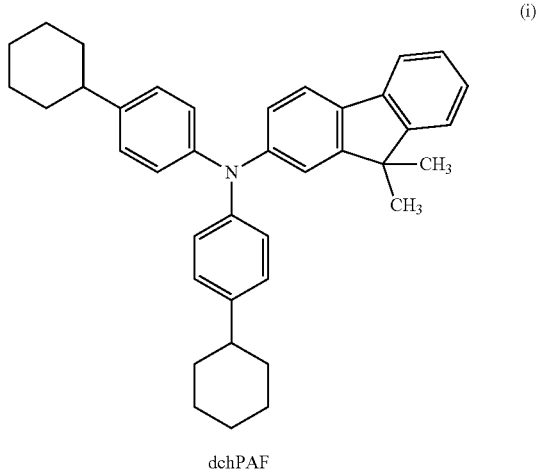

(i)

dchPAF

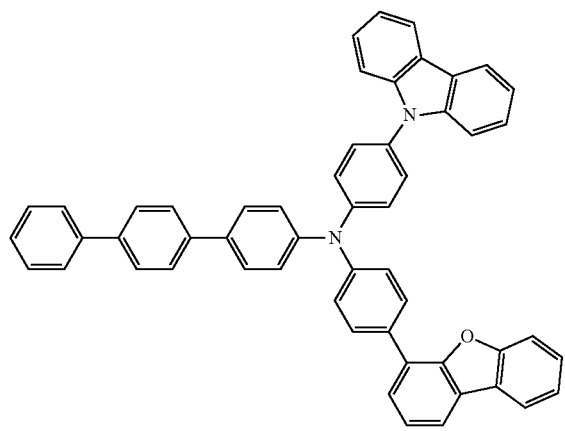

(ii)

YGTPDBfB

-continued
(iii)
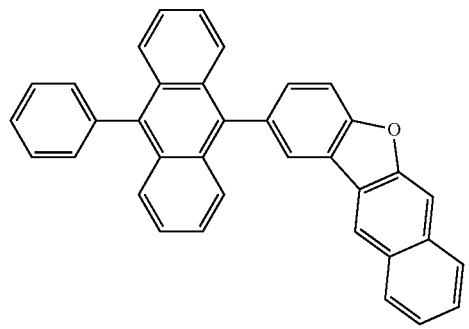
Bnf(II)PhA
(iv)
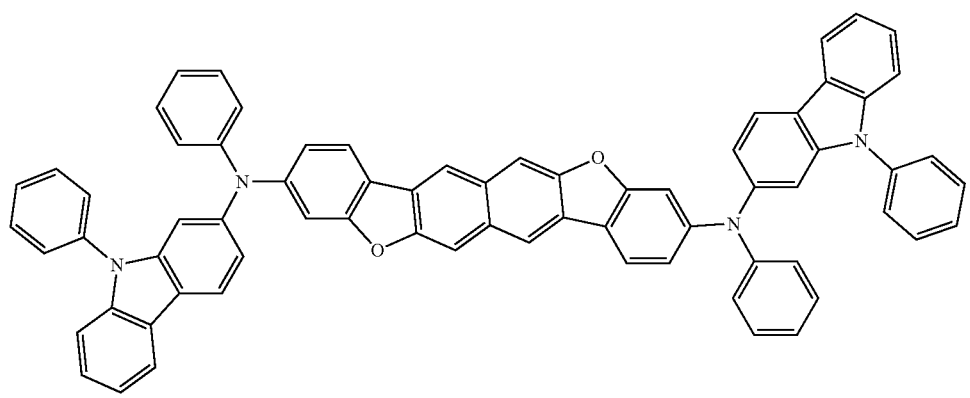
3,10PCA2Nbf(IV)-02
(v)
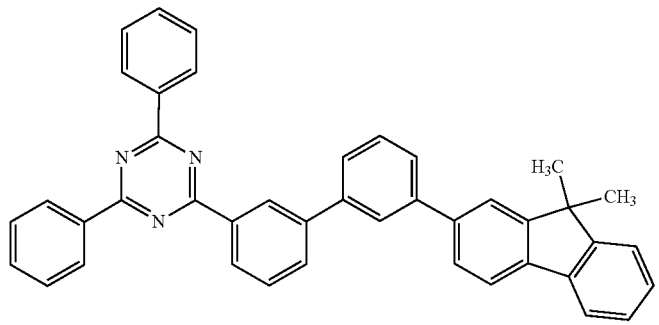
mFBPTzn
(vi)
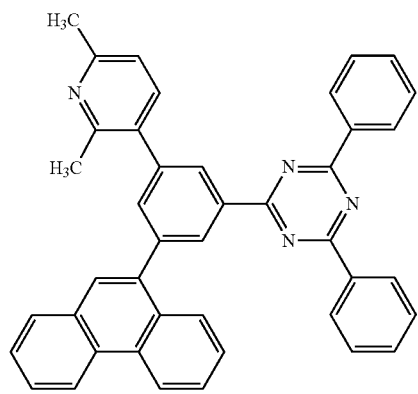
mPn-mDMePyPTzn -continued

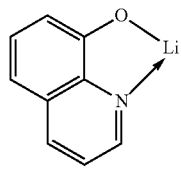

Liq (vii)

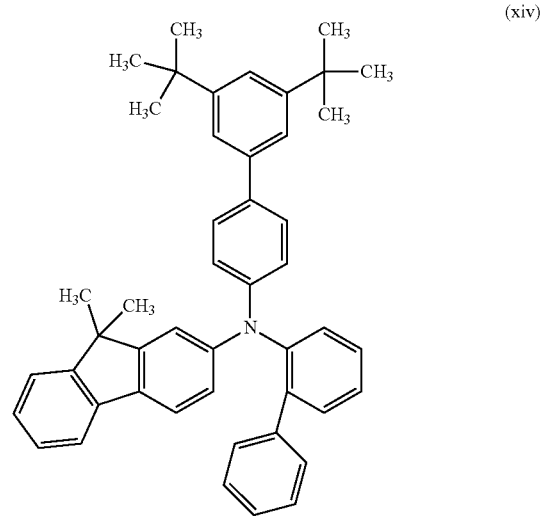

mmtBuBioFBi (xiv)

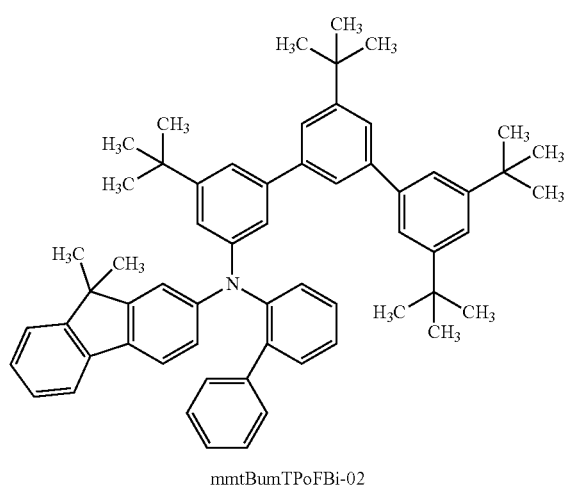

mmtBumTPoFBi-02

(xvi)

(Method for Fabricating OEL Device 5-1)

First, indium tin oxide containing silicon oxide (ITSO) was deposited over a glass substrate by a sputtering method to form the anode 101. The thickness of the anode 101 was 55 nm and the electrode area was 2 mm×2 mm.

Next, in pretreatment for forming the OEL device over a substrate, a surface of the substrate was washed with water and baked at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, N,N-bis(4-cyclohexylphenyl)-9,9-dimethyl-9H-fluoren-2-amine (abbreviation: dchPAF) represented by Structural Formula (i) and an electron acceptor material (OCHD-003) having a molecular weight of 672 and containing fluorine were deposited by co-evaporation to a thickness of 10 nm over the anode 101 using a resistance-heating method such that the weight ratio of dchPAF to OCHD-003 was 1:0.1, whereby the hole-injection layer 111 was formed.

Next, dchPAF was deposited by evaporation over the hole-injection layer 111 to a thickness of 120 nm to form the first hole-transport layer, and then N-[4-(9H-carbazol-9-yl)phenyl]-N-[4-(4-dibenzofuranyl)phenyl]-[1,1':4',1''-terphenyl]-4-amine (abbreviation: YGTPDBfB) represented by Structural Formula (ii) was deposited by evaporation to a thickness of 10 nm, whereby the hole-transport layer 112 was formed.

Over the hole-transport layer 112, 2-(10-phenyl-9-anthracenyl)-benzo[b]naphtho[2,3-d]furan (abbreviation: Bnf(II)PhA) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were deposited by co-evaporation to a thickness of 25 nm such that the weight ratio of Bnf(II)PhA to 3,10PCA2Nbf(IV)-02 was 1:0.015, whereby the light-emitting layer 113 was formed.

Next, 2-[3'-(9,9-dimethyl-9H-fluoren-2-yl)-1,1'-biphenyl-3-yl]-4,6-diphenyl-1,3,5-triazine (abbreviation: mFBPTzn) represented by Structural Formula (v) was deposited by evaporation over the light-emitting layer 113 to a thickness of 10 nm, whereby a hole-blocking layer was formed.

After that, 2-[3-(2,6-dimethyl-3-pyridinyl)-5-(9-phenanthrenyl)phenyl]-4,6-diphenyl-1,3,5-triazine (abbreviation: mPn-mDMePyPTzn) represented by Structural Formula (vi) and 8-quinolinolato-lithium (abbreviation: Liq) represented by Structural Formula (vii) were deposited by co-evaporation to a thickness of 20 nm such that the weight ratio of mPn-mDMePyPTzn to Liq was 1:1, whereby the electron-transport layer 114 was formed.

After the formation of the electron-transport layer 114, Liq was deposited by evaporation to a thickness of 1 nm to form the electron-injection layer 115, and lastly, aluminum was deposited by evaporation to a thickness of 200 nm to form the cathode 102. Thus, the OEL device 5-1 was fabricated.

(Method for Fabricating OEL Device 5-2)

An OEL device 5-2 was fabricated in the same manner as the OEL device 5-1 except that dchPAF in the OEL device 5-1 was replaced with N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) represented by Structural Formula (xiv).

(Method for Fabricating Comparative OEL Device 5)

A comparative OEL device 5 was fabricated in the same manner as the OEL device 5-1 except that dchPAF in the OEL device 5-1 was replaced with N-(1,1'-biphenyl-2-yl)-N-(3,3'',5',5''-tetra-t-butyl-1,1':3',1''-terphenyl-5-yl)-9,9-dimethyl-9H-fluoren-2-amine (abbreviation: mmtBumTPoFBi-02) represented by Structural Formula (xvi).

The structures of the OEL device 5-1, the OEL device 5-2, and the comparative OEL device 5 are listed in the following table.

TABLE 19

|  | Film thickness | OEL device 5-1 | OEL device 5-2 | Comparative OEL device 5 |
| --- | --- | --- | --- | --- |
| Electron-injection layer | 1 nm | Liq | | |
| Electron-transport layer | 20 nm | mPn-mDMePyPTzaLiq (1:1) | | |
| Hole-blocking layer | 10 nm | mFBPTzn | | |
| Light-emitting layer | 25 nm | Bnf(II)PhA:3,10PCA2Nbf(IV)-02 (1:0.015) | | |
| Hole-transport layer 2 | 10 nm | YGTPDBfB | | |
| Hole-transport layer 1 | 120 nm | dchPAF | mmtBuBioFBi | mmtBumTPoFBi-02 |
| Hole-injection layer | 10 nm | dchPAF: OCHD-003 (1:0.1) | mmtBuBioFBi: OCHD-003 (1:0.1) | mmtBumTPoFBi-02: OCHD-003 (1:0.1) |

The OEL devices 5-1 and 5-2 and the comparative OEL device 5 were sealed using a glass substrate in a glove box containing a nitrogen atmosphere so as not to be exposed to the air (a sealing material was applied to surround the devices and UV treatment and heat treatment at 80° C. for one hour were performed at the time of sealing). Then, the initial characteristics of the OEL devices were measured. Note that particular treatment for improving outcoupling efficiency was not performed on the glass substrate over which the OEL device was formed.

Figure 44:
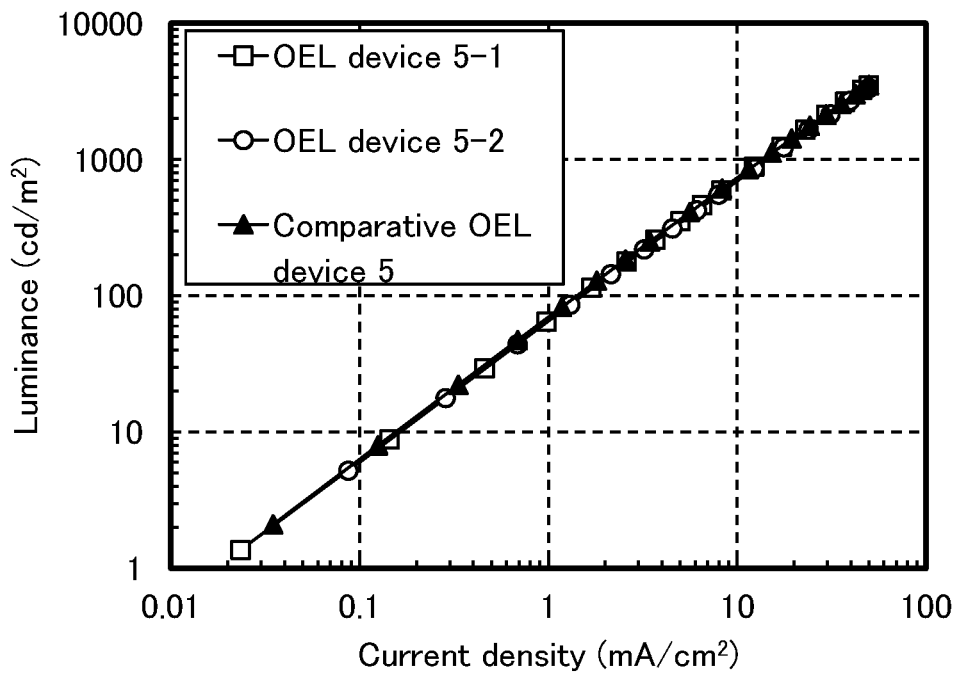
FIG. 44 shows the luminance-current density characteristics of an OEL device 5-1, an OEL device 5-2, and a comparative OEL device 5.
Figure 45:
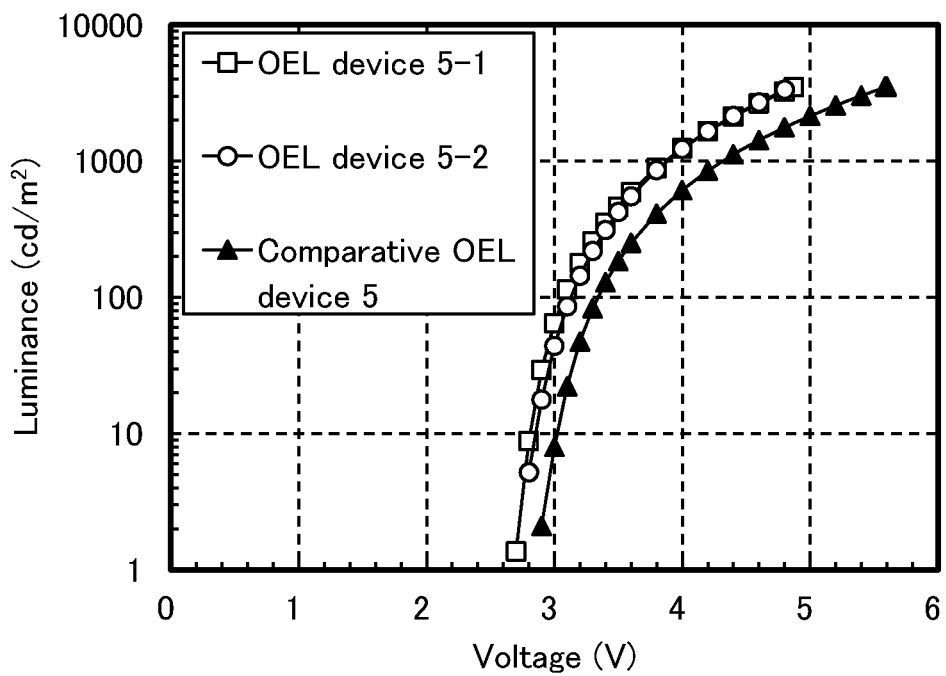
FIG. 45 shows the luminance-voltage characteristics of the OEL device 5-1, the OEL device 5-2, and the comparative OEL device 5.
Figure 46:
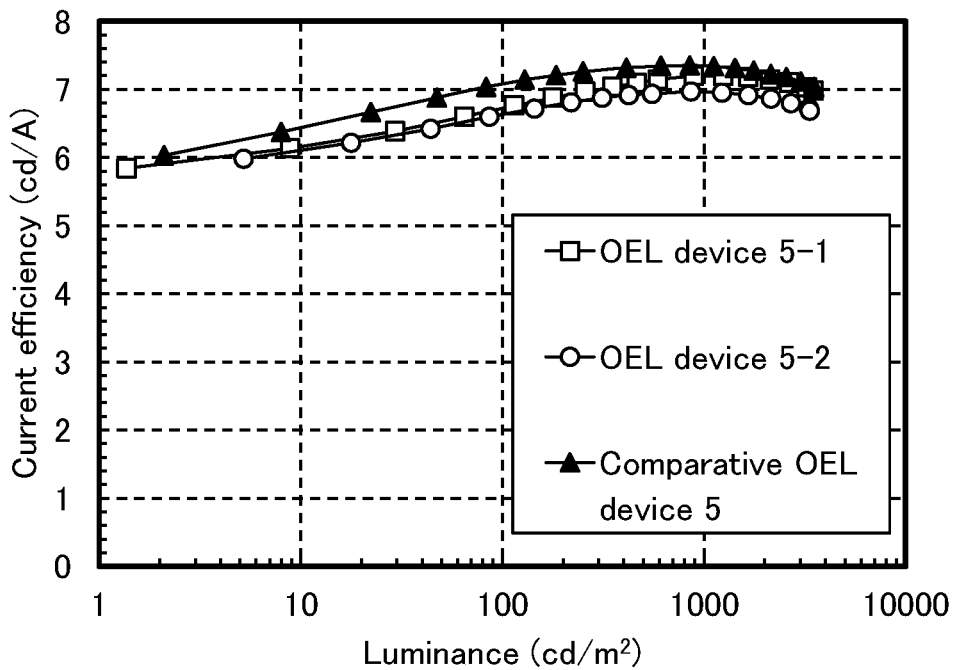
FIG. 46 shows the current efficiency-luminance characteristics of the OEL device 5-1, the OEL device 5-2, and the comparative OEL device 5.
Figure 47:
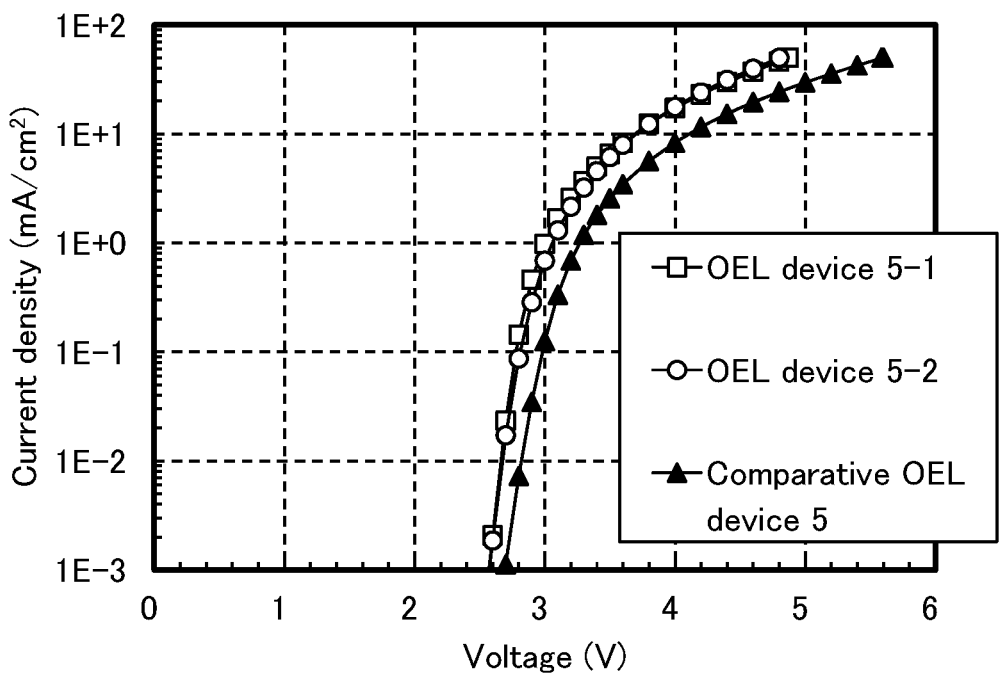
FIG. 47 shows the current density-voltage characteristics of the OEL device 5-1, the OEL device 5-2, and the comparative OEL device 5.
Figure 48:
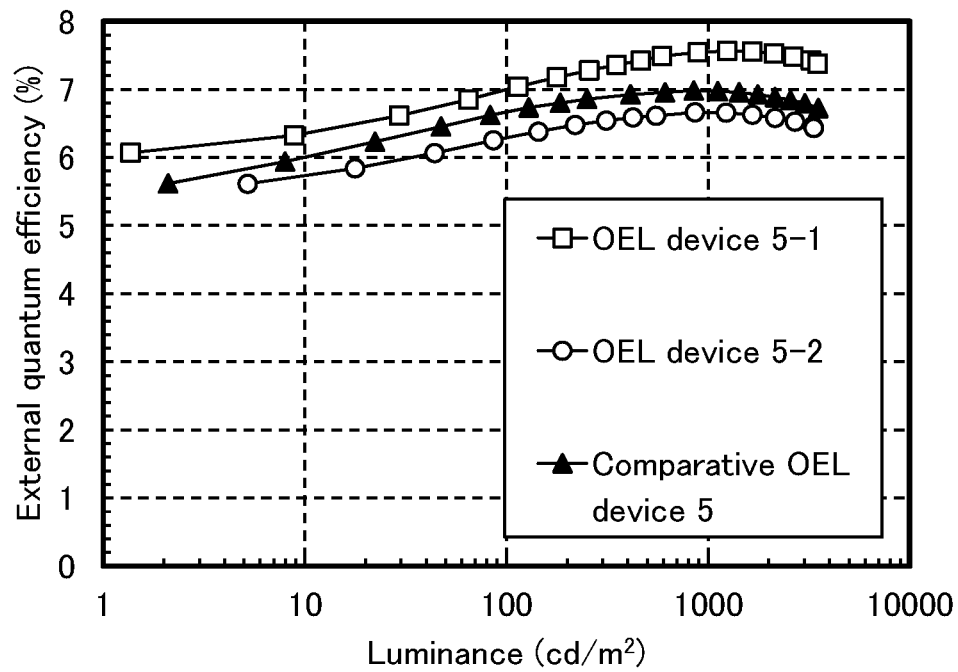
FIG. 48 shows the external quantum efficiency-luminance characteristics of the OEL device 5-1, the OEL device 5-2, and the comparative OEL device 5.
Figure 49:
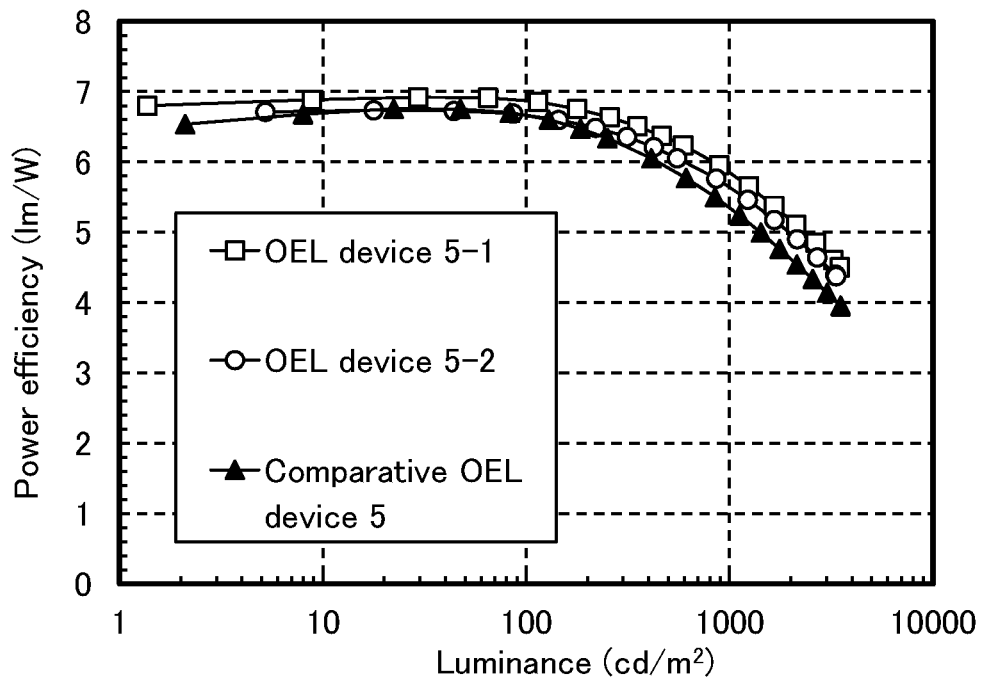
FIG. 49 shows the power efficiency-luminance characteristics of the OEL device 5-1, the OEL device 5-2, and the comparative OEL device 5.
Figure 50:
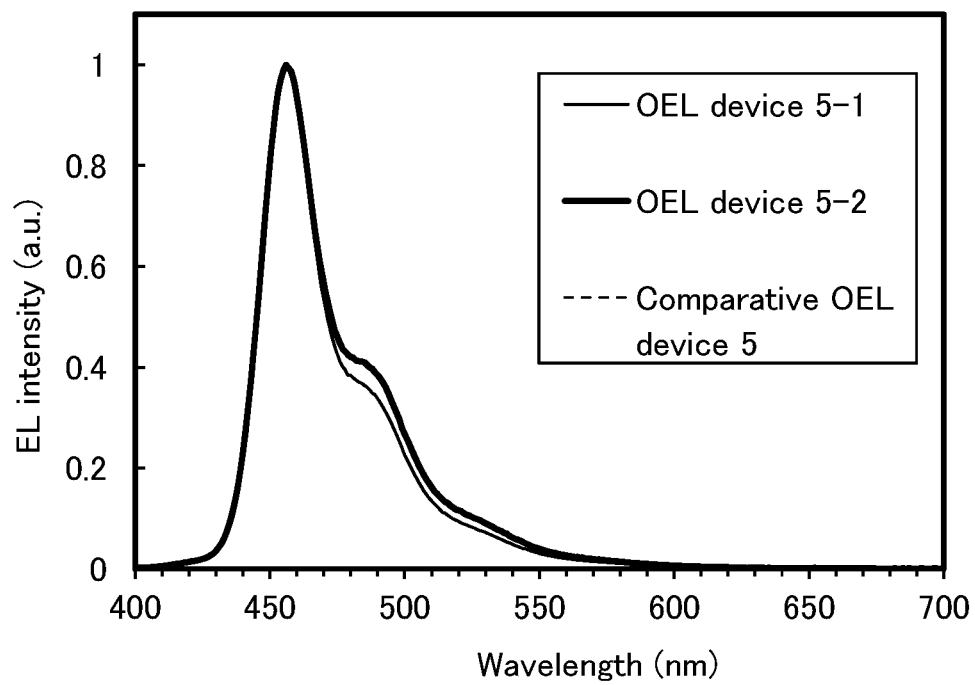
FIG. 50 shows emission spectra of the OEL device 5-1, the OEL device 5-2, and the comparative OEL device 5.

FIG. 44 shows the luminance-current density characteristics of the OEL device 5-1, the OEL device 5-2, and the comparative OEL device 5. FIG. 45 shows the luminance-voltage characteristics of the OEL device 5-1, the OEL device 5-2, and the comparative OEL device 5. FIG. 46 shows the current efficiency-luminance characteristics of the OEL device 5-1, the OEL device 5-2, and the comparative OEL device 5. FIG. 47 shows the current density-voltage characteristics of the OEL device 5-1, the OEL device 5-2, and the comparative OEL device 5. FIG. 48 shows the external quantum efficiency-luminance characteristics of the OEL device 5-1, the OEL device 5-2, and the comparative OEL device 5. FIG. 49 shows the power efficiency-luminance characteristics of the OEL device 5-1, the OEL device 5-2, and the comparative OEL device 5. FIG. 50 shows the emission spectra of the OEL device 5-1, the OEL device 5-2, and the comparative OEL device 5. Table 20 shows the main characteristics of the OEL device 5-1, the OEL device 5-2, and the comparative OEL device 5 at a luminance of approximately 1000 cd/m². Luminance, CIE chromaticity, and emission spectra were measured at normal temperature with a spectroradiometer (UR-UL1R produced by TOPCON TECHNOHOUSE CORPORATION). The external quantum efficiency was calculated from the measured luminance and emission spectra, on the assumption that the OEL devices had Lambertian light-distribution characteristics.

TABLE 20

| | Voltage (V) | Current (mA) | Current density (mA/cm²) | Chromaticity x | Chromaticity y | Current efficiency (cd/A) | Power efficiency (lm/W) | External quantum efficiency (%) |
|---|---|---|---|---|---|---|---|---|
| OEL device 5-1 | 3.8 | 0.49 | 12.3 | 0.14 | 0.11 | 7.2 | 6.0 | 8 |
| OEL device 5-2 | 3.8 | 0.49 | 12.3 | 0.14 | 0.12 | 7.0 | 5.8 | 7 |
| Comparative OEL device 5 | 4.4 | 0.61 | 15.2 | 0.14 | 0.12 | 7.3 | 5.2 | 7 |

FIG. 44 to FIG. 50 and Table 20 show that the OEL device 5-1 and the OEL device 5-2 have favorable characteristics with lower driving voltage and higher power efficiency than the comparative OEL device 5.

Here, the results of GSP (mV/nm) of the evaporated films of the hole-transport organic compounds used for the hole-transport layers in the OEL devices are summarized in the following table. The following table also shows a value (ΔGSP) obtained by subtracting GSP (GSP2) of the hole-transport organic compound (HTM2) used for the second hole-transport layer formed later from GSP (GSP1) of the hole-transport organic compound (HTM1) used for the first hole-transport layer formed first.

TABLE 21

| | OEL device 5-1 | OEL device 5-2 | Comparative OEL device 5 |
|---|---|---|---|
| HTM2 | | YGTPDBfB | |
| GSP2 (mV/nm) | | 8.7 | |
| HTM1 | dchPAF | mmtBuBioFBi | mmtBumTPoFBi-02 |
| GSP1 (mV/nm) | 22.4 | 25.5 | 32.8 |
| ΔGSP (mV/nm) | 13.7 | 16.8 | 24.1 |

As shown above, the comparative OEL device 5 has large ΔGSP, which implies that a poor property of hole injection from the first hole-transport layer to the second hole-transport layer increases driving voltage. By contrast, the OEL devices 5-1 and 5-2 of one embodiment of the present invention with small ΔGSP have low driving voltage. Thus, the current efficiency of the OEL device 5-1 and the current efficiency and external quantum efficiency of the OEL device 5-2 are lower than those of the comparative OEL device 5 as shown in FIG. 46 and FIG. 48, but the power efficiency of the OEL devices 5-1 and 5-2 is higher than that of the comparative OEL device 5 as shown in FIG. 49.

Reference Example 1

Reference Synthesis Example 1

In this reference example, a method for synthesizing N,N-bis(4-cyclohexylphenyl)-9,9-dimethyl-9H-fluoren-2-amine (abbreviation: dchPAF) used in the example will be described. The structure of dchPAF is shown below.

[Chemical Formula 9]

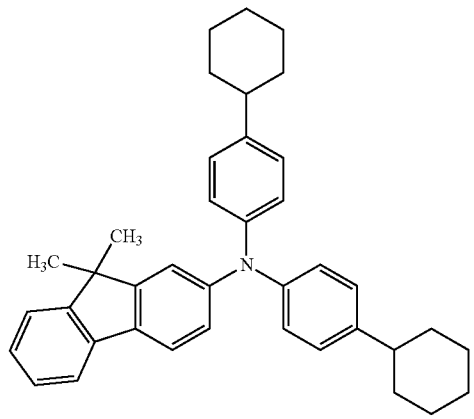

Step 1: Synthesis of N,N-bis(4-cyclohexylphenyl)-9,9-dimethyl-9H-fluoren-2-amine (Abbreviation: dchPAF)

In a three-neck flask were put 10.6 g (51 mmol) of 9,9-dimethyl-9H-fluoren-2-amine, 18.2 g (76 mmol) of 4-cyclohexyl-1-bromobenzene, 21.9 g (228 mmol) of sodium-tert-butoxide, and 255 mL of xylene. The mixture was degassed under reduced pressure, and then the air in the flask was replaced with nitrogen. The mixture was stirred while being heated to approximately 50° C. Then, 370 mg (1.0 mmol) of allylpalladium(II) chloride dimer (abbreviation: [(Allyl)PdCl]2) and 1660 mg (4.0 mmol) of di-tert-butyl(1-methyl-2,2-diphenylcyclopropyl)phosphine (abbreviation: cBRIDP (registered trademark)) were added, and the mixture was heated at 120° C. for approximately 5 hours. After that, the temperature of the flask was lowered to approximately 60° C., and approximately 4 mL of water was added to the mixture, so that a solid was precipitated. The precipitated solid was separated by filtration. The filtrate was concentrated, and the obtained solution was purified by silica gel column chromatography. The obtained solution was concentrated to give a condensed toluene solution. The toluene solution was dropped into ethanol for reprecipitation. The precipitate was collected by filtration at approximately 10° C. and the obtained solid was dried at approximately 80° C. under reduced pressure, whereby 10.1 g of a target white solid was obtained in a yield of 40%. The synthesis scheme of dchPAF in Step 1 is shown below.

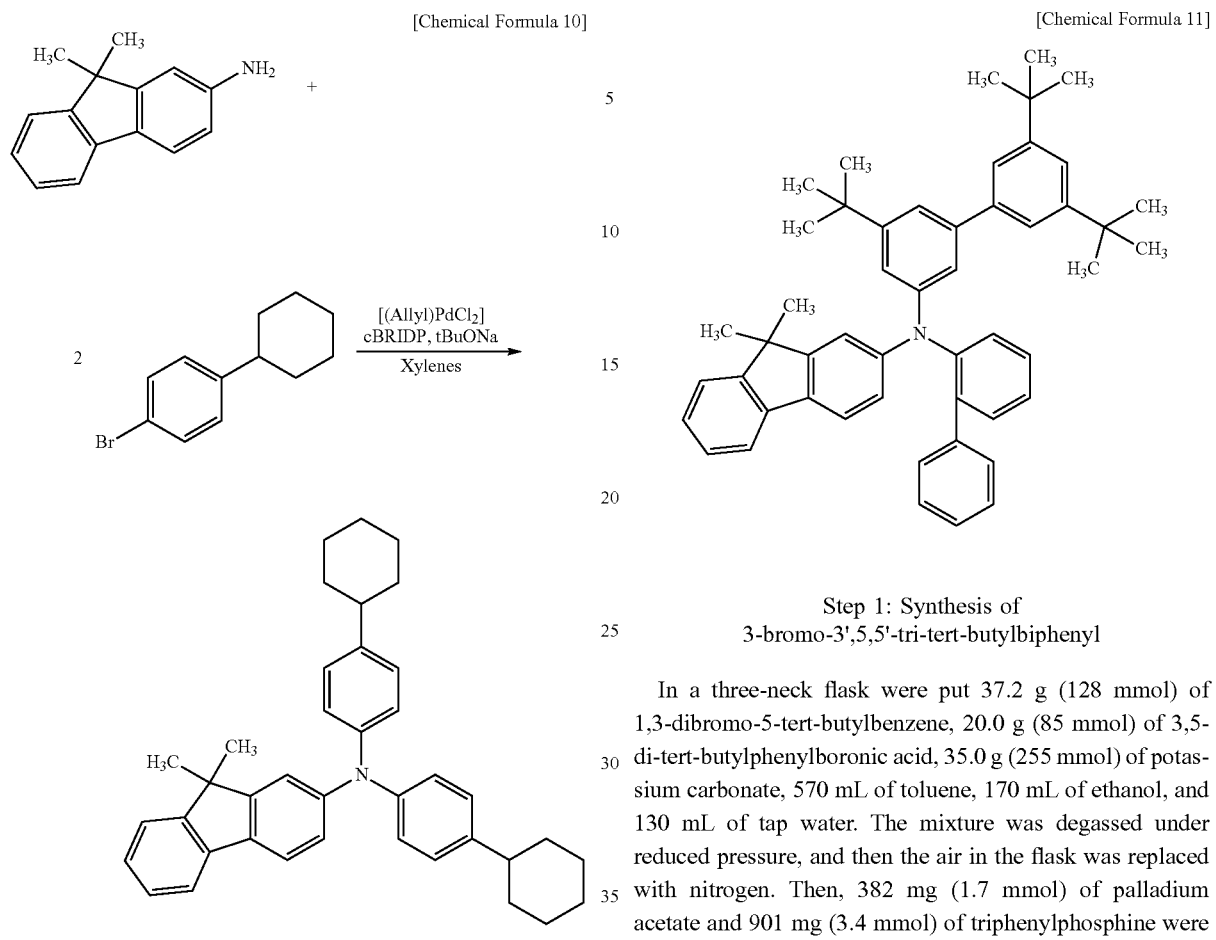

Analysis results by nuclear magnetic resonance ($^1$H-NMR) spectroscopy of the white solid obtained in Step 1 are shown below. The results show that dchPAF was synthesized in this synthesis example.

$^1$H-NMR. δ (CDCl$_3$): 7.60 (d, 1H, J=7.5 Hz), 7.53 (d, 1H, J=8.0 Hz), 7.37 (d, 2H, J=7.5 Hz), 7.29 (td, 1H, J=7.5 Hz, 1.0 Hz), 7.23 (td, 1H, J=7.5 Hz, 1.0 Hz), 7.19 (d, 1H, J=1.5 Hz), 7.06 (m, 8H), 6.97 (dd, 1H, J=8.0 Hz, 1.5 Hz), 2.41-2.51 (brm, 2H), 1.79-1.95 (m, 8H), 1.70-1.77 (m, 2H), 1.33-1.45 (brm, 14H), 1.19-1.30 (brm, 2H).

Reference Example 2

Reference Synthesis Example 2

In this reference example, a method for synthesizing N-(1,1'-biphenyl-2-yl)-N-[(3,3',5'-tri-t-butyl)-1,1'-biphenyl-5-yl]-9,9-dimethyl-9H-fluoren-2-amine (abbreviation: mmtBumBioFBi), which is the organic compound used in the example, will be described. The structure of mmtBumBioFBi is shown below.

Step 1: Synthesis of 3-bromo-3',5,5'-tri-tert-butylbiphenyl

In a three-neck flask were put 37.2 g (128 mmol) of 1,3-dibromo-5-tert-butylbenzene, 20.0 g (85 mmol) of 3,5-di-tert-butylphenylboronic acid, 35.0 g (255 mmol) of potassium carbonate, 570 mL of toluene, 170 mL of ethanol, and 130 mL of tap water. The mixture was degassed under reduced pressure, and then the air in the flask was replaced with nitrogen. Then, 382 mg (1.7 mmol) of palladium acetate and 901 mg (3.4 mmol) of triphenylphosphine were added, and the mixture was heated at 40° C. for approximately 5 hours. After that, the temperature of the flask was lowered to room temperature, and the mixture was separated into an organic layer and an aqueous layer. Magnesium sulfate was added to this solution for drying to be concentrated. The obtained hexane solution was purified by silica gel column chromatography, whereby 21.5 g of a target colorless oily substance was obtained in a yield of 63%. The synthesis scheme of 3-bromo-3',5,5'-tri-tert-butylbiphenyl in Step 1 is shown below.

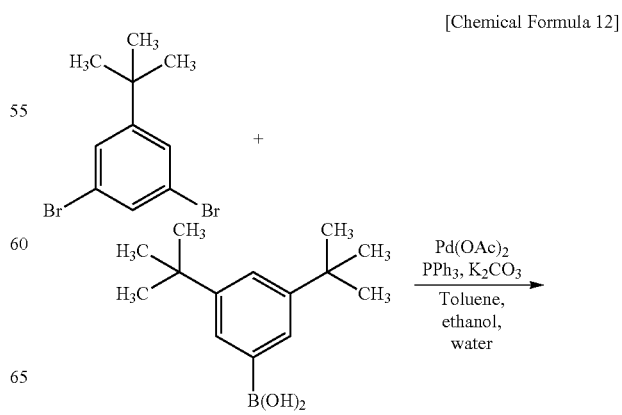

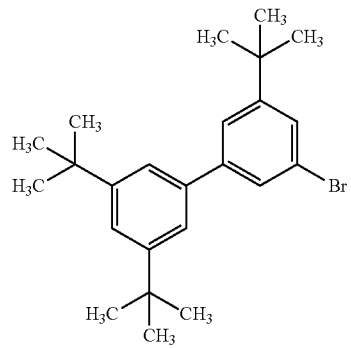

Step 2: Synthesis of N-(1,1'-biphenyl-2-yl)-N-[(3,3', 5'-tri-t-butyl)-1,1'-biphenyl-5-yl]-9,9-dimethyl-9H-fluoren-2-amine (Abbreviation: mmtBumBioFBi)

In a three-neck flask were put 3.0 g (7.5 mmol) of 3-bromo-3',5,5'-tri-tert-butylbiphenyl obtained in Step 1, 2.7 g (7.5 mmol) of N-(1,1'-biphenyl-2-yl)-9,9-dimethyl-9H-fluoren-2-amine, 2.2 g (23 mmol) of sodium-tert-butoxide, and 40 mL of xylene. The mixture was degassed under reduced pressure, and then the air in the flask was replaced with nitrogen. Then, 86 mg (0.15 mmol) of bis(dibenzylideneacetone)palladium(0) and 184 mg (0.45 mmol) of 2-dicyclohexylphosphino-2',6'-dimethoxybiphenyl (abbreviation: Sphos (registered trademark)) were added to this mixture, and the mixture was stirred at 120° C. under a nitrogen stream for approximately 7 hours. After that, the temperature of the flask was lowered to approximately 60° C., approximately 1 mL of water was added, a precipitated solid was separated by filtration, and the solid was washed with toluene. The filtrate was concentrated, and the obtained toluene solution was purified by silica gel column chromatography. The obtained fraction was concentrated to give a condensed toluene solution. Ethanol was added to this toluene solution and the toluene solution was concentrated under reduced pressure, whereby an ethanol suspension was obtained. The precipitate was filtrated at approximately 20° C. and the obtained solid was dried at approximately 80° C. under reduced pressure, whereby 4.0 g of a target white solid was obtained in a yield of 78%. The synthesis scheme of Step 2 is shown below.

[Chemical Formula 13]

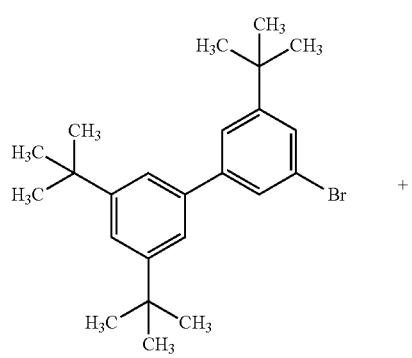

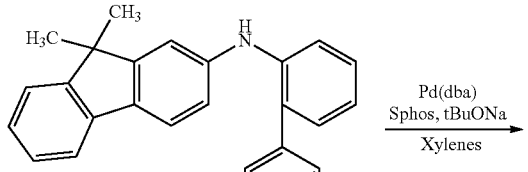

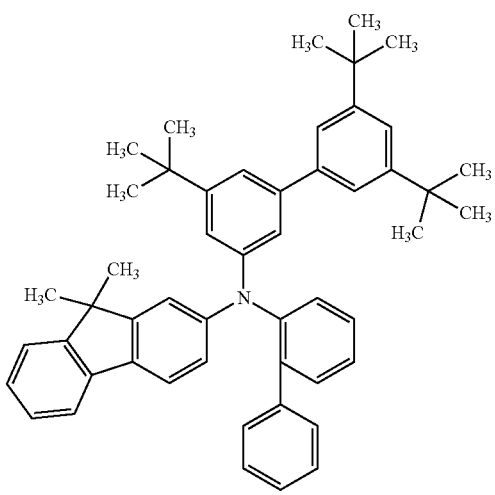

Then, 4.0 g of the obtained white solid was purified by a train sublimation method at 245° C. under a pressure of 4.0 Pa with an argon flow rate of 15 mL/min. After the purification by sublimation, 2.8 g of a white solid was obtained at a collection rate of 70%.

Analysis results by nuclear magnetic resonance ($^1$H-NMR) spectroscopy of the white solid obtained in Step 2 are shown below. The results show that mmtBumBioFBi was synthesized in this synthesis example.

$^1$H-NMR. δ (CDCl$_3$): 7.57 (d, 1H, J=7.5 Hz), 7.40-7.47 (m, 2H), 7.32-7.39 (m, 4H), 7.27-7.31 (m, 2H), 7.27-7.24 (m, 5H), 6.94-7.09 (m, 6H), 6.83 (brs, 2H), 1.33 (s, 18H), 1.32 (s, 6H), 1.20 (s, 9H).

Reference Example 3

Reference Synthesis Example 3

In this reference example, a method for synthesizing N-(1,1'-biphenyl-2-yl)-N-(3,3'',5',5''-tetra-tert-butyl-1,1':3', 1''-terphenyl-5-yl)-9,9-dimethyl-9H-fluoren-2-amine (abbreviation: mmtBumTPoFBi-02), which is the organic compound used in the example, will be described. The structural formula of mmtBumTPoFBi-02 is shown below.

[Chemical Formula 14]

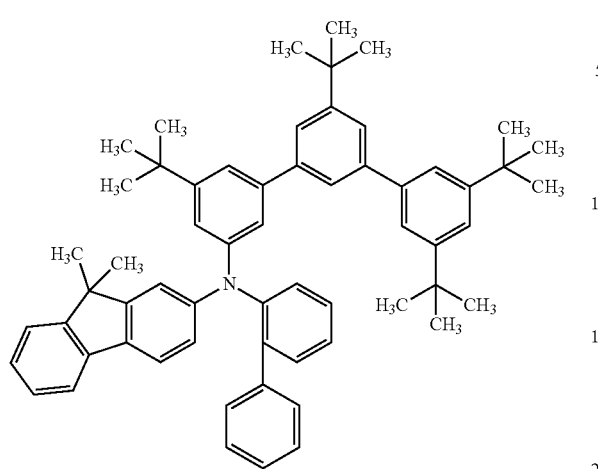

Step 1: Synthesis of 3-bromo-3',5,5'-tri-tert-butylbiphenyl

In a three-neck flask were put 37.2 g (128 mmol) of 1,3-dibromo-5-tert-butylbenzene, 20.0 g (85 mmol) of 3,5-di-tert-butylphenylboronic acid, 35.0 g (255 mmol) of potassium carbonate, 570 mL of toluene, 170 mL of ethanol, and 130 mL of tap water. The mixture was degassed under reduced pressure, and then the air in the flask was replaced with nitrogen. Then, 382 mg (1.7 mmol) of palladium acetate and 901 mg (3.4 mmol) of triphenylphosphine were added, and the mixture was heated at 40° C. for approximately 5 hours. After that, the temperature of the flask was lowered to room temperature, and the mixture was separated into an organic layer and an aqueous layer. Magnesium sulfate was added to this organic layer to eliminate moisture, whereby the organic layer was concentrated. The obtained solution was purified by silica gel column chromatography, whereby 21.5 g of a target colorless oily substance was obtained in a yield of 63%. The synthesis scheme of Step 1 is shown below.

[Chemical Formula 15]

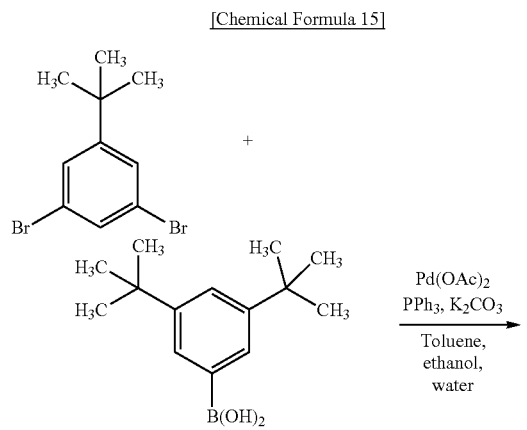

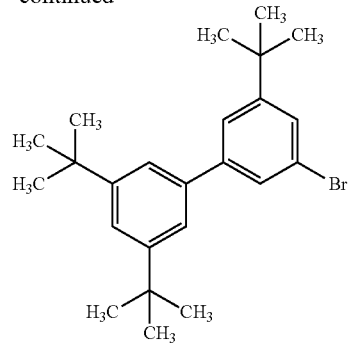

Step 2: Synthesis of 2-(3',5,5'-tri-tert-butyl[1,1'-biphenyl]-3-yl)-4,4,5,5-tetramethyl-1,3,2-dioxaborolane In a three-neck flask were put 15.0 g (38 mmol) of 3-bromo-3',5,5'-tri-tert-butylbiphenyl obtained in Step 1, 10.5 g (41 mmol) of 4,4,4',4',5,5,5',5-octamethyl-2,2'-bi-1,3,2-dioxaborolane, 11.0 g (113 mmol) of potassium acetate, and 125 mL of N,N-dimethylformamide. The mixture was degassed under reduced pressure, the air in the flask was replaced with nitrogen, 1.5 g (1.9 mmol) of [1,1'-bis(diphenylphosphino)ferrocene]dichloropalladium(II) was added thereto, and the mixture was heated at 100° C. for approximately 3 hours. Then, the temperature of the flask was lowered to room temperature, the mixture was separated into an organic layer and an aqueous layer, and extraction was performed with ethyl acetate. Magnesium sulfate was added to the solution of the extract to eliminate moisture, whereby the solution of the extract was concentrated. A toluene solution of the obtained mixture was purified by silica gel column chromatography, and the resulting solution was concentrated to give a condensed toluene solution. Ethanol was added to this toluene solution and the toluene solution was concentrated under reduced pressure, whereby an ethanol suspension was obtained. The precipitate was filtrated at approximately 20° C., and the obtained solid was dried at approximately 80° C. under reduced pressure, whereby 13.6 g of a target white solid was obtained in a yield of 81%. The synthesis scheme of Step 2 is shown below.

[Chemical Formula 16]

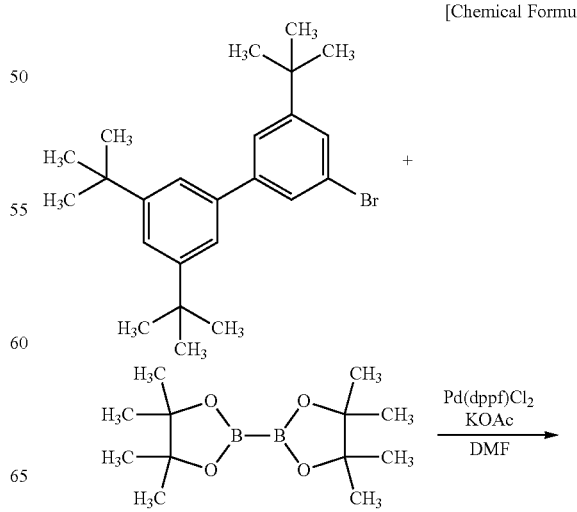

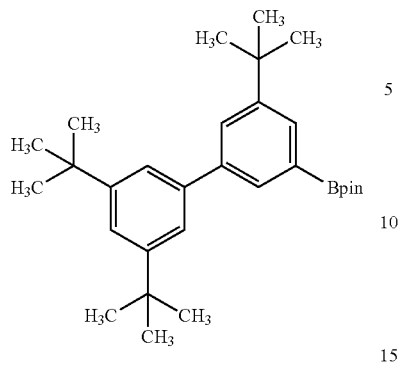

Step 3: Synthesis of 3-bromo-3",5,5',5"-tetra-tert-butyl-1,1':3',1"-terphenyl In a three-neck flask were put 5.0 g (11.1 mmol) of 2-(3',5,5'-tri-tert-butyl[1,1'-biphenyl]-3-yl)-4,4,5,5-tetramethyl-1,3,2-dioxaborolane, 4.8 g (16.7 mmol) of 1,3-dibromo-5-tert-butylbenzene, 4.6 g (33.3 mmol) of potassium carbonate, 56 mL of toluene, 22 mL of ethanol, and 17 mL of tap water. The mixture was degassed under reduced pressure, and then the air in the flask was replaced with nitrogen. Then, 50 mg (0.22 mmol) of palladium acetate and 116 mg (0.44 mmol) of triphenylphosphine were added, and the mixture was heated at 80° C. for approximately 10 hours. After that, the temperature of the flask was lowered to room temperature, and the mixture was separated into an organic layer and an aqueous layer. Magnesium sulfate was added to this solution to eliminate moisture, whereby this solution was concentrated. The obtained hexane solution was purified by silica gel column chromatography, whereby 3.0 g of a target white solid was obtained in a yield of 51.0%. The synthesis scheme of 3-bromo-3",5,5',5"-tetra-tert-butyl-1,1':3',1"-terphenyl of Step 3 is shown below.

[Chemical Formula 17]

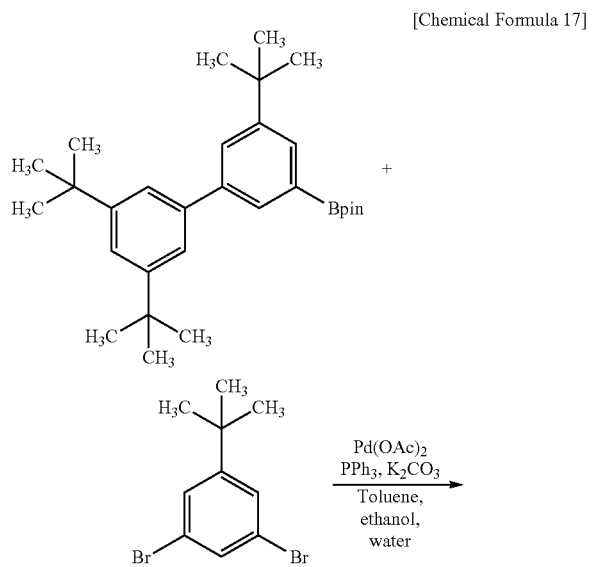

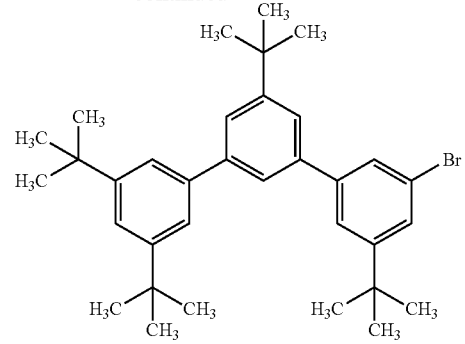

Step 4: Synthesis of mmtBumTPoFBi-02

In a three-neck flask were put 5.8 g (10.9 mmol) of 3-bromo-3",5,5',5"-tetra-tert-butyl-1,1':3',1"-terphenyl obtained in Step 3, 3.9 g (10.9 mmol) of N-(1,1'-biphenyl-4-yl)-N-phenyl-9,9-dimethyl-9H-fluoren-2-amine, 3.1 g (32.7 mmol) of sodium-tert-butoxide, and 55 mL of toluene. The mixture was degassed under reduced pressure, the air in the flask was replaced with nitrogen, 64 mg (0.11 mmol) of bis(dibenzylideneacetone)palladium(0) and 132 mg (0.65 mmol) of tri-tert-butylphosphine were added thereto, and the mixture was heated at 80° C. for approximately 2 hours. After that, the temperature of the flask was lowered to approximately 60° C., approximately 1 mL of water was added, a precipitated solid was separated by filtration, and the solid was washed with toluene. The filtrate was concentrated, and the obtained toluene solution was purified by silica gel column chromatography. The obtained solution was concentrated to give a condensed toluene solution. Ethanol was added to this toluene solution and the toluene solution was concentrated under reduced pressure, whereby an ethanol suspension was obtained. The precipitate was filtrated at approximately 20° C., and the obtained solid was dried at approximately 80° C. under reduced pressure, whereby 8.1 g of a target white solid was obtained in a yield of 91%. The synthesis scheme of mmtBumTPoFBi-02 is shown below.

[Chemical Formula 18]

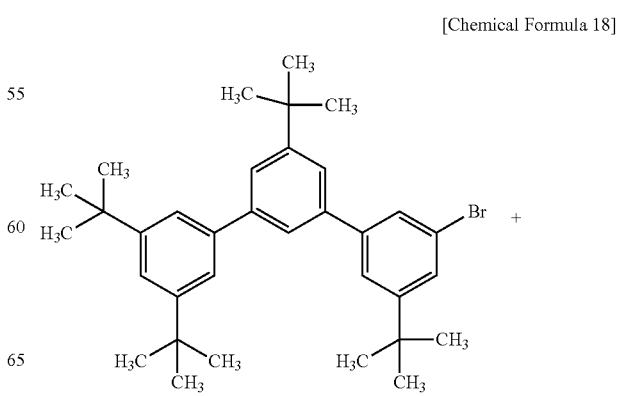

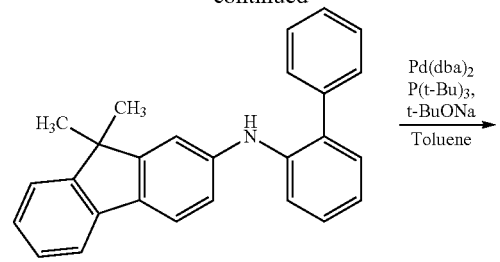

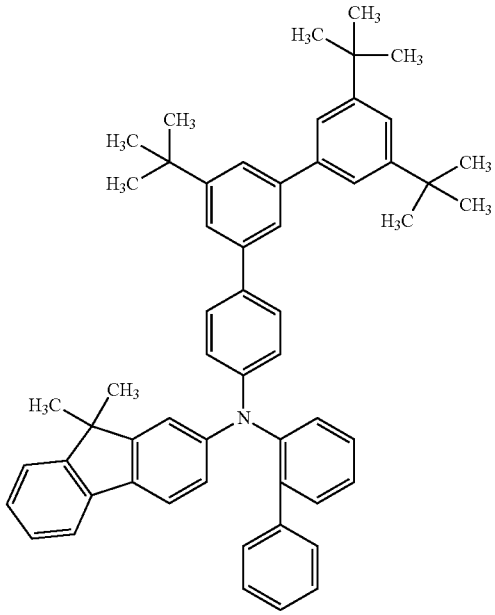

Step 1: Synthesis of 4-bromo-3",5',5"-tri-tert-butyl-1,1':3',1"-terphenyl

In a three-neck flask were put 9.0 g (20.1 mmol) of 2-(3',5,5'-tri-tert-butyl[1,1'-biphenyl]-3-yl)-4,4,5,5-tetramethyl-1,3,2-dioxaborolane, 6.8 g (24.1 mmol) of 1-bromo-4-iodobenzene, 8.3 g (60.3 mmol) of potassium carbonate, 100 mL of toluene, 40 mL of ethanol, and 30 mL of tap water. The mixture was degassed under reduced pressure, the air in the flask was replaced with nitrogen, 91 mg (0.40 mmol) of palladium acetate and 211 mg (0.80 mmol) of triphenylphosphine were added thereto, and the mixture was heated at 80° C. for approximately 4 hours. After that, the temperature of the flask was lowered to room temperature, and the mixture was separated into an organic layer and an aqueous layer. Magnesium sulfate was added to this solution for drying to be concentrated. The obtained hexane solution was purified by silica gel column chromatography, whereby 6.0 g of a target white solid was obtained in a yield of 62.5%. The synthesis scheme of 4-bromo-3",5',5"-tri-tert-butyl-1,1': 3',1"-terphenyl of Step 1 is shown below.

Analysis results by nuclear magnetic resonance ($^1$H-NMR) spectroscopy of the white solid obtained in the above step are shown below. The results show that mmtBumT-PoFBi-02 was synthesized in this synthesis example.

$^1$H-NMR. δ (CDCl$_3$): 7.56 (d, 1H, J=7.4 Hz), 7.50 (dd, 1H, J=1.7 Hz), 7.33-7.46 (m, 11H), 7.27-7.29 (m, 2H), 7.22 (dd, 1H, J=2.3 Hz), 7.15 (d, 1H, J=6.9 Hz), 6.98-7.07 (m, 7H), 6.93 (s, 1H), 6.84 (d, 1H, J=6.3 Hz), 1.38 (s, 9H), 1.37 (s, 18H), 1.31 (s, 6H), 1.20 (s, 9H).

Reference Example 4

Reference Synthesis Example 4

In this reference example, a method for synthesizing N-(3",5',5"-tri-t-butyl-1,1':3',1"-terphenyl-4-yl)-N-(1,1'-biphenyl-2-yl)-9,9-dimethyl-9H-fluoren-2-amine (abbreviation: mmtBumTPoFBi-04), which is the organic compound used in the example, will be described. The structural formula of mmtBumTPoFBi-04 is shown below.

[Chemical Formula 19]

[Chemical Formula 20]

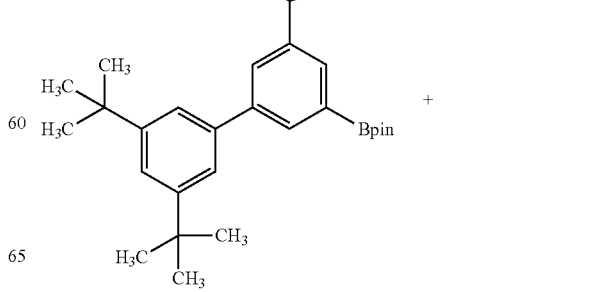

-continued

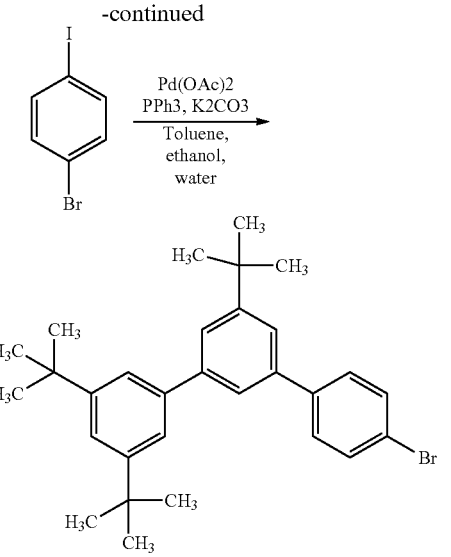

Step 2: Synthesis of mmtBumTPoFBi-04

In a three-neck flask were put 3.0 g (6.3 mmol) of 4-bromo-3",5',5"-tri-tert-butyl-1,1':3',1"-terphenyl, 2.3 g (6.3 mmol) of N-(1,1'-biphenyl-4-yl)-N-phenyl-9,9-dimethyl-9H-fluoren-2-amine, 1.8 g (18.9 mmol) of sodium-tert-butoxide, and 32 mL of toluene. The mixture was degassed under reduced pressure, the air in the flask was replaced with nitrogen, 72 mg (0.13 mmol) of bis(dibenzylideneacetone)palladium(0) and 76 mg (0.38 mmol) of tri-tert-butylphosphine were added thereto, and the mixture was heated at 120° C. for approximately 8 hours. After that, the temperature of the mixture was lowered to approximately 60° C., approximately 1 mL of water was added, a precipitated solid was separated by filtration, and the solid was washed with toluene. The filtrate was concentrated, and the obtained toluene solution was purified by silica gel column chromatography. The obtained solution was concentrated to give a condensed toluene solution. Ethanol was added to this toluene solution and the toluene solution was concentrated under reduced pressure, whereby an ethanol suspension was obtained. The precipitate was filtrated at approximately 20° C., and the obtained solid was dried at approximately 80° C. under reduced pressure, whereby 3.6 g of a target white solid was obtained in a yield of 75%. The synthesis scheme of mmtBumTPoFBi-04 of Step 2 is shown below.

[Chemical Formula 21]

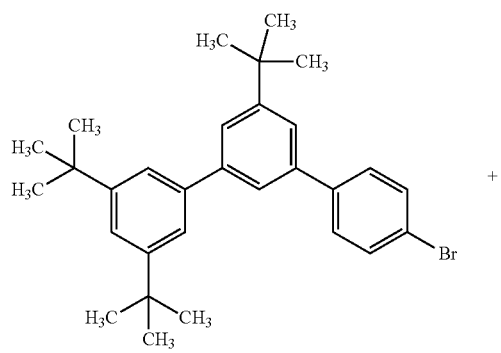

+

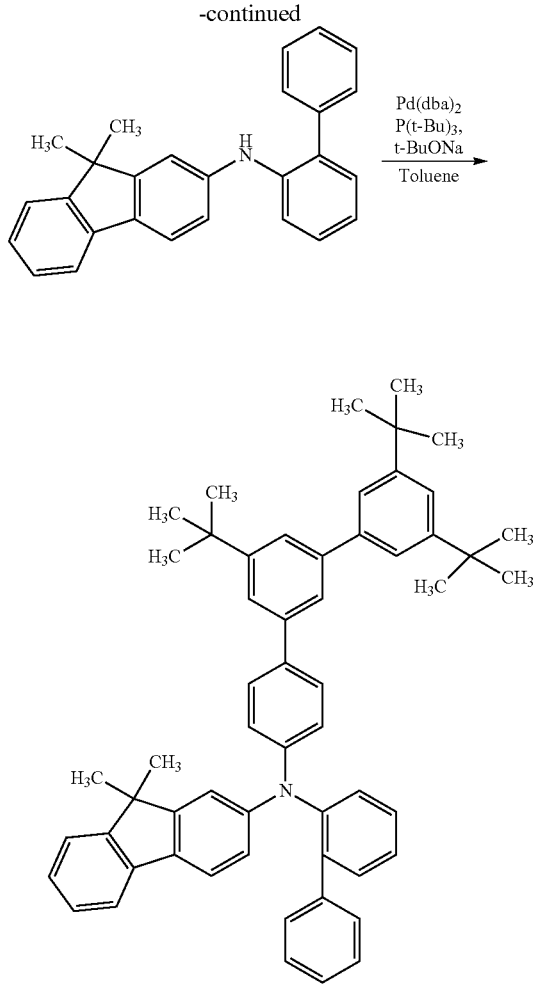

Analysis results by nuclear magnetic resonance ($^1$H-NMR) spectroscopy of the white solid obtained in Step 2 are shown below. The results show that mmtBumTPoFBi-04 was synthesized in this synthesis example.

$^1$H-NMR. δ (CDCl$_3$): 7.54-7.56 (m, 1H), 7.53 (dd, 1H, J=1.7 Hz), 7.50 (dd, 1H, J=1.7 Hz), 7.27-7.47 (m, 13H), 7.23 (dd, 1H, J=6.3 Hz, 1.2 Hz), 7.18-7.19 (m, 2H), 7.08-7.00 (m, 5H), 6.88 (d, 1H, J=1.7 Hz) 6.77 (dd, 1H, J=8.0 Hz, 2.3 Hz), 1.42 (s, 9H), 1.39 (s, 18H), 1.29 (s, 6H).

Reference Example 5

Reference Synthesis Example 5

In this reference example, a method for synthesizing N-(3",5',5"-tri-tert-butyl-1,1':3',1"-terphenyl-4-yl)-N-(4-cyclohexylphenyl)-9,9-dimethyl-9H-fluoren-2-amine (abbreviation: mmtBumTPchPAF-04), which is the organic compound used in the example, will be described. The structural formula of mmtBumTPchPAF-04 is shown below.

[Chemical Formula 22]

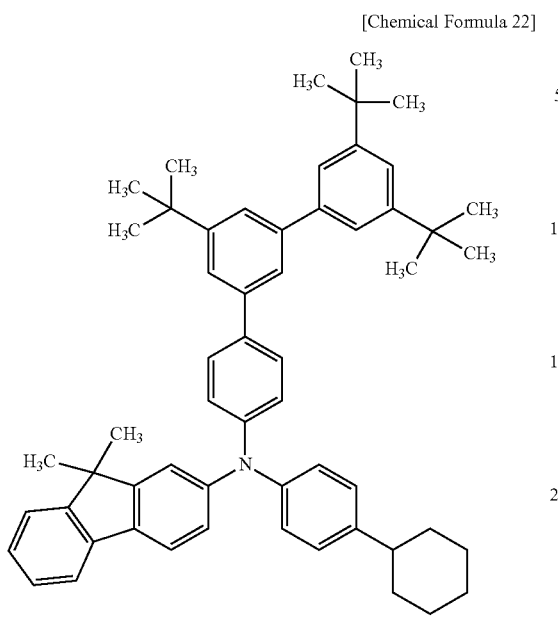

Step 1: Synthesis of 4-bromo-3",5',5"-tri-tert-butyl-1,1':3',1"-terphenyl

In a three-neck flask were put 9.0 g (20.1 mmol) of 2-(3',5,5'-tri-tert-butyl[1,1'-biphenyl]-3-yl)-4,4,5,5-tetramethyl-1,3,2-dioxaborolane, 6.8 g (24.1 mmol) of 1-bromo-4-iodobenzene, 8.3 g (60.3 mmol) of potassium carbonate, 100 mL of toluene, 40 mL of ethanol, and 30 mL of tap water. The mixture was degassed under reduced pressure, the air in the flask was replaced with nitrogen, 91 mg (0.40 mmol) of palladium acetate and 211 mg (0.80 mmol) of triphenylphosphine were added thereto, and the mixture was heated at 80° C. for approximately 4 hours. After that, the temperature of the flask was lowered to room temperature, and the mixture was separated into an organic layer and an aqueous layer. Magnesium sulfate was added to this solution for drying to be concentrated. The obtained hexane solution was purified by silica gel column chromatography, whereby 6.0 g of a target white solid was obtained in a yield of 62.5%. The synthesis scheme of 4-bromo-3",5',5"-tri-tert-butyl-1,1':3',1"-terphenyl of Step 1 is shown below.

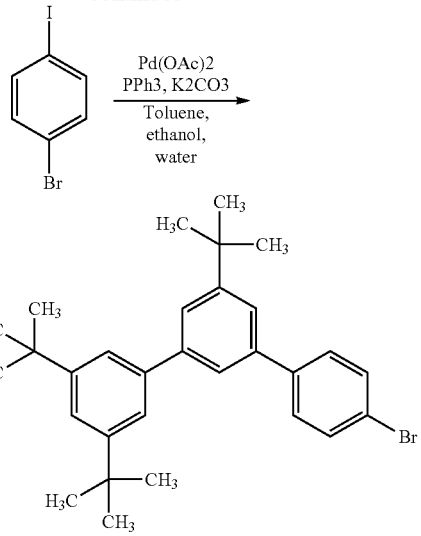

Step 2: Synthesis of mmtBumTPchPAF-04

In a three-neck flask were put 3.0 g (6.3 mmol) of 4-bromo-3",5',5"-tri-tert-butyl-1,1':3',1"-terphenyl obtained in Step 1, 2.3 g (6.3 mmol) of N-(4-cyclohexylphenyl)-N-(9,9-dimethyl-9H-fluoren-2-yl)amine, 1.8 g (18.9 mmol) of sodium-tert-butoxide, and 32 mL of toluene. The mixture was degassed under reduced pressure, the air in the flask was replaced with nitrogen, 72 mg (0.13 mmol) of bis(dibenzylideneacetone)palladium(0) and 76 mg (0.38 mmol) of tri-tert-butylphosphine were added thereto, and the mixture was heated at 80° C. for approximately 2 hours. After that, the temperature of the flask was lowered to approximately 60° C., approximately 1 mL of water was added, a precipitated solid was separated by filtration, and the solid was washed with toluene. The filtrate was concentrated, and the obtained toluene solution was purified by silica gel column chromatography. The obtained solution was concentrated to give a condensed toluene solution. Ethanol was added to this toluene solution and the toluene solution was concentrated under reduced pressure, whereby an ethanol suspension was obtained. The precipitate in the ethanol suspension was filtrated at approximately 20° C., and the obtained solid was dried at approximately 80° C. under reduced pressure, whereby 4.1 g of a target white solid was obtained in a yield of 85%. The synthesis scheme of mmtBumTPchPAF-04 is shown below.

[Chemical Formula 23]

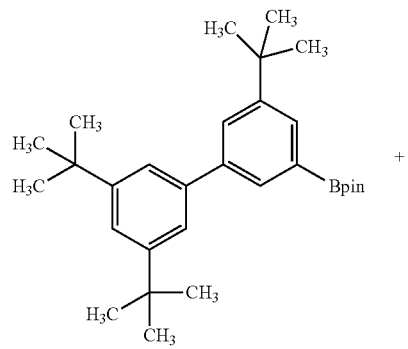

+

[Chemical Formula 24]

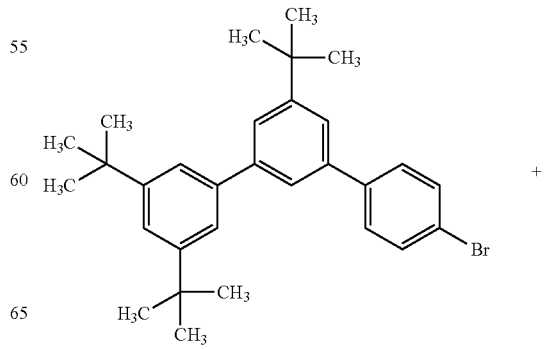

+

-continued

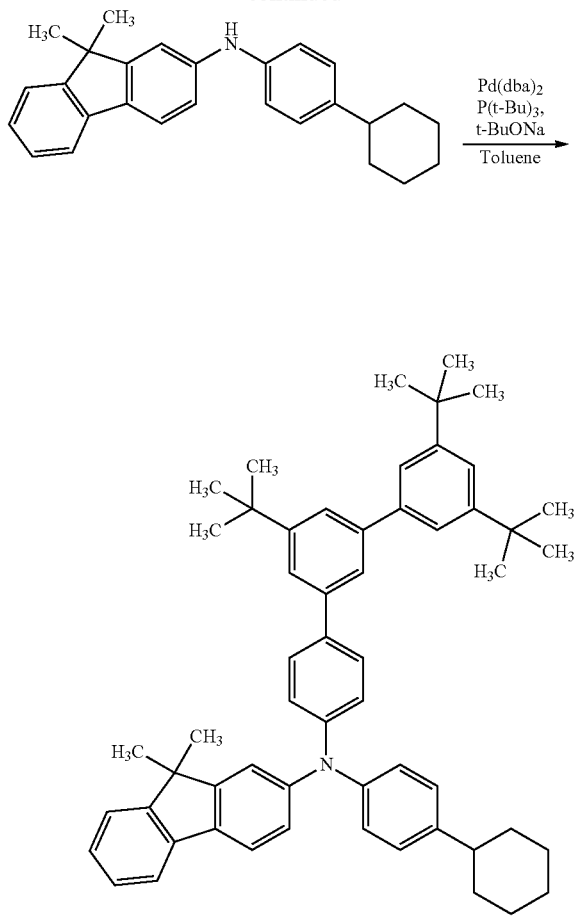

Analysis results by nuclear magnetic resonance ($^1$H-NMR) spectroscopy of the white solid obtained in Step 2 are shown below. The results show that mmtBumTPchPAF-04 was synthesized in this synthesis example.

$^1$H-NMR. δ (CDCl$_3$): 7.63 (d, 1H, J=7.5 Hz), 7.52-7.59 (m, 7H), 7.44-7.45 (m, 4H), 7.39 (d, 1H, J=7.4 Hz), 7.31 (dd, 1H, J=7.4 Hz), 7.19 (d, 2H, J=6.6 Hz), 7.12 (m, 4H), 7.07 (d, 1H, J=9.7 Hz), 2.48 (brm, 1H), 1.84-1.93 (brm, 4H), 1.74-1.76 (brm, 1H), 1.43 (s, 18H), 1.39 (brm, 19H), 1.24-1.30 (brm, 1H).

Reference Example 6

Reference Synthesis Example 6

In this reference example, a method for synthesizing N-(3',5'-ditertiarybutyl-1,1'-biphenyl-4-yl)-N-(1,1'-biphenyl-2-yl)-9,9-dimethyl-9H-fluoren-2-amine (abbreviation: mmtBuBioFBi), which is the organic compound used in the example, will be described. The structural formula of mmt-BuBioFBi is shown below.

[Chemical Formula 25]

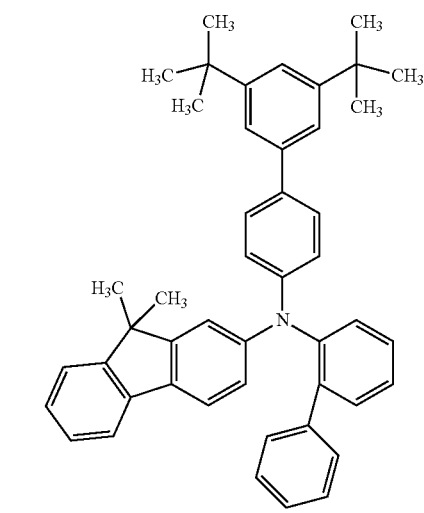

In a three-neck flask were put 2.22 g (7.4 mmol) of 4-chloro-3',5'-di-tert-butyl-1,1'-biphenyl, 2.94 g (8.1 mmol) of 2-(2-biphenylyl)amino-9,9-dimethylfluorene, 2.34 g (24.4 mmol) of sodium-tert-butoxide, and 37 mL of xylene. The mixture was degassed under reduced pressure, and then the air in the flask was replaced with nitrogen. To this mixture, 107.6 mg (0.31 mmol) of di-t-butyl(1-methyl-2,2-diphenylcyclopropyl)phosphine (abbreviation: cBRIDP (registered trademark)) and 28.1 mg (0.077 mmol) of allylpalladium chloride dimer were added. This mixture was heated at 100° C. for approximately 4 hours. After that, the temperature of the flask was lowered to approximately 70° C., and approximately 4 mL of water was added to the mixture, so that a solid was precipitated. The precipitated solid was separated by filtration. The filtrate was concentrated, and the obtained solution was purified by silica gel column chromatography. The obtained solution was concentrated. After that, ethanol was added thereto and the obtained solution was concentrated again; this process was performed three times to obtain an ethanol suspension. After that, recrystallization was performed on the ethanol suspension. The precipitate was cooled to approximately −10° C. and then filtrated, and the obtained solid was dried at approximately 130° C. under reduced pressure, whereby 2.07 g of a target white solid was obtained in a yield of 45%. The synthesis scheme of this synthesis example is shown below.

[Chemical Formula 26]

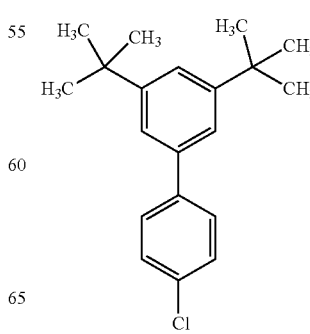

-continued

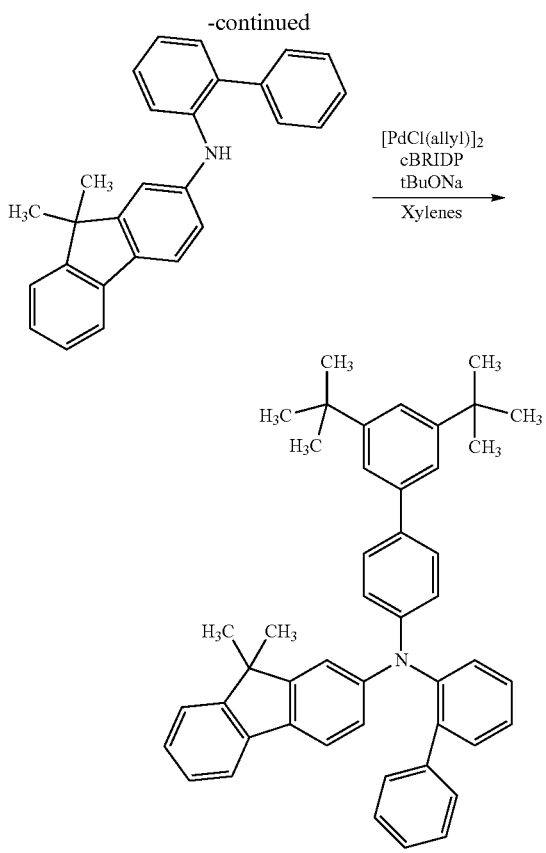

Analysis results by nuclear magnetic resonance ($^1$H-NMR) spectroscopy of the white solid obtained in this synthesis example are shown below. The results show that mmtBuBioFBi was synthesized in this synthesis example.

$^1$H-NMR (CDCl$_3$, 500 MHz): δ=1.29 (s, 6H), 1.38 (s, 18H), 6.76 (dd, J$_1$=8.0 Hz, J$_2$=2.0 Hz, 1H), 6.87 (d, J=2.5 Hz, 1H), 7.00-7.08 (m, 5H), 7.18-7.23 (m, 3H), 7.27-7.43 (m, 12H), 7.55 (d, J=7.5 Hz, 1H).

This application is based on Japanese Patent Application Serial No. 2020-219842 filed with Japan Patent Office on Dec. 29, 2020, the entire contents of which are hereby incorporated by reference.

What is claimed is:

1. An organic semiconductor device comprising:
an anode;
a cathode; and
a layer comprising an organic compound between the anode and the cathode,
wherein the layer comprises a hole-transport region,
wherein the hole-transport region comprises a first layer and a second layer,
wherein the first layer is positioned between the anode and the second layer, and
wherein, when a potential gradient of a surface potential of an evaporated film is set as GSP (mV/nm), a value obtained by subtracting GSP of an organic compound in the second layer from GSP of an organic compound in the first layer is less than or equal to 20 (mV/nm).

2. The organic semiconductor device according to claim 1,
wherein the value is less than or equal to 5 (mV/nm).

3. The organic semiconductor device according to claim 1,
wherein the value is less than or equal to 0 (mV/nm).

4. The organic semiconductor device according to claim 1,
wherein the first layer is in contact with the second layer.

5. A lighting device comprising the organic semiconductor device according to claim 1.

6. A display device comprising the organic semiconductor device according to claim 1.

7. An electronic device comprising the organic semiconductor device according to claim 1.

8. An organic EL device comprising:
an anode;
a cathode; and
a layer comprising an organic compound between the anode and the cathode,
wherein the layer comprises a hole-transport region and a light-emitting layer,
wherein the hole-transport region is positioned between the anode and the light-emitting layer,
wherein the hole-transport region comprises a first layer and a second layer,
wherein the first layer is positioned between the anode and the second layer, and
wherein, when a potential gradient of a surface potential of an evaporated film is set as GSP (mV/nm), a value obtained by subtracting GSP of an organic compound in the second layer from GSP of an organic compound in the first layer is less than or equal to 20 (mV/nm).

9. The organic EL device according to claim 8,
wherein the value is less than or equal to 5 (mV/nm).

10. The organic EL device according to claim 8,
wherein the value is less than or equal to 0 (mV/nm).

11. The organic EL device according to claim 8,
wherein the first layer is in contact with the second layer.

12. The organic EL device according to claim 8,
wherein the second layer is in contact with the light-emitting layer.

13. The organic EL device according to claim 8,
wherein end faces of the hole-transport region and the light-emitting layer are positioned on substantially the same plane.

14. An electronic device comprising:
the organic EL device according to claim 8; and
at least one of a sensor, an operation button, a speaker, and a microphone.

15. A light-emitting apparatus comprising:
the organic EL device according to claim 8; and
at least one of a transistor and a substrate.

16. A lighting device comprising:
the organic EL device according to claim 8; and
a housing.

17. A photodiode sensor comprising:
an anode;
a cathode; and
a layer comprising an organic compound between the anode and the cathode,
wherein the layer comprises an active layer and a hole-transport region,
wherein the hole-transport region is positioned between the active layer and the cathode,
wherein the hole-transport region comprises a first layer and a second layer,
wherein the first layer is positioned between the anode and the second layer, and
wherein, when a potential gradient of a surface potential of an evaporated film is set as GSP (mV/nm), a value obtained by subtracting GSP of an organic compound in the second layer from GSP of an organic compound in the first layer is less than or equal 30 to 20 (mV/nm).

18. The photodiode sensor according to claim 17, wherein the value is less than or equal to 5 (mV/nm).

19. The photodiode sensor according to claim 17, wherein the value is less than or equal to 0 (mV/nm).

20. The photodiode sensor according to claim 17, wherein the first layer is in contact with the second layer.

21. The photodiode sensor according to claim 17, wherein the active layer is in contact with the first layer.

* * * * *